(12) United States Patent
Ganti et al.

(10) Patent No.: US 12,193,192 B2
(45) Date of Patent: Jan. 7, 2025

(54) CAVITIES FOR CENTER-PINNED ACTUATOR COOLING SYSTEMS

(71) Applicant: Frore Systems Inc., San Jose, CA (US)

(72) Inventors: Suryaprakash Ganti, Los Altos, CA (US); Sangkyu Kim, Los Altos, CA (US); Vikram Mukundan, San Ramon, CA (US); Prathima Kapa, Dublin, CA (US); Ji Hoon Kim, Redwood City, CA (US); Wen-Sheng Chan, Zhubei (TW)

(73) Assignee: Frore Systems Inc., San Jose, CA (US)

( * ) Notice: Subject to any disclaimer, the term of this patent is extended or adjusted under 35 U.S.C. 154(b) by 0 days.

(21) Appl. No.: 18/596,562

(22) Filed: Mar. 5, 2024

(65) Prior Publication Data
US 2024/0215204 A1 Jun. 27, 2024

Related U.S. Application Data

(63) Continuation-in-part of application No. 18/370,732, filed on Sep. 20, 2023, and a continuation-in-part of application No. 17/890,917, filed on Aug. 18, 2022, which is a continuation of application No. 17/464,422, filed on Sep. 1, 2021, now Pat. No. 11,503,742, said application No. 18/370,732 is a
(Continued)

(51) Int. Cl.
*H05K 7/20* (2006.01)

(52) U.S. Cl.
CPC ..... *H05K 7/20509* (2013.01); *H05K 7/20254* (2013.01); *H05K 7/20418* (2013.01)

(58) Field of Classification Search
CPC .......... H05K 7/20509; H05K 7/20254; H05K 7/20418; B81B 7/0093; H01L 41/042; H01L 41/047; F28F 13/10

USPC ................................................ 361/688, 704
See application file for complete search history.

(56) References Cited

U.S. PATENT DOCUMENTS

| 4,251,031 A | 2/1981 | Martin |
| 4,450,505 A | 5/1984 | Mittal |
(Continued)

FOREIGN PATENT DOCUMENTS

| CN | 101032718 | 9/2007 |
| CN | 101718235 | 6/2010 |
(Continued)

OTHER PUBLICATIONS

H.Q. Li, "A High Frequency High Flow Rate Piezoelectrically Driven Mems Micropump", Solid-State Sensors, Actuators, and Microsystems Workshop, Jun. 4-8, 2000, pp. 69~72.
(Continued)

*Primary Examiner* — Anatoly Vortman
(74) *Attorney, Agent, or Firm* — Van Pelt, Yi & James LLP

(57) ABSTRACT

A flow chamber having an upper chamber, a lower chamber, and an actuator is described. The upper chamber includes a top wall. The actuator is located distally from the top wall. The lower chamber includes a bottom wall and a sidewall. The lower chamber receives a fluid from the upper chamber when the actuator is activated. The bottom wall has orifices and at least one cavity therein. The orifices are vertically aligned with a portion of the actuator and allow the fluid to exit the lower chamber. The at least one cavity is proximate to the sidewall and distally located from the orifices.

17 Claims, 17 Drawing Sheets

Related U.S. Application Data continuation of application No. 17/367,057, filed on Jul. 2, 2021, now Pat. No. 11,796,262, said application No. 17/464,422 is a continuation of application No. 17/023,215, filed on Sep. 16, 2020, now Pat. No. 11,510,341, which is a continuation-in-part of application No. 16/915,912, filed on Jun. 29, 2020, now Pat. No. 11,464,140, said application No. 17/367,057 is a continuation-in-part of application No. 16/915,912, filed on Jun. 29, 2020, now Pat. No. 11,464,140.

(60) Provisional application No. 63/547,653, filed on Nov. 7, 2023, provisional application No. 62/945,001, filed on Dec. 6, 2019.

(56) References Cited

U.S. PATENT DOCUMENTS

| | | |
|---|---|---|
| 4,595,338 A | 6/1986 | Kolm |
| 4,667,877 A | 5/1987 | Yao |
| 4,751,713 A | 6/1988 | Affleck |
| 4,780,062 A | 10/1988 | Yamada |
| 4,834,619 A | 5/1989 | Walton |
| 4,923,000 A | 5/1990 | Nelson |
| 5,008,582 A | 4/1991 | Tanuma |
| 5,673,171 A | 9/1997 | Varghese |
| 5,758,823 A | 6/1998 | Glezer |
| 5,796,152 A | 8/1998 | Carr |
| 5,821,962 A | 10/1998 | Kudo |
| 5,861,703 A | 1/1999 | Losinski |
| 6,211,598 B1 | 4/2001 | Dhuler |
| 6,232,680 B1 | 5/2001 | Bae |
| 6,450,773 B1 | 9/2002 | Upton |
| 6,483,419 B1 | 11/2002 | Weaver |
| 6,498,725 B2 | 12/2002 | Cole |
| 6,531,947 B1 | 3/2003 | Weaver |
| 6,570,750 B1 | 5/2003 | Calcatera |
| 6,588,497 B1 | 7/2003 | Glezer |
| 6,598,960 B1 | 7/2003 | Cabal |
| 6,612,816 B1 | 9/2003 | Vanden Brande |
| 6,650,542 B1 | 11/2003 | Chrysler |
| 6,713,942 B2 | 3/2004 | Raman |
| 6,771,158 B2 | 8/2004 | Lee |
| 6,853,068 B1 | 2/2005 | Djekic |
| 6,876,047 B2 | 4/2005 | Cunningham |
| 6,996,441 B1 | 2/2006 | Tobias |
| 7,023,697 B2 | 4/2006 | Pokharna |
| 7,031,155 B2 | 4/2006 | Sauciuc |
| 7,081,699 B2 | 7/2006 | Keolian |
| 7,258,464 B2 | 8/2007 | Morris |
| 7,282,837 B2 | 10/2007 | Scher |
| 7,321,184 B2 | 1/2008 | Lee |
| 7,324,323 B2 | 1/2008 | Aksyuk |
| 7,420,807 B2 | 9/2008 | Mikubo |
| 7,492,076 B2 | 2/2009 | Heim |
| 7,516,776 B2 | 4/2009 | Bezama |
| 7,553,135 B2 | 6/2009 | Cho |
| 7,714,433 B2 | 5/2010 | Campini |
| 7,742,299 B2 | 6/2010 | Sauciuc |
| 7,972,124 B2 | 7/2011 | Hirata |
| 8,051,905 B2 | 11/2011 | Arik |
| 8,289,701 B2 | 10/2012 | Suzuki |
| 8,297,947 B2 | 10/2012 | Van Rensburg |
| 8,308,453 B2 | 11/2012 | Yamamoto |
| 8,308,454 B2 | 11/2012 | Kamitani |
| 8,520,383 B2 | 8/2013 | Park |
| 8,520,384 B2 | 8/2013 | Park |
| 8,659,896 B2 | 2/2014 | Dede |
| 8,678,787 B2 | 3/2014 | Hirata |
| 8,684,707 B2 | 4/2014 | Kanai |
| 8,736,139 B2 | 5/2014 | Lee |
| 8,899,944 B2 | 12/2014 | Kanai |
| 8,934,240 B2 | 1/2015 | Yu |
| 9,179,575 B1 | 11/2015 | Yao |
| 9,215,520 B2 | 12/2015 | De Bock |
| 9,252,069 B2 | 2/2016 | Bhunia |
| 9,466,452 B1 | 10/2016 | Liu |
| 9,523,367 B2 | 12/2016 | Lucas |
| 9,846,461 B2 | 12/2017 | Tang |
| 9,976,547 B2 | 5/2018 | Tanaka |
| 10,045,461 B1 | 8/2018 | Boozer |
| 10,288,192 B2 | 5/2019 | Han |
| 10,364,910 B2 | 7/2019 | Han |
| 10,480,502 B2 | 11/2019 | Hirata |
| 10,788,034 B2 | 9/2020 | Ganti |
| 10,943,850 B2 | 3/2021 | Ganti |
| 11,043,444 B2 | 6/2021 | Ganti |
| 11,242,241 B2 | 2/2022 | Menon |
| 11,454,232 B2 * | 9/2022 | Mou ..................... F04B 43/046 |
| 11,456,234 B2 | 9/2022 | Ganti |
| 11,466,674 B2 | 10/2022 | Chang |
| 2002/0163782 A1 | 11/2002 | Cole |
| 2002/0184907 A1 | 12/2002 | Vaiyapuri |
| 2004/0023614 A1 | 2/2004 | Koplin |
| 2004/0190251 A1 | 9/2004 | Prasher |
| 2004/0196999 A1 | 10/2004 | Han |
| 2004/0218362 A1 | 11/2004 | Amaro |
| 2004/0244405 A1 | 12/2004 | Kim |
| 2004/0253130 A1 | 12/2004 | Sauciuc |
| 2005/0074662 A1 | 4/2005 | Cho |
| 2005/0089415 A1 | 4/2005 | Cho |
| 2005/0110841 A1 | 5/2005 | Silverbrook |
| 2005/0178529 A1 | 8/2005 | Suzuki |
| 2005/0211418 A1 | 9/2005 | Kenny |
| 2005/0225213 A1 | 10/2005 | Richards |
| 2005/0266286 A1 | 12/2005 | Sato |
| 2005/0280994 A1 | 12/2005 | Yazawa |
| 2006/0147324 A1 | 7/2006 | Tanner |
| 2006/0164805 A1 | 7/2006 | Meinders |
| 2006/0181848 A1 | 8/2006 | Kiley |
| 2006/0208613 A1 | 9/2006 | Scher |
| 2006/0232167 A1 | 10/2006 | Jordan |
| 2006/0236710 A1 | 10/2006 | Vaiyapuri |
| 2006/0250773 A1 | 11/2006 | Campbell |
| 2006/0250774 A1 | 11/2006 | Campbell |
| 2006/0260784 A1 | 11/2006 | Bezama |
| 2006/0268534 A1 | 11/2006 | Paydar |
| 2007/0020124 A1 | 1/2007 | Singhal |
| 2007/0037506 A1 | 2/2007 | Lee |
| 2007/0048154 A1 | 3/2007 | Sapir |
| 2007/0076375 A1 | 4/2007 | Mongia |
| 2007/0235180 A1 | 10/2007 | Ouyang |
| 2007/0274045 A1 | 11/2007 | Campbell |
| 2008/0041574 A1 | 2/2008 | Arik |
| 2008/0101965 A1 | 5/2008 | Zhang |
| 2008/0111866 A1 | 5/2008 | Silverbrook |
| 2008/0218972 A1 | 9/2008 | Sauciuc |
| 2008/0304979 A1 | 12/2008 | Lucas |
| 2009/0021908 A1 | 1/2009 | Patel |
| 2009/0034197 A1 | 2/2009 | Leija |
| 2009/0050294 A1 | 2/2009 | Fedorov |
| 2009/0085438 A1 | 4/2009 | Chrysler |
| 2009/0120621 A1 | 5/2009 | Sheinman |
| 2009/0148320 A1 | 6/2009 | Lucas |
| 2009/0167109 A1 | 7/2009 | Tomita |
| 2009/0174999 A1 | 7/2009 | Sauciuc |
| 2009/0232683 A1 | 9/2009 | Hirata |
| 2009/0232684 A1 | 9/2009 | Hirata |
| 2009/0232685 A1 | 9/2009 | Kamitani |
| 2010/0067191 A1 | 3/2010 | Arik |
| 2010/0073431 A1 | 3/2010 | Silverbrook |
| 2010/0074775 A1 | 3/2010 | Yamamoto |
| 2011/0063800 A1 | 3/2011 | Park |
| 2011/0068685 A1 | 3/2011 | Maeng |
| 2011/0068799 A1 | 3/2011 | Wolf |
| 2011/0096125 A1 | 4/2011 | Silverbrook |
| 2011/0122582 A1 | 5/2011 | Park |
| 2011/0211020 A1 | 9/2011 | Silverbrook |
| 2011/0259557 A1 | 10/2011 | Chao |
| 2011/0277491 A1 | 11/2011 | Wu |
| 2011/0304240 A1 | 12/2011 | Meitav |
| 2012/0063091 A1 | 3/2012 | Dede |
| 2012/0171062 A1 | 7/2012 | Kodama |
| 2012/0301333 A1 | 11/2012 | Smirnov |

(56) References Cited

U.S. PATENT DOCUMENTS

| | | |
|---|---|---|
| 2013/0058818 A1 | 3/2013 | Hirata |
| 2013/0071269 A1 | 3/2013 | Fujisaki |
| 2013/0157729 A1 | 6/2013 | Tabe |
| 2013/0225065 A1 | 8/2013 | Lee |
| 2013/0233523 A1 | 9/2013 | Parida |
| 2014/0052429 A1 | 2/2014 | Kelkar |
| 2014/0192485 A1 | 7/2014 | Rau |
| 2014/0216696 A1 | 8/2014 | Donnelly |
| 2015/0007965 A1 | 1/2015 | Joshi |
| 2015/0009631 A1 | 1/2015 | Joshi |
| 2015/0043164 A1 | 2/2015 | Joshi |
| 2015/0173237 A1 | 6/2015 | Lin |
| 2015/0308377 A1 | 10/2015 | Packard |
| 2016/0025429 A1 | 1/2016 | Muir |
| 2016/0076530 A1 | 3/2016 | Chen |
| 2016/0343637 A1 | 11/2016 | Axelrod |
| 2016/0353186 A1 | 12/2016 | Rothkopf |
| 2016/0358841 A1 | 12/2016 | Eid |
| 2016/0377072 A1 | 12/2016 | Wu |
| 2016/0377073 A1 | 12/2016 | Tanaka |
| 2017/0146039 A1 | 5/2017 | Lin |
| 2017/0222123 A1 | 8/2017 | Chen |
| 2017/0276149 A1 | 9/2017 | Dusseau |
| 2017/0292537 A1 | 10/2017 | Barak |
| 2017/0363076 A1 | 12/2017 | Najafi |
| 2018/0061737 A1 | 3/2018 | Arik |
| 2018/0145010 A1 | 5/2018 | Fukuoka |
| 2018/0146573 A1 | 5/2018 | Chen |
| 2018/0146574 A1 | 5/2018 | Chen |
| 2018/0187672 A1 | 7/2018 | Tanaka |
| 2018/0240734 A1 | 8/2018 | Liao |
| 2019/0062150 A1 | 2/2019 | Moitzi |
| 2019/0067550 A1 | 2/2019 | Mou |
| 2019/0085836 A1 | 3/2019 | Mou |
| 2019/0101938 A1 | 4/2019 | Mou |
| 2019/0128252 A1* | 5/2019 | Mou ................ F04B 39/121 |
| 2019/0301442 A1 | 10/2019 | Hao |
| 2019/0309744 A1 | 10/2019 | Ting |
| 2020/0049143 A1* | 2/2020 | Ganti ................ H01L 23/473 |
| 2020/0049386 A1* | 2/2020 | Ganti ................ F04B 53/08 |
| 2020/0049387 A1* | 2/2020 | Ganti ................ H05K 7/20 |
| 2020/0049388 A1* | 2/2020 | Ganti ................ H05K 7/20272 |
| 2020/0051895 A1* | 2/2020 | Ganti ................ F04B 43/095 |
| 2020/0053905 A1 | 2/2020 | Ganti |
| 2020/0088185 A1 | 3/2020 | Mou |
| 2020/0229320 A1 | 7/2020 | Mou |
| 2020/0309111 A1* | 10/2020 | Mou ................ F04B 45/047 |
| 2021/0131415 A1 | 5/2021 | Yalamarthy |
| 2021/0144884 A1 | 5/2021 | Mou |
| 2021/0176894 A1 | 6/2021 | Yalamarthy |
| 2021/0176895 A1 | 6/2021 | Mukundan |
| 2021/0180723 A1 | 6/2021 | Mukundan |
| 2021/0183739 A1 | 6/2021 | Sathyamurthy |
| 2021/0185853 A1 | 6/2021 | Ganti |
| 2021/0185856 A1 | 6/2021 | Ganti |
| 2022/0081284 A1 | 3/2022 | Ganti |
| 2022/0087058 A1 | 3/2022 | Sankar |
| 2022/0087064 A1 | 3/2022 | Ganti |
| 2022/0120269 A1* | 4/2022 | Mou ................ F16K 15/144 |
| 2022/0150335 A1 | 5/2022 | Sathyamurthy |
| 2022/0187033 A1 | 6/2022 | Sankar |
| 2022/0189852 A1 | 6/2022 | Sathyamurthy |
| 2022/0282932 A1 | 9/2022 | Sathyamurthy |

FOREIGN PATENT DOCUMENTS

| | | |
|---|---|---|
| CN | 101785103 | 7/2010 |
| CN | 103828050 | 5/2014 |
| CN | 204436756 | 7/2015 |
| CN | 104832407 | 8/2015 |
| CN | 106206490 | 12/2016 |
| CN | 106849747 | 6/2017 |
| CN | 107642483 | 1/2018 |
| CN | 207287973 | 5/2018 |
| CN | 109641738 | 4/2019 |
| CN | 113898563 | 4/2022 |
| EP | 3290211 | 3/2018 |
| EP | 3327295 | 5/2018 |
| JP | S59152793 | 8/1984 |
| JP | S62149158 | 9/1987 |
| JP | S62199999 | 9/1987 |
| JP | H0465862 | 3/1992 |
| JP | H07263598 | 10/1995 |
| JP | H09246766 | 9/1997 |
| JP | 2000323882 | 11/2000 |
| JP | 2001119181 | 4/2001 |
| JP | 2002130198 | 5/2002 |
| JP | 2008159688 | 7/2008 |
| JP | 2008525709 | 7/2008 |
| JP | 2008263830 | 11/2008 |
| JP | 2010029759 | 2/2010 |
| JP | 2011144743 | 7/2011 |
| JP | 2013223818 | 10/2013 |
| JP | 2018022868 | 2/2018 |
| JP | 2018085510 | 5/2018 |
| JP | 2018085511 | 5/2018 |
| JP | 2018085512 | 5/2018 |
| JP | 6528849 | 6/2019 |
| KR | 20050026992 | 3/2005 |
| KR | 100594802 | 7/2006 |
| KR | 20070063029 | 6/2007 |
| TW | 200635493 | 10/2006 |
| TW | 201638469 | 11/2016 |
| TW | M542326 | 5/2017 |
| TW | 201814772 | 4/2018 |
| WO | 2014024608 | 2/2014 |

OTHER PUBLICATIONS

Murata Manufacturing Co., Ltd., Microblower MZB1001T02, Microblower (Air Pump), Micro Mechatronics, Apr. 2014, downloaded from: https://www.murata.com/en-us/products/mechatronics/fluid/microblower_mzb1001t02.

Liu et al., Application Prospects of Microfluidics Technology in Electronic Chip Cooling Research, Cryo & Supercond, vol. 37, No. 9, Sep. 16, 2009.

* cited by examiner

400A

400B

CAVITIES FOR CENTER-PINNED ACTUATOR COOLING SYSTEMS

CROSS REFERENCE TO OTHER APPLICATIONS

This application is a continuation in part of U.S. patent application Ser. No. 17/890,917 entitled ENGINEERED ACTUATORS USABLE IN MEMS ACTIVE COOLING DEVICES filed Aug. 18, 2022, which is a continuation of U.S. patent application Ser. No. 17/464,422, now U.S. Pat. No. 11,503,742, entitled ENGINEERED ACTUATORS USABLE IN MEMS ACTIVE COOLING DEVICES filed Sep. 1, 2021, which is a continuation of U.S. patent application Ser. No. 17/023,215, now U.S. Pat. No. 11,510,341, entitled ENGINEERED ACTUATORS USABLE IN MEMS ACTIVE COOLING DEVICES filed Sep. 16, 2020, which is a continuation in part of U.S. patent application Ser. No. 16/915,912, now U.S. Pat. No. 11,464,140, entitled CENTRALLY ANCHORED MEMS-BASED ACTIVE COOLING SYSTEMS filed Jun. 29, 2020, which claims priority to U.S. Provisional Patent Application No. 62/945,001 entitled CENTRALLY ANCHORED MEMS-BASED ACTIVE COOLING SYSTEMS filed Dec. 6, 2019, all of which are incorporated herein by reference for all purposes.

This application is a continuation in part of U.S. patent application Ser. No. 18/370,732 entitled TOP CHAMBER CAVITIES FOR CENTER-PINNED ACTUATORS filed Sep. 20, 2023, which is a continuation of U.S. patent application Ser. No. 17/367,057, now U.S. Pat. No. 11,796,262, entitled TOP CHAMBER CAVITIES FOR CENTER-PINNED ACTUATORS filed Jul. 2, 2021, which is a continuation in part of U.S. patent application Ser. No. 16/915,912, now U.S. Pat. No. 11,464,140, entitled CENTRALLY ANCHORED MEMS-BASED ACTIVE COOLING SYSTEMS filed Jun. 29, 2020, which claims priority to U.S. Provisional Patent Application No. 62/945,001 entitled CENTRALLY ANCHORED MEMS-BASED ACTIVE COOLING SYSTEMS filed Dec. 6, 2019, all of which are incorporated herein by reference for all purposes.

This application claims priority claims priority to U.S. Provisional Patent Application No. 63/547,653 entitled MEMS COOLING SYSTEM FOR THIN ELECTRONIC DEVICES filed Nov. 7, 2023.

BACKGROUND OF THE INVENTION

As computing devices grow in speed and computing power, the heat generated by the computing devices also increases. Various mechanisms have been proposed to address the generation of heat. Active devices, such as fans, may be used to drive air through large computing devices, such as laptop computers or desktop computers. Passive cooling devices, such as heat spreaders, may be used in smaller, mobile computing devices, such as smartphones, virtual reality devices and tablet computers. However, such active and passive devices may be unable to adequately cool both mobile devices such as smartphones and larger devices such as laptops and desktop computers. Consequently, additional cooling solutions for computing devices are desired. Moreover, such cooling systems may be desired to be optimized to better provide the desired cooling for mobile and other devices.

BRIEF DESCRIPTION OF THE DRA WINGS

Various embodiments of the invention are disclosed in the following detailed description and the accompanying drawings.

DETAILED DESCRIPTION

Figure 1A:
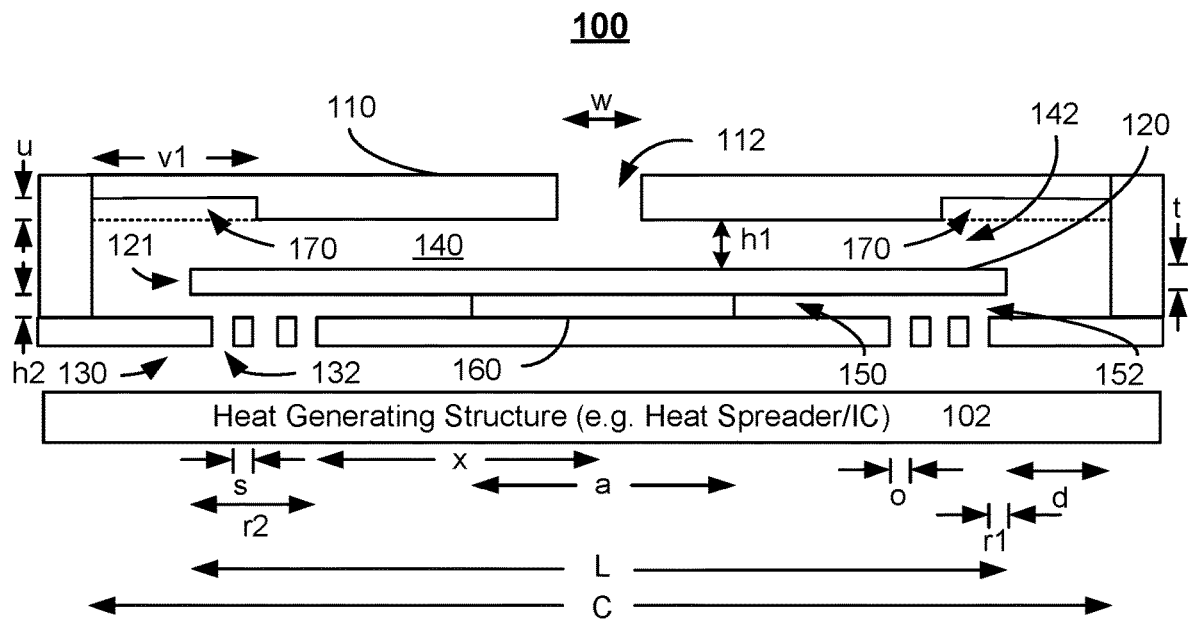
FIGS. 1A-1F depict an embodiment of an active cooling system including an actuator and cavities in the upper chamber.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

As semiconductor devices become increasingly powerful, the heat generated during operations also grows. For example, processors for mobile devices such as smartphones, tablet computers, notebooks, and virtual reality devices can operate at high clock speeds, but produce a significant amount of heat. Because of the quantity of heat produced, processors may run at full speed only for a relatively short period of time. After this time expires, throttling (e.g. slowing of the processor's clock speed) occurs. Although throttling can reduce heat generation, it also adversely affects processor speed and, therefore, the performance of devices using the processors. As technology moves to 5G and beyond, this issue is expected to be exacerbated.

Larger devices, such as laptop or desktop computers include electric fans that have rotating blades. The fan that can be energized in response to an increase in temperature of internal components. The fans drive air through the larger devices to cool internal components. However, such fans are typically too large for mobile devices such as smartphones or for thinner devices such as tablet computers. Fans also may have limited efficacy because of the boundary layer of air existing at the surface of the components, provide a limited airspeed for air flow across the hot surface desired to be cooled and may generate an excessive amount of noise. Passive cooling solutions may include components such as a heat spreader and a heat pipe or vapor chamber to transfer heat to a heat exchanger. Although a heat spreader somewhat mitigates the temperature increase at hot spots, the amount of heat produced in current and future devices may not be adequately addressed. Similarly, a heat pipe or vapor chamber may provide an insufficient amount of heat transfer to remove excessive heat generated. Thus, additional cooling solutions capable of being used with smaller mobile devices as well as larger devices are desired.

Although described in the context of a cooling system, the techniques and/or devices described herein may be used in other applications. For example, the actuator may be used in other devices and/or the cooling system may be used for other purposes. The devices are also described in the context of actuators (i.e. cooling elements) that are coupled to a support structure at a central region or at the edges. In other embodiments, the actuator could be coupled to (e.g. anchored to) a support structure in another manner. For example, the actuator may be attached to the support structure along an edge of the actuator.

A flow chamber having an upper chamber, a lower chamber, and an actuator is described. The upper chamber includes a top wall. The actuator is located distally from the top wall. The lower chamber includes a bottom wall and a sidewall. The lower chamber receives a fluid from the upper chamber when the actuator is activated. The bottom wall has orifices and at least one cavity therein. The orifices are vertically aligned with a portion of the actuator and allow the fluid to exit the lower chamber. The at least one cavity is proximate to the sidewall and distally located from the orifices. In some embodiments, the cavity/cavities are between a tip of the actuator and the sidewall. The bottom wall may also include at least one additional cavity therein. At least a portion of the orifices are in the additional cavity/cavities. In some embodiments, the flow chamber includes at least one fluidized surface, at least a portion of which fluidically couples the at least one cavity with the lower chamber.

A cooling system including cooling cells is described. Each of the cooling cells includes a flow chamber having an upper chamber, an actuator, and a lower chamber. The upper chamber includes a top wall. The actuator is located distally from the top wall. The lower chamber includes a bottom wall and a sidewall. The lower chamber receives a fluid from the upper chamber when the actuator is activated. The bottom wall has orifices therein and at least one cavity therein. The orifices are vertically aligned with a portion of the actuator and allow the fluid to exit the lower chamber. The bottom wall includes at least one cavity therein. The cavity/cavities are proximate to the sidewall and distally located from the orifices. In some embodiments, the cavity/cavities are between a tip of the actuator and the sidewall. In some embodiments, the bottom wall further includes at least one additional cavity therein. At least a portion of the orifices are in the additional cavity/cavities. In some embodiments, the flow chamber includes at least one fluidized surface, at least a portion of which fluidically couples the at least one cavity with the lower chamber.

A method is described. The method includes driving an actuator to induce a vibrational motion at a frequency. The actuator being configured to undergo the vibrational motion when driven to direct a fluid toward through a chamber including an upper chamber, a lower chamber and the actuator. The upper chamber includes a top wall. The actuator is located distally from the top wall. The lower chamber includes a bottom wall and a sidewall. The lower chamber receives the fluid from the upper chamber when the actuator is activated. The bottom wall has orifices and at least one cavity therein. The orifices are vertically aligned with a portion of the actuator and allow the fluid to exit the lower chamber. The cavity/cavities are proximate to the sidewall and distally located from the orifices. In some embodiments, the chamber includes at least one fluidized surface, at least a portion of which fluidically couples the cavity/cavities with the lower chamber.

The actuator of the flow chamber, cooling system, and/or method may include an anchored region coupled to a support structure and cantilevered arm(s). In some embodiments, the cantilevered arm(s) include a step region and an extension region. The step region has a step thickness. The extension region extends outward from the step region and has an extension thickness less than the step thickness. In some embodiments, the extension region extends to a tip of the cantilevered arm. In some embodiments, the cantilevered arm includes an outer region extending outward from the extension region and having an outer thickness greater than the extension thickness. Thus, the cantilevered arm includes a bottom cavity facing the bottom wall and/or a top cavity facing the top wall. In some embodiments, the actuator includes a shim region on the anchored region. The shim region has a shim thickness greater than the extension region.

FIGS. 1A-IF are diagrams depicting an exemplary embodiment of active cooling system 100 usable with heat-generating structure 102 and including a centrally anchored actuator 120. When used in a cooling system, an actuator may also be referred to as a cooling element. Thus, actuator 120 may also be referred to herein as cooling element 120. For clarity, only certain components are shown. FIGS. 1A-IF are not to scale. Although shown as symmetric, cooling system 100 need not be.

Figure 1B:
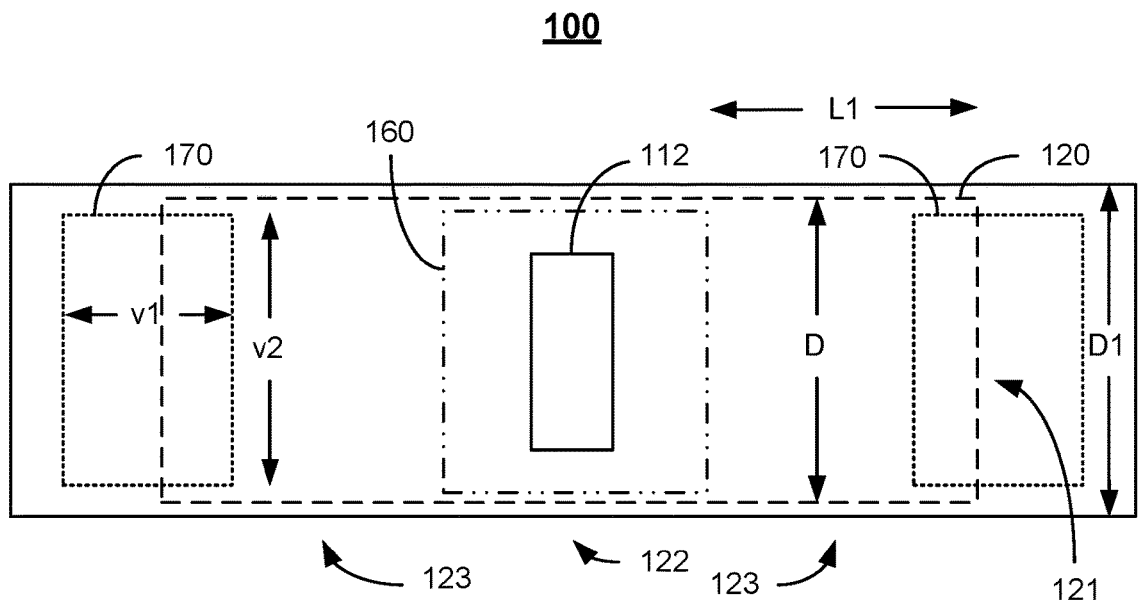

FIGS. 1A and 1B depict cross-sectional and top views of cooling system 100.

Cooling system 100 includes top plate 110 having vent 112 therein, actuator (or cooling element) 120, orifice plate 130 having orifices 132 therein, support structure (or "anchor") 160 and chambers 140 and 150 (collectively flow chamber 140/150) formed therein. The top wall of flow chamber 140/150 is formed by the bottom surface of top plate 110 in the embodiment shown. The top wall of flow chamber 140/150 has cavities 170 therein. Flow chamber 140/150 may thus be considered to be formed between top plate 110 and orifice plate 130. Actuator 120 is supported at its central region by anchor 160. In FIG. 1B, actuator 120 is shown by a dashed line and anchor 160 is shown by a dotted/dashed line. For simplicity, orifices 132 are not depicted in FIG. 1B. Regions of actuator 120 closer to and including portions of the actuator's perimeter (e.g. tip 121) vibrate when actuated. In some embodiments, tip 121 of actuator 120 includes a portion of the perimeter furthest from anchor 160 and undergoes the largest deflection during actuation of actuator 120. For clarity, only one tip 121 of actuator 120 is labeled in FIG. 1A.

FIGS. 1A and 1B depict cooling system 100 in a neutral position. Thus, actuator 120 is shown as substantially flat. For in-phase operation, actuator 120 is driven to vibrate between positions shown in FIGS. 1C and 1D. This vibrational motion draws fluid (e.g. air) into vent 112, through flow chamber 140/150 and out orifices 132 at high speed and/or flow rates. For example, the speed at which the fluid impinges on heat-generating structure 102 may be at least thirty meters per second. In some embodiments, the fluid is driven by actuator 120 toward heat-generating structure 102 at a speed of at least forty-five meters per second. In some embodiments, the fluid is driven toward heat-generating structure 102 by actuator 120 at speeds of at least sixty meters per second. Other speeds may be possible in some embodiments. Cooling system 100 is also configured so that little or no fluid is drawn back into flow chamber 140/150 through orifices 132 by the vibrational motion of actuator 120.

Heat-generating structure 102 is desired to be cooled by cooling system 100. In some embodiments, heat-generating structure 102 generates heat. For example, heat-generating structure may be an integrated circuit. In some embodiments, heat-generating structure 102 is desired to be cooled but does not generate heat itself. Heat-generating structure 102 may conduct heat (e.g. from a nearby object that generates heat). For example, heat-generating structure 102 might be a heat spreader or a vapor chamber. Thus, heat-generating structure 102 may include semiconductor component(s) including individual integrated circuit components such as processors, other integrated circuit(s) and/or chip package(s); sensor(s); optical device(s); one or more batteries; other component(s) of an electronic device such as a computing device; heat spreaders; heat pipes; other electronic component(s) and/or other device(s) desired to be cooled.

The devices in which cooling system 100 is desired to be used may also have limited space in which to place a cooling system. For example, cooling system 100 may be used in computing devices. Such computing devices may include but are not limited to smartphones, tablet computers, laptop computers, tablets, two-in-one laptops, hand held gaming systems, digital cameras, virtual reality headsets, augmented reality headsets, mixed reality headsets and other devices that are thin. Cooling system 100 may be a micro-electro-mechanical system (MEMS) cooling system capable of residing within mobile computing devices and/or other devices having limited space in at least one dimension. For example, the total height of cooling system 100 (from the top of heat-generating structure 102 to the top of top plate 110) may be less than 2 millimeters. In some embodiments, the total height of cooling system 100 is not more than 1.5 millimeters. In some embodiments, the total height does not exceed two hundred and fifty micrometers. In some embodiments, this total height is not more than 1.1 millimeters. In some embodiments, the total height does not exceed one millimeter. Similarly, the distance between the bottom of orifice plate 130 and the top of heat-generating structure 102, y (shown in FIG. 1C), may be small. In some embodiments, y is at least two hundred micrometers and not more than one millimeter. In some embodiments, y is at least two hundred micrometers and not more than three hundred micrometers. Thus, in some embodiments, the distance between the surface of orifice plate 130 closest to heat-generating structure 102 and the surface of top plate 110 furthest from heat-generating structure 102 is not more than seven hundred micrometers. Thus, cooling system 100 is usable in computing devices and/or other devices having limited space in at least one dimension. However, nothing prevents the use of cooling system 100 in devices having fewer limitations on space and/or for purposes other than cooling. Although one cooling system 100 is shown (e.g. one cooling cell), multiple cooling systems 100 might be used in connection with heat-generating structure 102. For example, a one or two-dimensional array of cooling cells might be utilized.

Cooling system 100 is in communication with a fluid used to cool heat-generating structure 102. The fluid may be a gas or a liquid. For example, the fluid may be air. In some embodiments, the fluid includes fluid from outside of the device in which cooling system 100 resides (e.g. provided through external vents in the device). In some embodiments, the fluid circulates within the device in which cooling system resides (e.g. in an enclosed device).

Actuator 120 can be considered to divide the interior of active cooling system 100 (e.g. flow chamber 140/150) into top (or upper) chamber 140 and bottom (or lower) chamber 150. Top chamber 140 is formed by actuator 120, the sides, and top plate 110. Bottom chamber 150 is formed by orifice plate 130, the sides, actuator 120 and anchor 160. Top chamber 140 and bottom chamber 150 are connected at the periphery of actuator 120 and together form flow chamber 140/150 (e.g. an interior chamber of cooling system 100).

The size and configuration of top chamber 140 may be a function of the cell (cooling system 100) dimensions, actuator 120 motion, and the frequency of operation. Top chamber 140 has a height, h1. The height of top chamber 140 may be selected to provide sufficient pressure to drive the fluid to bottom chamber 150 and through orifices 132 at the desired flow rate and/or speed. Top chamber 140 is also sufficiently tall that actuator 120 does not contact top plate 110 when actuated. In some embodiments, the height of top chamber 140 is at least fifty micrometers and not more than five hundred micrometers. In some embodiments, top chamber 140 has a height of at least two hundred and not more than three hundred micrometers.

Top plate 110 also includes cavities 170 therein. In FIG. 1B, cavities 170 are depicted by dotted lines. Although shown as having a particular shape (i.e. rectangular), cavities 170 may have another shape including but not limited to triangular, oval, circular, and/or diamond-shaped. Although cavities 170 are shown as symmetric and having the same shape, in some embodiments, cavities 170 may have different shapes and/or may be asymmetric. Although shown as located at the outer edges of flow chamber 140/150, cavities 170 may be located elsewhere. The dimensions of cavities 170 may also vary. Cavities 170 may have a height, u, of at least fifty micrometers and not more than four hundred micrometers (e.g. in some embodiments, at least twenty-five percent of the height, h1, of upper chamber 140 and not more than one hundred percent of the upper chamber height). In some embodiments, cavities 170 may have a height of not more than two hundred micrometers (e.g. not more than fifty percent of the upper chamber height in some embodiments). The length, v1, of cavities 170 may be at least five hundred micrometers and not more than 2.5 millimeters (e.g. in some embodiments, at least twenty-five percent and not more than $\frac{2}{3}$ of the length of a free portion of actuator 120). For example, the free portion of actuator 120 may have a length, L1, of three millimeters (e.g. at least one millimeter and not more than five millimeters). In such embodiments, cavities 170 may have a length of at least 1 millimeter and not more than two millimeters. In some embodiments, cavities 170 may have a length of not more than 1.5 millimeters. In some embodiments, the length v1 is at least two multiplied by the distance between tip 121 of actuator 120 and the outer wall of upper chamber 140 (e.g. twice an edge vent length) and not more than half L1. The width of cavities 170, v2, may be at least half of the width, DI, of upper chamber 140 and not more than the width of upper chamber. In some embodiments, cavities 170 have a width of at least six millimeters and not more than eight millimeters. In some embodiments, other shapes may be used for cavities 170. In some such embodiments, the areas of the cavities may be desired to be in the same ranges as for the rectangular cavities indicated above. Because of the presence of cavities 170, top plate 110 may be viewed as having a varying thickness, top chamber 140 (and flow chamber 140/150) may be viewed as having a varying height, and flow chamber 140/150 may be viewed as having a top surface with cavities 170 therein.

Top plate 110 includes vent 112 through which fluid may be drawn into cooling system 100. Top vent 112 may have a size chosen based on the desired acoustic pressure in chamber 140. For example, in some embodiments, the width, w, of vent 112 is at least five hundred micrometers and not more than one thousand micrometers. In some embodiments, the width of vent 112 is at least two hundred fifty micrometers and not more than two thousand micrometers. In the embodiment shown, vent 112 is a centrally located aperture in top plate 110. In other embodiments, vent 112 may be located elsewhere. For example, vent 112 may be closer to one of the edges of top plate 110. Vent 112 may have a circular, rectangular or other shaped footprint. Although a single vent 112 is shown, multiple vents might be used. For example, vents may be offset toward the edges of top chamber 140 or be located on the side(s) of top chamber 140. In some embodiments, multiple vents offset out of the plane of the page might be used.

Bottom chamber 150 has a height, h2. In some embodiments, the height of bottom chamber 150 is sufficient to accommodate the motion of actuator 120. Thus, no portion of actuator 120 contacts orifice plate 130 during normal operation. Bottom chamber 150 is generally smaller than top chamber 140 and may aid in reducing the backflow of fluid into orifices 132. In some embodiments, the height of bottom chamber 150 is the maximum deflection of actuator 120 plus at least five micrometers and not more than ten micrometers. In some embodiments, the deflection of actuator 120 (e.g. the deflection of tip 121) has an amplitude, z (shown in FIG. 1D), of at least ten micrometers and not more than one hundred micrometers. In some such embodiments, the amplitude of deflection of actuator 120 is at least ten micrometers and not more than sixty micrometers. However, the amplitude of deflection of actuator 120 depends on factors such as the desired flow rate through cooling system 100 and the configuration of cooling system 100. Thus, the height of bottom chamber 150 generally depends on the flow rate through and other components of cooling system 100.

Anchor (support structure) 160 supports actuator 120 at the central portion of actuator 120. Thus, at least part of the perimeter of actuator 120 is unpinned and free to vibrate. In some embodiments, anchor 160 extends along a central axis of actuator 120 (e.g. perpendicular to the page in FIGS. 1A-1F). In such embodiments, portions of actuator 120 that vibrate (e.g. including tip 121) move in a cantilevered fashion. Thus, portions of actuator 120 may move in a manner analogous to the wings of a butterfly (i.e. in-phase) and/or analogous to a seesaw (i.e. out-of-phase). Thus, the portions of actuator 120 that vibrate in a cantilevered fashion do so in-phase in some embodiments and out-of-phase in other embodiments. In some embodiments, anchor 160 does not extend along an axis of actuator 120. In such embodiments, all portions of the perimeter of actuator 120 are free to vibrate (e.g. analogous to a jellyfish). In the embodiment shown, anchor 160 supports actuator 120 from the bottom of actuator 120. In other embodiments, anchor 160 may support actuator 120 in another manner. For example, anchor 160 may support actuator 120 from the top (e.g. actuator 120 hangs from anchor 160). In some embodiments, the width, a, of anchor 160 is at least 0.5 millimeters and not more than four millimeters. In some embodiments, the width of anchor 160 is at least two millimeters and not more than 2.5 millimeters. Anchor 160 may occupy at least ten percent and not more than fifty percent of actuator 120.

Actuator 120 has a first side distal from heat-generating structure 102 and a second side proximate to heat-generating structure 102. In the embodiment shown in FIGS. 1A-1F, the first side of actuator 120 is the top of actuator 120 (further from orifice plate 130) and the second side is the bottom of actuator 120 (closer to orifice plate 130). Actuator 120 is actuated to undergo vibrational motion as shown in FIGS. 1A-1F. The vibrational motion of actuator 120 drives fluid from the first side of actuator 120 distal from heat-generating structure 102 (e.g. from top chamber 140) to a second side of actuator 120 proximate to heat-generating structure 102 (e.g. to bottom chamber 150). Stated differently, actuation of actuator 120 directs fluid through flow chamber 140/150 and from the top chamber 140 to the bottom chamber 150. The vibrational motion of actuator 120 also draws fluid through vent 112 and into top chamber 140; forces fluid from top chamber 140 to bottom chamber 150; and drives fluid from bottom chamber 150 through orifices 132 of orifice plate 130.

Actuator 120 has a length, L, that depends upon the frequency at which actuator 120 is desired to vibrate. In some embodiments, the length of actuator 120 is at least four millimeters and not more than ten millimeters. In some such embodiments, actuator 120 has a length of at least six millimeters and not more than eight millimeters. The depth, D (shown in FIG. 1B), of actuator 120 (e.g. perpendicular to the plane shown in FIGS. 1A and 1C-1F) may vary from one fourth of L through twice L. For example, actuator 120 may have the same depth as length. The thickness, t, of actuator 120 may vary based upon the configuration of actuator 120 and/or the frequency at which actuator 120 is desired to be actuated. In some embodiments, the actuator thickness is at least two hundred micrometers and not more than three hundred and fifty micrometers for actuator 120 having a length of eight millimeters and driven at a frequency of at least twenty kilohertz and not more than twenty-five kilohertz. The length, C, of flow chamber 140/150 is close to the length, L, of actuator 120. For example, in some embodiments, the distance, d, between the edge of actuator 120 and the wall of flow chamber 140/150 is at least one hundred micrometers and not more than one thousand micrometers. In some embodiments, d is at least one hundred micrometers and not more than five hundred micrometers. In some such embodiments, d is at least three hundred micrometers. In some embodiments, d is at least two hundred micrometers and not more than three hundred micrometers. In some embodiments, d is not more than eight hundred micrometers. This distance, d, may be termed the edge vent.

In the embodiment shown, actuator 120 is supported (held in place) by anchor 160 along the central axis (out of the plane of the page in FIG. 1A) at central portion 122 (hereinafter anchored region 122). Thus, cantilevered arms 123 (denoted in FIG. 1B only) that are actuated to vibrate are to the right and left of anchor 160. In some embodiments, actuator 120 is a continuous structure having two portions which are free and actuated (e.g. the cantilevered arms 123). In some embodiments, actuator 120 includes separate cantilevered portions each of which is attached to the anchor 160 and actuated. Cantilevered arms 123 of actuator 120 may be driven to vibrate in a manner analogous to the wings of a butterfly (in-phase) or to a seesaw (out-of-phase).

Although not shown in FIGS. 1A-1F actuator 120 may include one or more piezoelectric layer(s). In some embodiments, piezoelectric may be located only on or in cantilevered arms 123 of actuator 120. In some embodiments, piezoelectric may be on or in all of actuator 120. Thus, actuator 120 may be a multilayer actuator in which the piezoelectric is integrated into actuator 120. For example, actuator 120 may include a piezoelectric layer on substrate. The substrate may be a stainless steel, Ni alloy and/or Hastelloy substrate. In some embodiments, piezoelectric layer includes multiple sublayers formed as thin films on the substrate. In other embodiments, the piezoelectric layer may be a bulk layer affixed to the substrate. Such a piezoelectric actuator 120 also includes electrodes used to activate the piezoelectric. The substrate functions as an electrode in some embodiments. In other embodiments, a bottom electrode may be provided between the substrate and the piezoelectric layer. Other layers including but not limited to seed, capping, passivation or other layers might be included in piezoelectric actuator. Although described in the context of a piezoelectric, another mechanism for actuating actuator 120 can be utilized. Such other mechanisms may be on (e.g. affixed to) actuator 120, integrated into actuator 120 or may be located elsewhere (e.g. on anchor 160).

In the embodiment shown in FIG. 1B, anchor 160 extends most but not all of the depth, D, of actuator 120. The entire perimeter of actuator 120 is free. However, anchor 160 still holds in place the central, anchored region 122 of actuator 120. Thus, anchor 160 need not extend the entire length of the central axis in order for cantilevered arms 123 to vibrate as desired. In some embodiments, anchor 160 extends along the central axis to the perimeter of actuator 120. In some such embodiments, anchor 160 has a depth of at least D.

Although actuator 120 is depicted as rectangular, actuators may have another shape. In some embodiments, corners of actuator 120 may be rounded. In some embodiments, the entire cantilevered arm 123 might be rounded. Other shapes are possible. For example, in some embodiments, the anchor may be limited to a region near the center of the actuator. In some such embodiments, the actuator may be symmetric around the anchor. For example, anchor 160 and actuator 120 may have a circular footprint. Such an actuator may be configured to vibrate in a manner analogous to a jellyfish or similar to the opening/closing of an umbrella. In some embodiments, the entire perimeter of such an actuator vibrates in-phase (e.g. all move up or down together). In other embodiments, portions of the perimeter of such an actuator vibrate out-of-phase.

Actuator 120 may be driven at a frequency that is at or near both the resonant frequency for an acoustic resonance of a pressure wave of the fluid in top chamber 140 and the resonant frequency for a structural resonance of actuator 120. The portion of actuator 120 undergoing vibrational motion (e.g. each cantilevered arm 123 having a length (L−a)/2)) is driven at or near resonance (the "structural resonance") of actuator 120. This portion of actuator 120 undergoing vibration may be a cantilevered section in some embodiments. The frequency of vibration for structural resonance is termed the structural resonant frequency. Use of the structural resonant frequency in driving actuator 120 reduces the power consumption of cooling system 100. Actuator 120 and top chamber 140 may also be configured such that this structural resonant frequency corresponds to a resonance in a pressure wave in the fluid being driven through top chamber 140 (the acoustic resonance of top chamber 140). The frequency of such a pressure wave is termed the acoustic resonant frequency. At acoustic resonance, a node in pressure occurs near vent 112 and an antinode in pressure occurs near the periphery of cooling system 100 (e.g. near tip 121 of actuator 120 and near the connection between top chamber 140 and bottom chamber 150). The distance between these two regions is C/2. Thus, $C/2=n\lambda/4$, where $\lambda$ is the acoustic wavelength for the fluid and n is odd (e.g. n=1, 3, 5, etc.). For the lowest order mode, $C=\lambda/2$. Because the length of chamber 140 (e.g. C) is close to the length of actuator 120, in some embodiments, it is also approximately true that $L/2=n\lambda/4$, where $\lambda$ is the acoustic wavelength for the fluid and n is odd. Thus, the frequency at which actuator 120 is driven, v, is at or near the structural resonant frequency for actuator 120. The frequency v is also at or near the acoustic resonant frequency for at least top chamber 140. The acoustic resonant frequency of top chamber 140 generally varies less dramatically with parameters such as temperature and size than the structural resonant frequency of actuator 120. Consequently, in some embodiments, actuator 120 may be driven at (or closer to) a structural resonant frequency than to the acoustic resonant frequency.

Orifice plate 130 has orifices 132 therein. Although a particular number and distribution of orifices 132 are shown, another number and/or another distribution may be used. A single orifice plate 130 is used for a single cooling system 100. In other embodiments, multiple cooling systems 100 may share an orifice plate. For example, multiple cells 100 may be provided together in a desired configuration. In such embodiments, the cells 100 may be the same size and configuration or different size(s) and/or configuration(s). Orifices 132 are shown as having an axis oriented normal to a surface of heat-generating structure 102. In other embodiments, the axis of one or more orifices 132 may be at another angle. For example, the angle of the axis may be selected from substantially zero degrees and a nonzero acute angle. Orifices 132 also have sidewalls that are substantially parallel to the normal to the surface of orifice plate 130. In some embodiments, orifices may have sidewalls at a nonzero angle to the normal to the surface of orifice plate 130. For example, orifices 132 may be cone-shaped. Further, although orifice place 130 is shown as substantially flat, in some embodiments, trenches and/or other structures may be provided in orifice plate 130 to modify the configuration of bottom chamber 150 and/or the region between orifice plate 130 and heat-generating structure 102.

The size, distribution and locations of orifices 132 are chosen to control the flow rate of fluid driven to the surface of heat-generating structure 102. The locations and configurations of orifices 132 may be configured to increase/maximize the fluid flow from bottom chamber 150 through orifices 132 to the jet channel (the region between the bottom of orifice plate 130 and the top of heat-generating structure 102). The locations and configurations of orifices 132 may also be selected to reduce/minimize the suction flow (e.g. back flow) from the jet channel through orifices 132. For example, the locations of orifices are desired to be sufficiently far from tip 121 that suction in the upstroke of actuator 120 (tip 121 moves away from orifice plate 13) that would pull fluid into bottom chamber 150 through orifices 132 is reduced. The locations of orifices are also desired to be sufficiently close to tip 121 that suction in the upstroke of actuator 120 also allows a higher pressure from top chamber 140 to push fluid from top chamber 140 into bottom chamber 150. In some embodiments, the ratio of the flow rate from top chamber 140 into bottom chamber 150 to the flow rate from the jet channel through orifices 132 in the upstroke (the "net flow ratio") is greater than 2:1. In some embodiments, the net flow ratio is at least 85:15. In some embodiments, the net flow ratio is at least 90:10. In order to provide the desired pressure, flow rate, suction, and net flow ratio, orifices 132 are desired to be at least a distance, r1, from tip 121 and not more than a distance, r2, from tip 121 of actuator 120. In some embodiments r1 is at least one hundred micrometers (e.g. r1≥100 μm) and r2 is not more than one millimeter (e.g. r2≤1000 μm). In some embodiments, orifices 132 are at least two hundred micrometers from tip 121 of actuator 120 (e.g. r1≥200 μm). In some such embodiments, orifices 132 are at least three hundred micrometers from tip 121 of actuator 120 (e.g. r1≥300 μm). In some embodiments, orifices 132 have a width, o, of at least one hundred micrometers and not more than five hundred micrometers. In some embodiments, orifices 132 have a width of at least two hundred micrometers and not more than three hundred micrometers. In some embodiments, the orifice separation, s, is at least one hundred micrometers and not more than one millimeter. In some such embodiments, the orifice separation is at least four hundred micrometers and not more than six hundred micrometers. In some embodiments, orifices 132 are also desired to occupy a particular fraction of the area of orifice plate 130. For example, orifices 132 may cover at least five percent and not more than fifteen percent of the footprint of orifice plate 130 in order to achieve a desired flow rate of fluid through orifices 132. In some embodiments, orifices 132 cover at least eight percent and not more than twelve percent of the footprint of orifice plate 130.

In some embodiments, cooling system 100 includes chimneys (not shown) or other ducting. Such ducting provides a path for heated fluid to flow away from heat-generating structure 102. In some embodiments, ducting returns fluid to the side of top plate 110 distal from heat-generating structure 102. In some embodiments, ducting may instead direct fluid away from heat-generating structure 102 in a direction parallel to heat-generating structure 102 or perpendicular to heat-generating structure 102 but in the opposite direction (e.g. toward the bottom of the page). For a device in which fluid external to the device is used in cooling system 100, the ducting may channel the heated fluid to a vent. In such embodiments, additional fluid may be provided from an inlet vent. In embodiments, in which the device is enclosed, the ducting may provide a circuitous path back to the region near vent 112 and distal from heat-generating structure 102. Such a path allows for the fluid to dissipate heat before being reused to cool heat-generating structure 102. In other embodiments, ducting may be omitted or configured in another manner. Thus, the fluid is allowed to carry away heat from heat-generating structure 102.

Figure 1C:
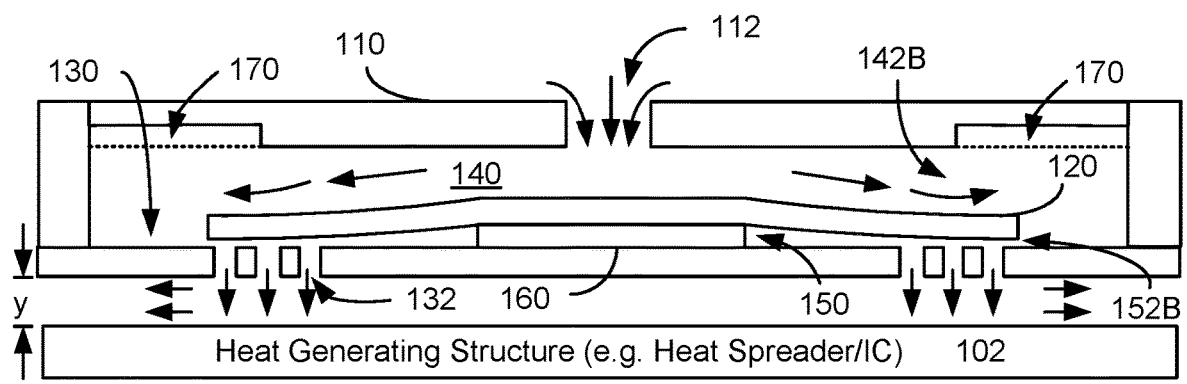
Figure 1D:
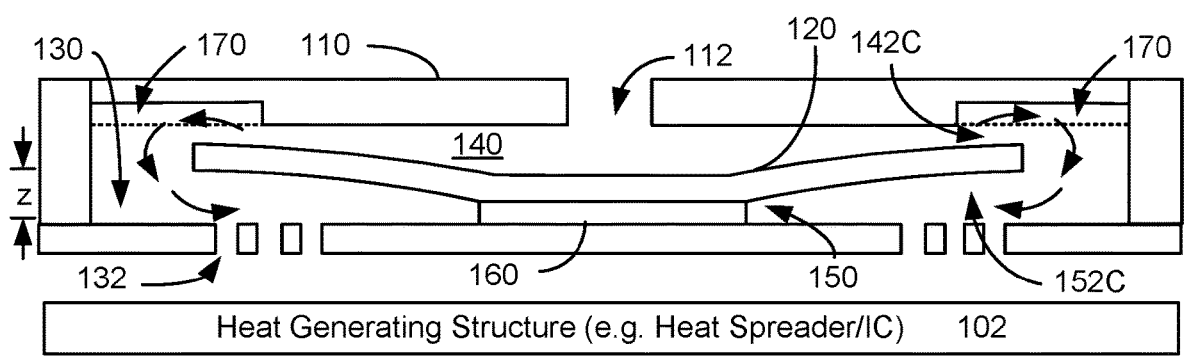

Operation of cooling system 100 is described in the context of FIGS. 1A-1F. Although described in the context of particular pressures, gap sizes, and timing of flow, operation of cooling system 100 is not dependent upon the explanation herein. FIGS. 1C-1D depict in-phase operation of cooling system 100. Referring to FIG. 1C, actuator 120 has been actuated so that its tip 121 moves away from top plate 110. FIG. 1C can thus be considered to depict the end of a down stroke of actuator 120. Because of the vibrational motion of actuator 120, gap 152 for bottom chamber 150 has decreased in size and is shown as gap 152B. Conversely, gap 142 for top chamber 140 has increased in size and is shown as gap 142B. During the down stroke, a lower (e.g. minimum) pressure is developed at the periphery when actuator 120 is at the neutral position. As the down stroke continues, bottom chamber 150 decreases in size and top chamber 140 increases in size as shown in FIG. 1C. Thus, fluid is driven out of orifices 132. The fluid driven out of orifices 132 may travel in a direction that is at or near perpendicular to the surface of orifice plate 130 and/or the top surface of heat-generating structure 102. The fluid is driven from orifices 132 toward heat-generating structure 102 at a high speed, for example in excess of thirty-five meters per second. In some embodiments, the fluid then travels along the surface of heat-generating structure 102 and toward the periphery of heat-generating structure 102, where the pressure is lower than near orifices 132. Also in the down stroke, top chamber 140 increases in size and a lower pressure is present in top chamber 140. As a result, fluid is drawn into top chamber 140 through vent 112. The motion of the fluid into vent 112, through orifices 132, and along the surface of heat generating structure 102 is shown by unlabeled arrows in FIG. 1C.

Actuator 120 is also actuated so that tip 121 moves away from heat-generating structure 102 and toward top plate 110. FIG. 1D can thus be considered to depict the end of an up stroke of actuator 120. Because of the motion of actuator 120, gap 142 has decreased in size and is shown as gap 142C. Gap 152 has increased in size and is shown as gap 152C. During the upstroke, a higher pressure is developed at the periphery when actuator 120 is at the neutral position. As the upstroke continues, bottom chamber 150 increases in size and top chamber 140 decreases in size as shown in FIG. 1D. Thus, the fluid is driven from top chamber 140 (e.g. the periphery of flow chamber 140/150) to bottom chamber 150. Thus, when tip 121 of actuator 120 moves up, top chamber 140 serves as a nozzle for the entering fluid to speed up and be driven towards bottom chamber 150. The motion of the fluid into bottom chamber 150 is shown by unlabeled arrows in FIG. 1D. The location and configuration of actuator 120 and orifices 132 are selected to reduce suction and, therefore, back flow of fluid from the jet channel (between heat-generating structure 102 and orifice plate 130) into orifices 132 during the upstroke. Thus, cooling system 100 is able to drive fluid from top chamber 140 to bottom chamber 150 without an undue amount of backflow of heated fluid from the jet channel entering bottom chamber 150.

The motion between the positions shown in FIGS. 1C and 1D is repeated. Thus, actuator 120 undergoes vibrational motion indicated in FIGS. 1C-1D, drawing fluid through vent 112 from the distal side of top plate 110 into top chamber 140; transferring fluid from top chamber 140 to bottom chamber 150; and pushing the fluid through orifices 132 and toward heat-generating structure 102. As discussed above, actuator 120 is driven to vibrate at or near the structural resonant frequency of actuator 120. Further, the structural resonant frequency of actuator 120 is configured to align with the acoustic resonance of the flow chamber 140/150. The structural and acoustic resonant frequencies are generally chosen to be in the ultrasonic range. For example, the vibrational motion of actuator 120 may be at frequencies from 15 kHz through 30 kHz. In some embodiments, actuator 120 vibrates at a frequency/frequencies of at least 20 kHz and not more than 30 kHz. The structural resonant frequency of actuator 120 is within ten percent of the acoustic resonant frequency of cooling system 100. In some embodiments, the structural resonant frequency of actuator 120 is within five percent of the acoustic resonant frequency of cooling system 100. In some embodiments, the structural resonant frequency of actuator 120 is within three percent of the acoustic resonant frequency of cooling system 100. Consequently, efficiency and flow rate may be enhanced. However, other frequencies may be used.

Fluid driven toward heat-generating structure 102 may move substantially normal (perpendicular) to the top surface of heat-generating structure 102. In some embodiments, the fluid motion may have a nonzero acute angle with respect to the normal to the top surface of heat-generating structure 102. In either case, the fluid may thin and/or form apertures in the boundary layer of fluid at heat-generating structure 102. As a result, transfer of heat from heat-generating structure 102 may be improved. The fluid deflects off of heat-generating structure 102, traveling along the surface of heat-generating structure 102. In some embodiments, the fluid moves in a direction substantially parallel to the top of heat-generating structure 102. Thus, heat from heat-generating structure 102 may be extracted by the fluid. The fluid may exit the region between orifice plate 130 and heat-generating structure 102 at the edges of cooling system 100. Chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of actuator 120. As a result, heat-generating structure 102 may be cooled.

Figure 1E:
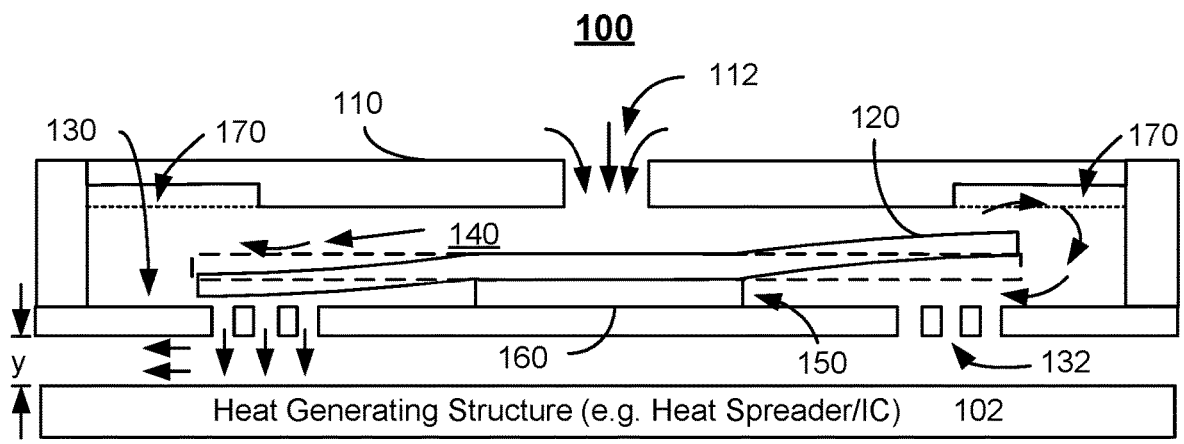
Figure 1F:
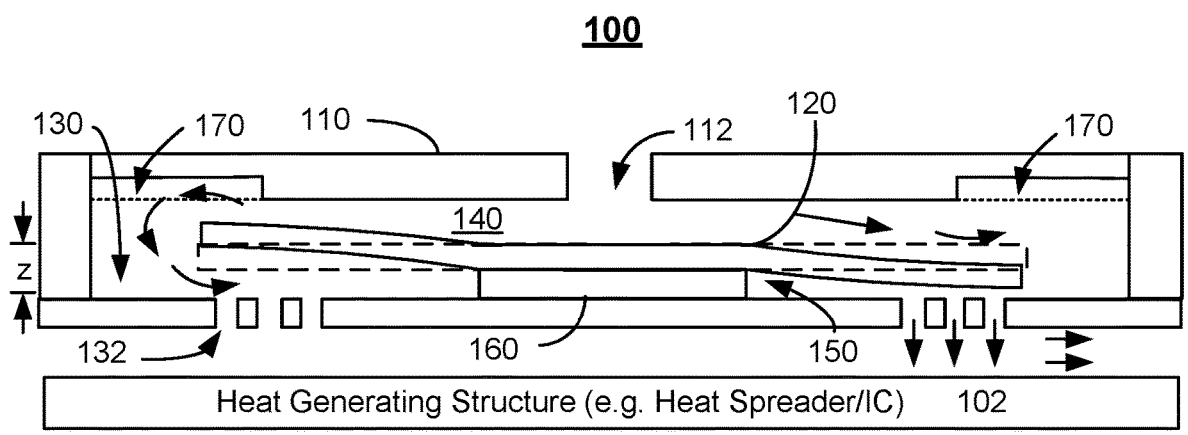

FIGS. 1E-1F depict an embodiment of active cooling system 100 including centrally anchored actuator 120 in which the actuator is driven out-of-phase. More specifically, sections of actuator 120 on opposite sides of anchor 160 (and thus on opposite sides of the central region of actuator 120 that is supported by anchor 160) are driven to vibrate out-of-phase. In some embodiments, sections of actuator 120 on opposite sides of anchor 160 are driven at or near one hundred and eighty degrees out-of-phase. Thus, one section of actuator 120 vibrates toward top plate 110, while the other section of actuator 120 vibrates toward orifice plate 130/heat-generating structure 102. Movement of a section of actuator 120 toward top plate 110 (an upstroke) drives fluid in top cavity 140 to bottom cavity 150 on that side of anchor 160. Movement of a section of actuator 120 toward orifice plate 130 drives fluid through orifices 132 and toward heat-generating structure 102. Thus, fluid traveling at high speeds (e.g. speeds described with respect to in-phase operation) is alternately driven out of orifices 132 on opposing sides of anchor 160. The movement of fluid is shown by unlabeled arrows in FIGS. 1E and 1F.

The motion between the positions shown in FIGS. 1E and 1F is repeated. Thus, actuator 120 undergoes vibrational motion indicated in FIGS. 1A, 1E, and 1F, alternately drawing fluid through vent 112 from the distal side of top plate 110 into top chamber 140 for each side of actuator 120; transferring fluid from each side of top chamber 140 to the corresponding side of bottom chamber 150; and pushing the fluid through orifices 132 on each side of anchor 160 and toward heat-generating structure 102. As discussed above, actuator 120 is driven to vibrate at or near the structural resonant frequency of actuator 120. Further, the structural resonant frequency of actuator 120 is configured to align with the acoustic resonance of the flow chamber 140/150. The structural and acoustic resonant frequencies are generally chosen to be in the ultrasonic range. For example, the vibrational motion of actuator 120 may be at the frequencies described for in-phase vibration. The structural resonant frequency of actuator 120 is within ten percent of the acoustic resonant frequency of cooling system 100. In some embodiments, the structural resonant frequency of actuator 120 is within five percent of the acoustic resonant frequency of cooling system 100. In some embodiments, the structural resonant frequency of actuator 120 is within three percent of the acoustic resonant frequency of cooling system 100. Consequently, efficiency and flow rate may be enhanced. However, other frequencies may be used.

Fluid driven toward heat-generating structure 102 for out-of-phase vibration may move substantially normal (perpendicular) to the top surface of heat-generating structure 102, in a manner analogous to that described above for in-phase operation. Similarly, chimneys or other ducting (not shown) at the edges of cooling system 100 allow fluid to be carried away from heat-generating structure 102. In other embodiments, heated fluid may be transferred further from heat-generating structure 102 in another manner. The fluid may exchange the heat transferred from heat-generating structure 102 to another structure or to the ambient environment. Thus, fluid at the distal side of top plate 110 may remain relatively cool, allowing for the additional extraction of heat. In some embodiments, fluid is circulated, returning to distal side of top plate 110 after cooling. In other embodiments, heated fluid is carried away and replaced by new fluid at the distal side of actuator 120. As a result, heat-generating structure 102 may be cooled.

Using the cooling system 100 actuated for in-phase vibration or out-of-phase vibration, fluid drawn in through vent 112 and driven through orifices 132 may efficiently dissipate heat from heat-generating structure 102. Because fluid impinges upon the heat-generating structure with sufficient speed (e.g. at least thirty meters per second) and in some embodiments substantially normal to the heat-generating structure, the boundary layer of fluid at the heat-generating structure may be thinned and/or partially removed. Consequently, heat transfer between heat-generating structure 102 and the moving fluid is improved. Because the heat-generating structure is more efficiently cooled, the corresponding integrated circuit may be run at higher speed and/or power for longer times. For example, if the heat-generating structure corresponds to a high-speed processor, such a processor may be run for longer times before throttling. Thus, performance of a device utilizing cooling system 100 may be improved. Further, cooling system 100 may be a MEMS device. Consequently, cooling systems 100 may be suitable for use in smaller and/or mobile devices, such as smart phones, other mobile phones, virtual reality headsets, tablets, two-in-one computers, wearables and handheld games, in which limited space is available. Performance of such devices may thus be improved. Because actuator 120 may be vibrated at frequencies of 15 kHz or more, users may not hear any noise associated with actuation of actuators. If driven at or near structural and/or acoustic resonant frequencies, the power used in operating cooling systems may be significantly reduced. Actuator 120 does not physically contact top plate 110 or orifice plate 130 during vibration. Thus, resonance of actuator 120 may be more readily maintained. More specifically, physical contact between actuator 120 and other structures disturbs the resonance conditions for actuator 120. Disturbing these conditions may drive actuator 120 out of resonance. Thus, additional power would need to be used to maintain actuation of actuator 120. Further, the flow of fluid driven by actuator 120 may decrease. These issues are avoided through the use of pressure differentials and fluid flow as discussed above. The benefits of improved, quiet cooling may be achieved with limited additional power. Further, out-of-phase vibration of actuator 120 allows the position of the center of mass of actuator 100 to remain more stable. Although a torque is exerted on actuator 120, the force due to the motion of the center of mass is reduced or eliminated. As a result, vibrations due to the motion of actuator 120 may be reduced. Moreover, efficiency of cooling system 100 may be improved through the use of out-of-phase vibrational motion for the two sides of actuator 120. Consequently, performance of devices incorporating the cooling system 100 may be improved. Further, cooling system 100 may be usable in other applications (e.g. with or without heat-generating structure 102) in which high fluid flows and/or velocities are desired.

Cavities 170 in flow chamber 140/150 may provide additional benefits for operation of cooling system 100. As previously discussed, pressure in top chamber 140 increases during the upstroke of the tip of actuator 120. The presence of cavities 170 mitigates the pressure increase. Cavities 170 are configured such that sufficient pressure is developed to drive fluid from top chamber 140 to bottom chamber 150. This is shown by the arrows indicating the motion of fluid in FIGS. 1D, 1E (right/upstroke portion of actuator 120), and 1F (left/upstroke portion of actuator 120). However, because the pressure has been reduced somewhat, the pressure against which the tips 121 of actuator 120 is driven in the upstroke has been reduced over that of a top chamber that does not include cavities 170 (e.g. a top chamber having a constant height indicated by the dotted lines in FIGS. 1A, 1C and 1E). In an embodiment including cavities 170, therefore, the power required to drive actuator 120 in the upstroke may be reduced. Thus, in addition to the benefits discussed previously, the power required to drive actuator 120 may be reduced while the fluid flow and velocity are maintained.

Similarly, the edge vent (the distance, d, between tip 121 of actuator 120 and the outer wall of flow chamber 140/150) may be used to tailor the pressure in top chamber 140 and bottom chamber 150. In general, a smaller edge vent (lower d) results in a higher pressure in top cavity 140, while a larger edge vent (higher d) results in a lower pressure in top cavity 140. Although the pressure changes, there may be limited change in the flow over a range of edge vent sizes. For example, in the ranges discussed herein (e.g. at least one hundred micrometers and not more than one thousand micrometers, or at least three hundred micrometers and not more than eight hundred micrometers) the pressure actuator 120 is driven against decreases for increasing size of the edge vent substantially without reducing the flow. Thus, the power consumed by driving actuator 120 may be reduced. The edge vent size may be tailored in a number of ways. Flow chamber 140/150 may be made longer (e.g. C increased) without increasing the length of actuator 120, actuator 120 may be made shorter (e.g. L decreased), and/or actuator 120 and anchor 160 may be made shorter (L and a decreased). Increasing the length of flow chamber 140/150 increases the edge vent size without changing the structural resonance of actuator 120. Decreasing the length of actuator 120 and decreasing the length of anchor 160 may increase the edge vent size while maintaining the structural resonant frequency (i.e. L and a decrease such that the free, cantilevered portion of actuator 120 remains the same length).

Figure 2:
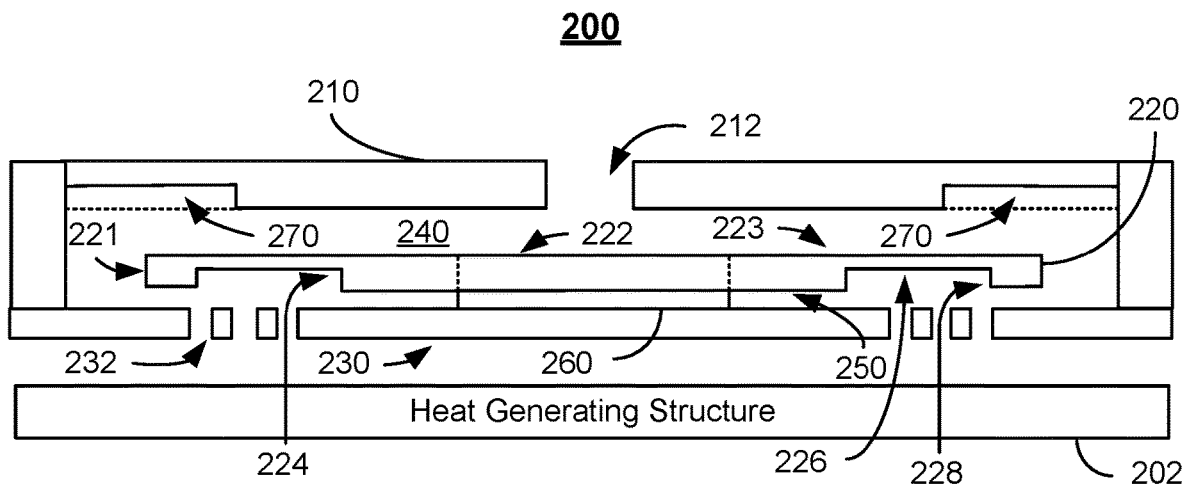
FIG. 2 depicts an embodiment of an active cooling system including an actuator and cavities in the upper chamber.

FIG. 2 depicts embodiments of active cooling system 200 including a centrally anchored, engineered actuator. FIG. 2 is not to scale. For simplicity, only portions of cooling system 200 are shown. Cooling system 200 is analogous to cooling system 100. Consequently, analogous components have similar labels. For example, cooling system 200 is used in conjunction with heat-generating structure 202, which is analogous to heat-generating structure 102. Cooling system 200 includes top plate 210 having vent 212, actuator 220, orifice plate 230 including orifices 232, top chamber 240 having a gap, bottom chamber 250 having a gap, flow chamber 240/250, anchor (i.e. support structure) 260, and cavities 270 that are analogous to top plate 110 having vent 112, actuator 120, orifice plate 130 including orifices 132, top chamber 140 having gap 142, bottom chamber 150 having gap 152, flow chamber 140/150, anchor (i.e. support structure) 160, and cavities 170, respectively. Thus, actuator 220 is centrally supported by anchor 260 such that at least a portion of the perimeter of actuator 220 is free to vibrate.

Actuator 220 includes an anchored region 222 and cantilevered arms 223 that are analogous to anchored region 122 and cantilevered arms 123. The separation between anchored region 222 and cantilevered arms 223 is indicated by a dotted line. Each cantilevered arm 223 ends in tip 221. Anchored region 222 is supported (e.g. held in place) in cooling system 200 by anchor 260. Cantilevered arms 223 undergo vibrational motion in response to actuator 220 being actuated.

Actuator 220 may also be considered an engineered actuator because each cantilevered arm 223 includes step region 224, extension region 226, and outer region 228. In the embodiment shown in FIG. 2, anchored region 222 is centrally located. Step region 224 extends outward (toward tip 121) from anchored region 222. Extension region 226 extends outward from step region 224. Outer region 228 extends outward from extension region 226. In other embodiments, anchored region 222 may be at one edge of the actuator and outer region 228 at the opposing edge. In such embodiments, the actuator is edge anchored.

Extension region 226 has a thickness (extension thickness) that is less than the thickness of step region 224 (step thickness) and less than the thickness of outer region 228 (outer thickness). Thus, extension region 226 may be viewed as recessed. Extension region 226 may also be seen as providing a larger bottom chamber 250. In some embodiments, the outer thickness of outer region 228 is the same as the step thickness of step region 224. In some embodiments, the outer thickness of outer region 228 is different from the step thickness of step region 224. Thus, outer region 228 may be thicker than extension region 224 or thinner than extension region 224 in various embodiments. The outer thickness of outer region 228 and the step thickness of step region 224 are each at least three hundred twenty and not more than three hundred sixty micrometers. In other embodiments, other thicknesses are possible. In some embodiments, the step (difference in step region thickness and extension region thickness) is at least fifty micrometers and not more than two hundred micrometers. In some embodiments, the outer step (difference in outer region thickness and extension region thickness) is at least fifty micrometers and not more than two hundred micrometers. Outer region 228 may have a width (from the inner edge of step region 226 to tip 221) of at least one hundred micrometers and not more than three hundred micrometers. Extension region 226 has a length (from the step region 224 to outer region 228) of at least 0.5 millimeter and not more than 1.5 millimeters in some embodiments. In some embodiments, outer region 228 has a higher mass per unit length (in the direction from anchored region 222 toward tip 221) than extension region 226. This difference in mass may be due to the larger size/thickness of outer region 228, a difference in density between portions of actuator 220, and/or another mechanism.

Cooling system 200 operates in an analogous manner to cooling system 100. Cooling system 200 thus shares the benefits of cooling system 100. Thus, performance of a device employing cooling system 200 may be improved. As for cooling system 100, the presence of cavities 270 may further reduce the pressure against which actuator 220 works against on the upstroke of each cantilevered arm 223. Thus, the power consumed may be reduced.

Use of engineered actuator 220 may further improve performance of cooling system 200. Extension region 226 is thinner than step region 224 and outer region 228. This results in a cavity in the bottom of actuator 220 corresponding to extension region 226. The presence of this cavity aids in improving the efficiency of cooling system 200. In a manner analogous to that discussed with respect to FIGS. 1A-1F, a cantilevered arm 223 vibrates towards top plate 210 in an upstroke and away from top plate 210 in a downstroke. Cantilevered arms 223 may vibrate in-phase or out-of-phase. When a cantilevered arm 223 moves toward top plate 210, higher pressure fluid in top chamber 240 resists the motion of cantilevered arm 223. However, the presence of cavity 270 mitigates the resistance against the upward motion of cantilevered arm 223. Suction in bottom chamber 250 also resists the upward motion of cantilevered arm 223 during the upstroke. In the downstroke of cantilevered arm 223, increased pressure in the bottom chamber 250 and suction in top chamber 240 resist the downward motion of cantilevered arm 223. However, the presence of the cavity in cantilevered arm 223 corresponding to extension region 226 mitigates the suction in bottom chamber 250 during an upstroke. The cavity formed by extension region 226 also reduces the increase in pressure in bottom chamber 250 during a downstroke. Similarly, cavity 270 may reduce the suction from top chamber 240. Because the suction and pressure increase are reduced in magnitude for both the upstroke and the downstroke, cantilevered arms 223 may more readily move through the fluid than cantilevered arms 123. This may be achieved while substantially maintaining a sufficiently high pressure in top chamber 240 to drive the fluid flow through cooling system 200. Thus, efficiency may be improved.

Moreover, the presence of outer region 228 may improve the ability of cantilevered arm 223 to move through the fluid being driven through cooling system 200. Outer region 228 has a higher mass and thus a higher momentum. Consequently, outer region 228 may improve the ability of cantilevered arms 223 to move through the fluid being driven through cooling system 200. The magnitude of the deflection of cantilevered arm 223 may also be increased. These benefits may be achieved while maintaining the stiffness of cantilevered arms 223 through the use of thicker step region 224. Thus, efficiency of cooling system 200 may again be improved.

The improvement may also be understood as follows. Q can be considered a measure of the efficiency of actuator 220. The value of Q is determined at least in part by the interaction of actuator 220 with the surrounding fluid (i.e. a gas such as air or a liquid), structural losses within actuator 220, the anchoring of actuator 220, and/or other characteristics. Q can be considered to be defined by $\delta_{res}=Q*\delta_{static}$, where $\delta_{res}$ is the deflection at resonance and $\delta_{static}$ is the corresponding static deflection. The higher the value of Q, the higher the deflection at resonance and the more slowly the deflection decays (i.e. the lower the damping). Because of its engineered configuration, actuator 220 is better able to move through the surrounding fluid. Consequently, a higher static deflection may be achieved, the deflection may be better amplified at resonance, the power consumed to drive actuator 220 may be reduced, and the deflection may die out more slowly (i.e. be subject to reduced damping). Q of actuator 220 and, therefore, efficiency of cooling system 200 may thus be enhanced by the configuration of actuator 220.

Use of engineered actuator 220 may also improve reliability of cooling system 200. Because of its reduced thickness, extension region 226 may be less stiff than outer region 228 and step region 224. This reduction in stiffness reduces the stress on actuator 220 during vibration. Actuator 220 may be less likely to fail. Reliability of cooling system 200 may, therefore, be improved.

Thus, using cooling system 100 and/or cooling system 200, performance may be improved not only over a conventional cooling system (not shown) having a different configuration, but also over a cooling system in which cavities 170/270 are not present and/or in which an actuator is not engineered as actuator 220. This may be further seen in FIGS. 3, 4A and 4B.

Figure 3:
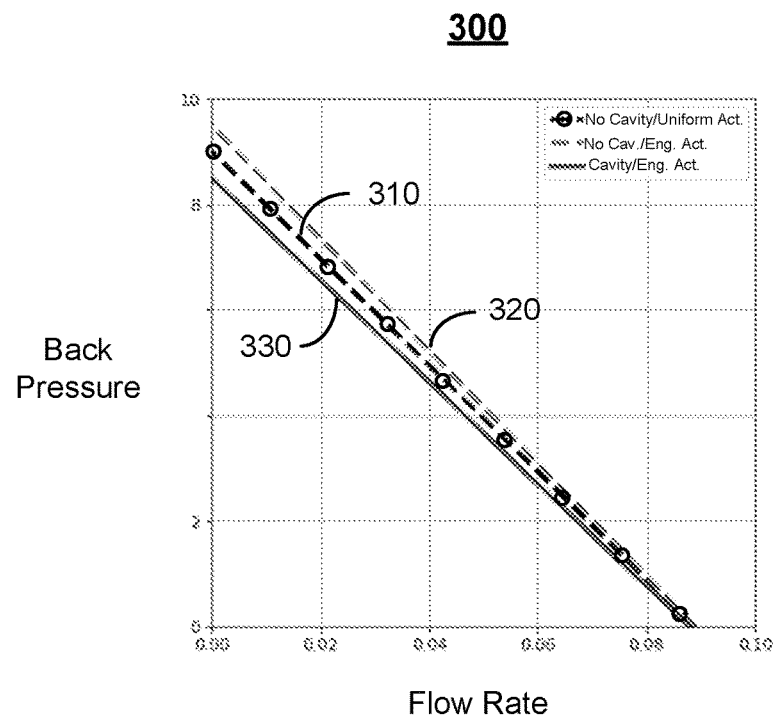
FIG. 3 depicts back pressure versus flow for embodiments of active cooling systems including centrally anchored actuators.

FIG. 3 is a graph 300 depicting back pressure versus flow for embodiments of active cooling systems including centrally anchored actuators. Back pressure is the pressure at which flow through a cooling system goes to zero. Curve 310 indicates the backpressure versus flow rate for a cooling system similar to system 100, but which has a uniform flow chamber (no cavities) and a uniform actuator (analogous to actuator 120). Curve 320 indicates the backpressure versus flow rate for a cooling system similar to system 200, which has a uniform flow chamber (no cavities 170/270) and an engineered actuator (analogous to actuator 220). Curve 330 indicates the backpressure versus flow rate for a cooling system similar to cooling system 200, which has cavities (e.g. cavities 270) and an engineered actuator (analogous to actuator 200). As indicated by FIG. 3, the flow rates, particularly the maximum flow rate at zero backpressure, are substantially the same for curves 310, 320, and 330. However, the backpressure may be reduced without significantly affecting the flow rate. The difference between curves 310 and 320 indicates that use of an engineered actuator such as actuator 220 may reduce the back pressure with little or no effect on the flow rate. As indicated by the difference between curves 320 (no cavity, engineered actuator) and 330 (cavity, engineered actuator), the presence of cavities 170 and/or 270 may reduce the backpressure with little to no effect on the flow rate. Further, changes in the size of cavities 170 and/or 270 may be used to tailor the reduction in backpressure. For example, the area (e.g. length and width) of the cavities may be used to change the reduction in the backpressure. Thus, backpressure as well as the power used to operate cooling systems 100 and 200 may be reduced by the presence of cavities 170 and/or 270 as well as through the use of engineered actuator 220. In addition, the backpressure may be at least partially decoupled from the flow rate.

Figure 4A:
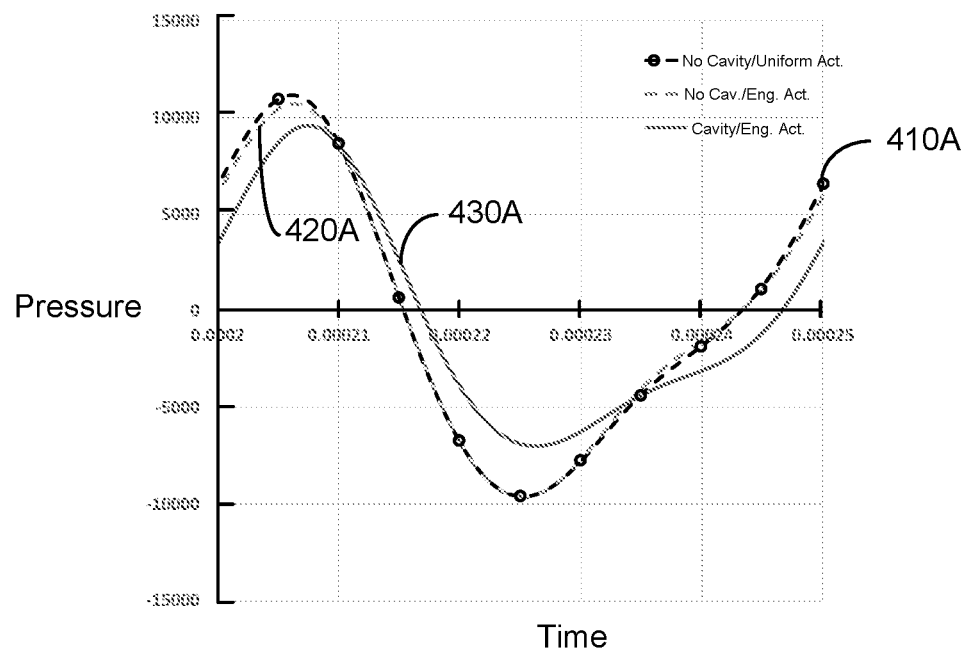
FIGS. 4A-4B are graphs depicting behavior of embodiments of active cooling systems including centrally anchored actuators and cavities.
Figure 4B:
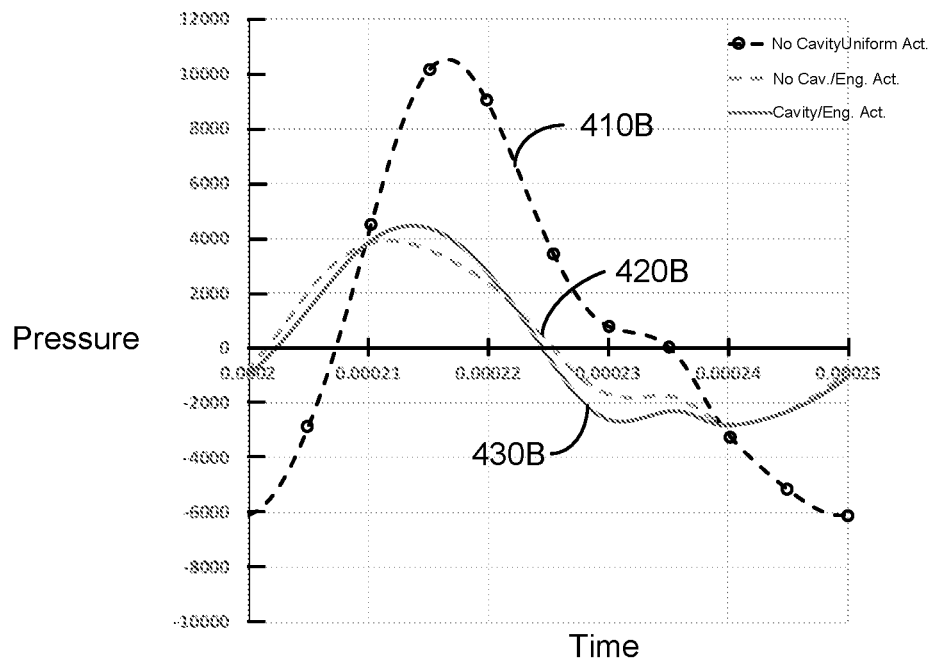

FIGS. 4A and 4B are graphs 400A and 400B, respectively, depicting behavior of embodiments of active cooling systems. FIG. 4A depicts the pressure in the top chamber (e.g. top chamber 140 and/or 240) of the flow chamber versus time through a cycle of vibration of the actuator (e.g. actuator 120 and/or 220). FIG. 4B depicts the pressure in the bottom chamber (e.g. bottom chamber 150 and/or 250) of the flow chamber versus time through a cycle of vibration of the actuator (e.g. actuator 120 and/or 220).

In FIG. 4A, curve 410A indicates the pressure in the top chamber versus time for a cooling system similar to system 100, but which has a uniform flow chamber (no cavities) and a uniform actuator (analogous to actuator 120). Curve 420A indicates the pressure in the top chamber versus time for a cooling system similar to system 200, but which has a uniform flow chamber (no cavities 170/270) and an engineered actuator (analogous to actuator 220). Curve 430A indicates the pressure in the top chamber versus time for a cooling system similar to cooling system 200, which has cavities (e.g. cavities 270) and an engineered actuator (analogous to actuator 200). Thus, one cycle (e.g. actuator 120 varies between the positions shown in FIGS. 1C and 1D or between the positions shown in FIGS. 1E and 1F) is shown. Use of an engineered actuator having a cavity in the surface closest to the orifice plate (e.g. actuator 220) does not significantly alter the pressure in the top chamber against which the actuator works. Thus, curves 410A and 420A are very similar. However, the introduction of cavities (e.g. cavities 170 and/or 270) mitigates the pressure changes in the top chamber (e.g. top chamber 140 and/or 240). This can be seen by the difference between curve 430A and curves 410A and 420A. Because of the presence of the cavities, the pressure against which an actuator is driven is reduced in magnitude. Thus, the actuator may be driven at lower power.

In FIG. 4B, curve 410B indicates the pressure in the bottom chamber versus time for a cooling system similar to system 100, but which has a uniform flow chamber (no cavities) and a uniform actuator (analogous to actuator 120). Curve 420B indicates the pressure in the bottom chamber versus time for a cooling system similar to system 200, but which has a uniform flow chamber (no cavities 170/270) and an engineered actuator (analogous to actuator 220). Curve 430B indicates the pressure in the bottom chamber versus time for a cooling system similar to cooling system 200, which has cavities (e.g. cavities 270) and an engineered actuator (analogous to actuator 200). Thus, one cycle (e.g. actuator 120 varies between the positions shown in FIGS. 1C and 1D or between the positions shown in FIGS. 1E and 1F) is shown. Use of an engineered actuator having a cavity in the surface closest to the orifice plate (e.g. actuator 220) significantly reduces the pressure in the bottom chamber (e.g. bottom chamber 150 and/or 250) against which the actuator works. Thus, a significant reduction in the magnitude of the pressure can be seen between curves 410B and 420B. However, the introduction of cavities (e.g. cavities 170 and/or 270) does not significantly change the pressure in the bottom chamber. Thus, curve 430B is very similar to curve 420B. Because of the use of the engineered actuator having a cavity formed by the extension region, the pressure against which an actuator is driven is reduced in magnitude. Thus, the actuator may be driven at lower power.

As can be seen in FIGS. 3, 4A, and 4B, fluid flow through flow chamber(s) 140/150 and/or 240/250 may be maintained while reducing the pressure within the chambers 140, 150, 240, and/or 250. Thus, a high fluid flow volume may be provided while reducing the operating power of cooling systems 100 and/or 200. Thus, performance of cooling systems 100 and/or 200 may be improved not only over conventional cooling systems, but also a cooling system which does not use cavities and/or engineered actuators.

Figure 5:
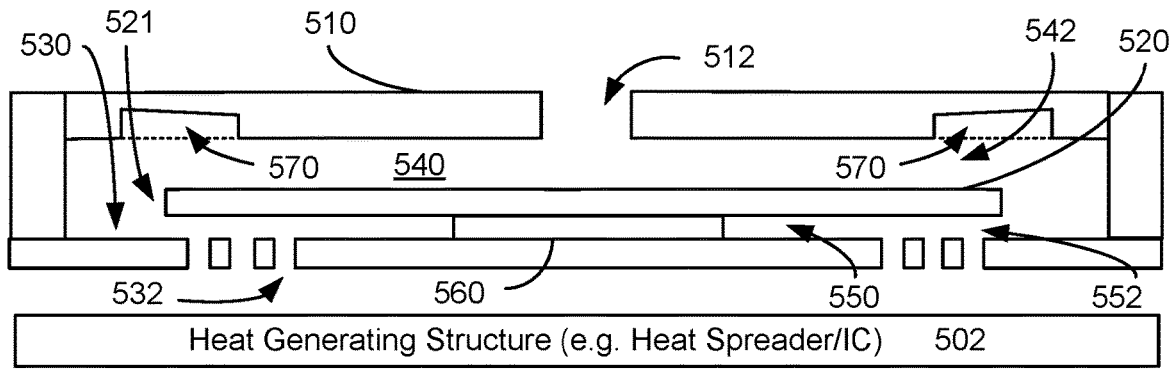
FIG. 5 depicts an embodiment of an active cooling system including an actuator and cavities in the upper chamber.

FIG. 5 depicts an embodiment of an active cooling system 500 including an actuator and cavities in the upper chamber. FIG. 5 is not to scale. For simplicity, only portions of cooling system 500 are shown. Cooling system 500 is analogous to cooling system(s) 100 and/or 200. Consequently, analogous components have similar labels. For example, cooling system 500 is used in conjunction with heat-generating structure 502, which is analogous to heat-generating structure 102.

Cooling system 500 includes top plate 510 having vent 512, actuator 520, orifice plate 530 including orifices 532, top chamber 540 having a gap, bottom chamber 550 having a gap, flow chamber 540/550, anchor (i.e. support structure) 560, and cavities 570 that are analogous to top plate 110 having vent 112, actuator 220, orifice plate 130 including orifices 132, top chamber 140 having gap 142, bottom chamber 150 having gap 152, flow chamber 140/150, anchor (i.e. support structure) 160, and cavities 170, respectively. Thus, actuator 520 is centrally supported by anchor 560 such that at least a portion of the perimeter of actuator 520 is free to vibrate. Although not labeled in FIG. 5, anchor 560 extends along the axis of actuator 520 such that actuator 520 includes cantilevered arms and a central, anchored region analogous to actuator 520. In some embodiments, actuator 520 may be engineered in a manner analogous to actuator 220. Thus, actuator 520 may include an anchored region and cantilevered arms including step region, extension region and outer regions analogous to anchored region 222, cantilevered arms 223, step region 224, extension region 226 and outer region 228, respectively. In some embodiments, cantilevered arms of actuator 520 are driven in-phase. In some embodiments, cantilevered arms of actuator 520 are driven out-of-phase. In other embodiments, anchor 560 is only near the center portion of actuator 520. Cooling system 500 operates in a manner analogous to cooling systems 100 and/or 200.

Flow chamber 540/550 includes cavities 570. In the embodiment shown, cavities 570 have been moved closer to the center of actuator 520. In addition, the depth of cavities 570 varies with distance from the center axis of actuator 520. Thus, the cavities may not terminate at the outer wall of the flow chamber in some embodiments. In some embodiments, cavities 570 may have a shape other than rectangular. Thus, the location, depth, shape, and/or other properties of cavities 570 may vary. However, cavities 570 may still be configured to mitigate the pressure in top chamber 540 in a manner analogous to that described in the context of FIGS. 3-4B.

Cooling system 500 thus shares the benefits of cooling system(s) 100 and/or 200. Thus, performance of a device employing cooling system 500 may be improved. In a manner analogous to cooling system(s) 100 and/or 200, cavities 570 may further reduce the pressure against which actuator 520 works against. Thus, the power consumed may be reduced. Further, if an engineered actuator analogous to actuator 220 is used in place of uniform actuator 520, further benefits of system 200 may be achieved. Thus, performance, reliability and power consumption may be improved.

Figure 6A:
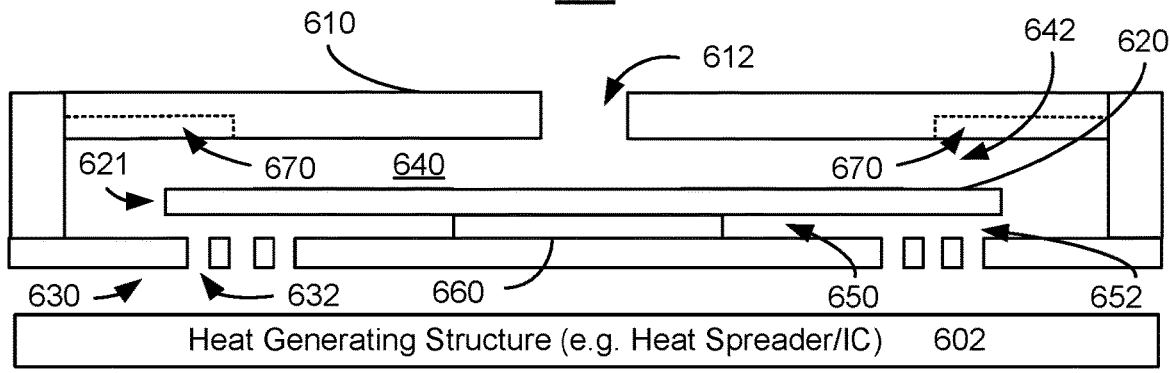
FIGS. 6A-6B depict an embodiment of an active cooling system including an actuator and cavities in the upper chamber.
Figure 6B:
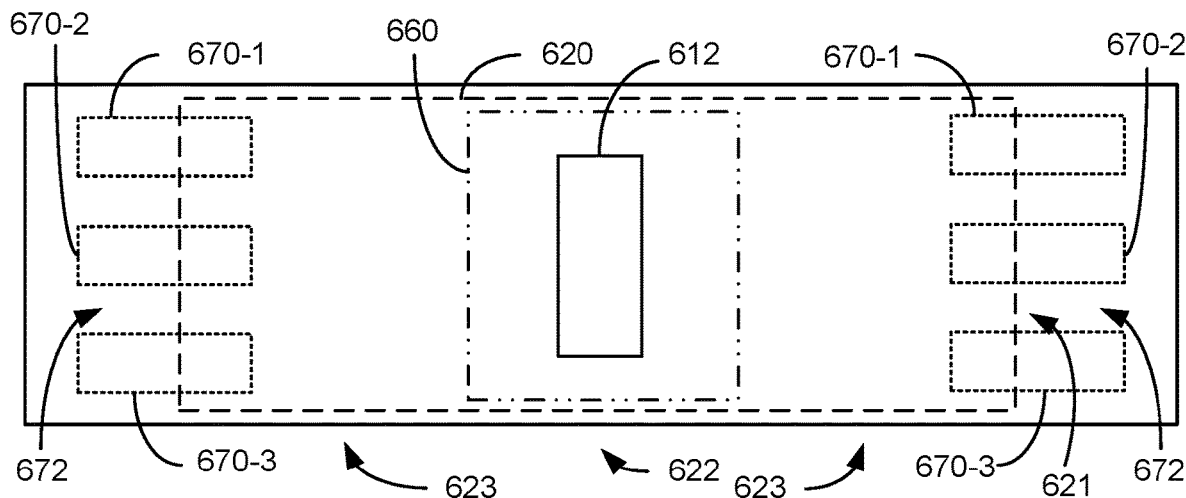

FIGS. 6A-6B depict an embodiment of active cooling system 600 including an actuator and cavities in the upper chamber. FIG. 6A is a side view of cooling system 600, while FIG. 6B is a plan view of cooling system 600. FIGS. 6A-6B are not to scale. For simplicity, only portions of cooling system 600 are shown. Cooling system 600 is analogous to cooling system(s) 100, 200, and/or 500. Consequently, analogous components have similar labels. For example, cooling system 600 is used in conjunction with heat-generating structure 602, which is analogous to heat-generating structure 102.

Cooling system 600 includes top plate 610 having vent 612, actuator 620, orifice plate 630 including orifices 632, top chamber 640 having a gap, bottom chamber 650 having a gap, flow chamber 640/650, anchor (i.e. support structure) 660, and cavities 670-1, 670-2, and 670-3 (collectively or generically cavities 670) that are analogous to top plate 110 having vent 112, actuator 220, orifice plate 130 including orifices 132, top chamber 140 having gap 142, bottom chamber 150 having gap 152, flow chamber 140/150, anchor (i.e. support structure) 160, and cavities 170, respectively. Thus, actuator 620 is centrally supported by anchor 660 such that at least a portion of the perimeter of actuator 620 is free to vibrate. Although not labeled in FIGS. 6A-6B, anchor 660 extends along the axis of actuator 620 such that actuator 620 includes cantilevered arms and a central, anchored region analogous to actuator 620. In some embodiments, actuator 620 may be engineered in a manner analogous to actuator 220. Thus, actuator 620 may include an anchored region and cantilevered arms including step region, extension region and outer regions analogous to anchored region 222, cantilevered arms 223, step region 224, extension region 226 and outer region 228, respectively. In some embodiments, cantilevered arms of actuator 620 are driven in-phase. In some embodiments, cantilevered arms of actuator 620 are driven out-of-phase. In other embodiments, anchor 660 is only near the center portion of actuator 620. Cooling system 600 operates in a manner analogous to cooling systems 100, 200 and/or 500.

Flow chamber 640/650 includes cavities 670. In the embodiment shown, cavities 670-1, 670-2 and 670-3 and the spaces 672 (of which only two are labeled in FIGS. 6A-6B) between cavities 670-1, 670-2 and 670-3 occupy approximately the same region of top plate 610 as cavities 170 occupy of top plates 110 in cooling system 100. However, the spaces 672 between cavities 670-1, 670-2 and 670-3 are thicker (e.g. are not recessed or recessed a smaller amount than cavities 670-1, 670-2 and 670-3. Cavities 670 may still be configured to mitigate the pressure in top chamber 640 in a manner analogous to that described in the context of FIGS. 3-4B. In addition, the spacers 672 may mitigate the reduction in stiffness of top plate 610 that cavities 670 introduce. Because top plate 610 may be stiffer, vibrations due to the motion of actuator 610 may be reduced.

Cooling system 600 thus shares the benefits of cooling system(s) 100, 200, and/or 500. Thus, performance of a device employing cooling system 600 may be improved. In a manner analogous to cooling system(s) 100, 200, and/or 500, cavities 670 may further reduce the pressure against which actuator 620 works against. Thus, the power consumed may be reduced. Further, if an engineered actuator analogous to actuator 220 is used in place of uniform actuator 520, further benefits of system 200 may be achieved. Vibrations may also be reduced because of the enhanced stiffness of top plate 610. Thus, performance, reliability and power consumption may be improved.

Figure 7A:
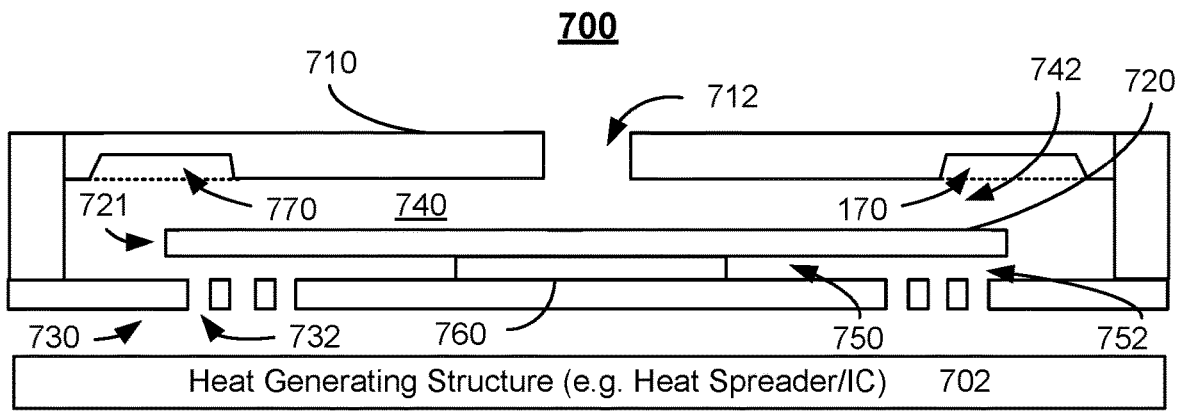
FIGS. 7A-7B depict an embodiment of an active cooling system including an actuator and cavities in the upper chamber.
Figure 7B:
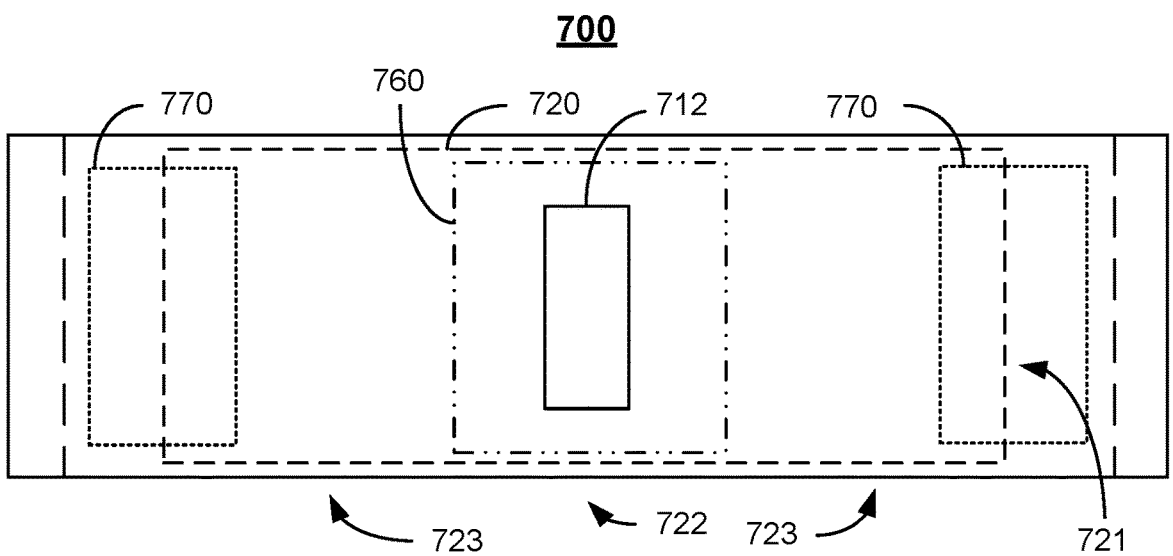

FIGS. 7A-7B depict an embodiment of active cooling system 700 including an actuator and cavities in the upper chamber. FIG. 7A is a side view of cooling system 700, while FIG. 7B is a plan view of cooling system 700. FIGS. 7A-7B are not to scale. For simplicity, only portions of cooling system 700 are shown. Cooling system 700 is analogous to cooling system(s) 100, 200, 500 and/or 600. Consequently, analogous components have similar labels. For example, cooling system 700 is used in conjunction with heat-generating structure 702, which is analogous to heat-generating structure 102.

Cooling system 700 includes top plate 710 having vent 712, actuator 720, orifice plate 730 including orifices 732, top chamber 740 having a gap, bottom chamber 750 having a gap, flow chamber 740/750, anchor (i.e. support structure) 760, and cavities 770 that are analogous to top plate 110 having vent 112, actuator 220, orifice plate 130 including orifices 132, top chamber 140 having gap 142, bottom chamber 150 having gap 152, flow chamber 140/150, anchor (i.e. support structure) 160, and cavities 170, respectively. Thus, actuator 720 is centrally supported by anchor 760 such that at least a portion of the perimeter of actuator 720 is free to vibrate. Although not labeled in FIG. 7, anchor 760 extends along the axis of actuator 720 such that actuator 720 includes cantilevered arms and a central, anchored region analogous to actuator 720. In some embodiments, actuator 720 may be engineered in a manner analogous to actuator 220. Thus, actuator 720 may include an anchored region and cantilevered arms including step region, extension region and outer regions analogous to anchored region 222, cantilevered arms 223, step region 224, extension region 226 and outer region 228, respectively. In some embodiments, cantilevered arms of actuator 720 are driven in-phase. In some embodiments, cantilevered arms of actuator 720 are driven out-of-phase. In other embodiments, anchor 760 is only near the center portion of actuator 720. Cooling system 700 operates in a manner analogous to cooling systems 100, 200, 500, and/or 600.

Flow chamber 740/750 includes cavities 770. In the embodiment shown, cavities 770 have been moved closer to the center of actuator 720. Thus, cavities 770 may not terminate at the outer wall of the flow chamber in some embodiments. In some embodiments, cavities 770 may have a shape other than rectangular. In addition, the sidewalls of cavities 770 are not perpendicular to the bottom surface of top plate 710. Thus, the location, depth, shape, and/or other properties of cavities 770 may vary. Cavities 770 may still be configured to mitigate the pressure in top chamber 740 in a manner analogous to that described in the context of FIGS. 3-4B.

Cooling system 700 thus shares the benefits of cooling system(s) 100, 200, 500, and/or 600. Thus, performance of a device employing cooling system 700 may be improved. In a manner analogous to cooling system(s) 100, 200, 500, and/or 600, cavities 770 may further reduce the pressure against which actuator 720 works against. Thus, the power consumed may be reduced. Further, if an engineered actuator analogous to actuator 720 is used in place of uniform actuator 520, further benefits of system 200 may be achieved. Thus, performance, reliability and power consumption may be improved.

Figure 8:
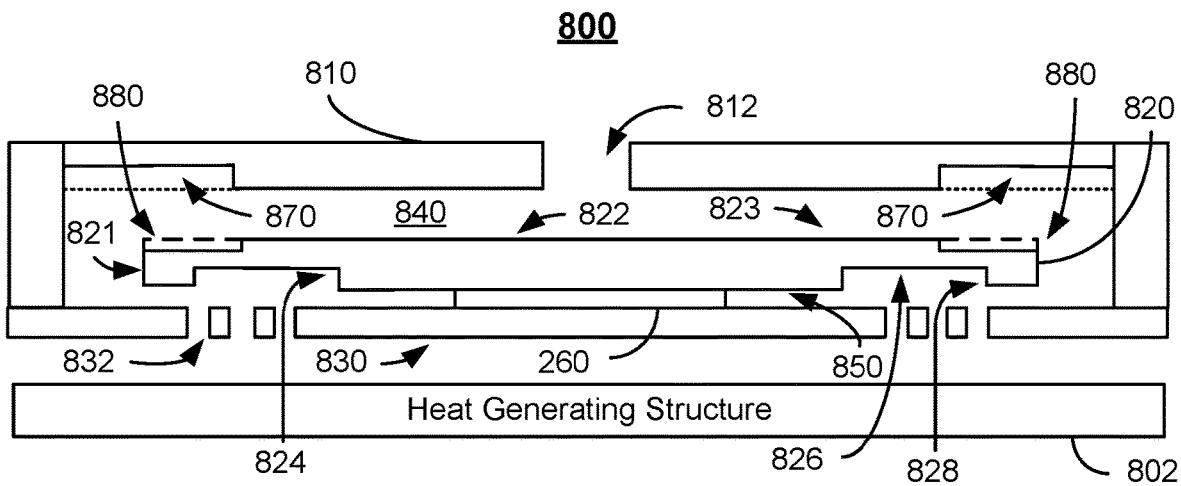
FIG. 8 depicts an embodiment of an active cooling system including an actuator and cavities in the upper chamber.

FIG. 8 depicts an embodiment of active cooling system 800 including an actuator and cavities in the upper chamber. FIG. 8 is not to scale. For simplicity, only portions of cooling system 800 are shown. Cooling system 800 is analogous to cooling system(s) 100, 200, 500, 600 and/or 700. Consequently, analogous components have similar labels. For example, cooling system 800 is used in conjunction with heat-generating structure 802, which is analogous to heat-generating structure 102.

Cooling system 800 includes top plate 810 having vent 812, actuator 820, orifice plate 830 including orifices 832, top chamber 840 having a gap, bottom chamber 850 having a gap, flow chamber 840/850, anchor (i.e. support structure) 860, and cavities 870 that are analogous to top plate 110 having vent 112, actuator 220, orifice plate 130 including orifices 132, top chamber 140 having gap 142, bottom chamber 150 having gap 152, flow chamber 140/150, anchor (i.e. support structure) 160, and cavities 170, respectively. Thus, actuator 820 is centrally supported by anchor 860 such that at least a portion of the perimeter of actuator 820 is free to vibrate. Although not labeled in FIG. 8, anchor 860 extends along the axis of actuator 820 such that actuator 820 includes cantilevered arms and a central, anchored region analogous to actuator 820. In the embodiment shown, actuator 820 may be engineered in a manner analogous to actuator 220. Thus, actuator 820 includes anchored region 822, cantilevered arms 823, step region 824, extension region 826 and outer region 828 analogous to anchored region 222, cantilevered arms 223, step region 224, extension region 226 and outer region 228, respectively. In some embodiments, actuator 800 may be configured in another manner. For example, in some embodiments, actuator 820 may be a simple actuator analogous to actuator 120. In some embodiments, cantilevered arms of actuator 820 are driven in-phase. In some embodiments, cantilevered arms of actuator 820 are driven out-of-phase. In other embodiments, anchor 860 is only near the center portion of actuator 820. Cooling system 800 operates in a manner analogous to cooling systems 100, 200, 500, 600, and/or 700.

Actuator 820 also includes recessed regions 880 near tips 821. Recessed regions 880 function in a manner analogous to cavity 870. Thus, recessed regions 880 may reduce the pressure against which actuator 820 has to work when driving fluid through flow chamber 840/850. Thus, power consumption may be reduced.

Cooling system 800 shares the benefits of cooling system(s) 100, 200, 500, 600, and/or 700. Thus, performance of a device employing cooling system 800 may be improved. In a manner analogous to cooling system(s) 100, 200, 500, 600 and/or 700, cavities 870 and recessed regions 880 may further reduce the pressure against which actuator 820 works against. Thus, the power consumed may be reduced. Further, because engineered actuator 820 analogous to actuator 220 is used in place of a uniform actuator, further benefits of system 200 may be achieved for system 800.

Figure 9:
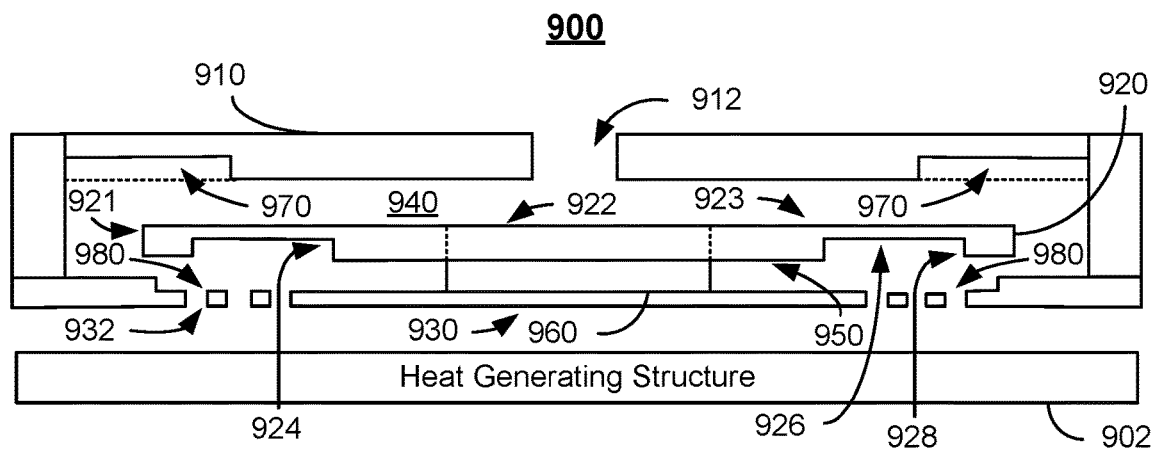
FIG. 9 depicts an embodiment of an active cooling system including an actuator and cavities in the upper chamber.

FIG. 9 depicts an embodiment of active cooling system 900 including an actuator and cavities in the upper chamber. FIG. 9 is not to scale. For simplicity, only portions of cooling system 900 are shown. Cooling system 900 is analogous to cooling system(s) 100, 200, 500, 600, 700, and/or 800. Consequently, analogous components have similar labels. For example, cooling system 900 is used in conjunction with heat-generating structure 902, which is analogous to heat-generating structure 102.

Cooling system 900 includes top plate 910 having vent 912, actuator 920, orifice plate 930 including orifices 932, top chamber 940 having a gap, bottom chamber 950 having a gap, flow chamber 940/950, anchor (i.e. support structure) 960, and cavities 970 that are analogous to top plate 110 having vent 112, actuator 220, orifice plate 130 including orifices 132, top chamber 140 having gap 142, bottom chamber 150 having gap 152, flow chamber 140/150, anchor (i.e. support structure) 160, and cavities 170, respectively. Thus, actuator 920 is centrally supported by anchor 960 such that at least a portion of the perimeter of actuator 920 is free to vibrate. Although not labeled in FIG. 9, anchor 960 extends along the axis of actuator 920 such that actuator 920 includes cantilevered arms and a central, anchored region analogous to actuator 220. In the embodiment shown, actuator 920 may be engineered in a manner analogous to actuator 220. Thus, actuator 920 includes anchored region 922, cantilevered arms 923, step region 924, extension region 926 and outer region 928 analogous to anchored region 222, cantilevered arms 223, step region 224, extension region 226 and outer region 228, respectively. In some embodiments, actuator 800 may be configured in another manner. For example, in some embodiments, actuator 920 may be a simple actuator analogous to actuator 120. In some embodiments, cantilevered arms of actuator 920 are driven in-phase. In some embodiments, cantilevered arms of actuator 920 are driven out-of-phase. In other embodiments, anchor 960 is only near the center portion of actuator 920. Cooling system 900 operates in a manner analogous to cooling systems 100, 200, 500, 600, 700, and/or 800.

Orifice plate 930 includes recessed regions, or cavities, 980. System 900 is described as having multiple cavities 980. In some embodiments, a single cavity 980 may be present. In some such embodiments, the cavity extends around anchor 960. Although shown as having vertical sidewalls and extending to anchor 960, cavities 980 in orifice plate 930 (and thus in bottom chamber 950) may be used to control the pressure in flow chamber 940/950. Cavities 980 may reduce the pressure against which actuator 920 has to work when driving fluid through flow chamber 940/950. Thus, power consumption may be reduced. Further, recessed region 980 may be used to control the gap between orifice plate 930 and actuator 920. Consequently, the backflow of fluid through orifices 932 into bottom chamber 950 may be further reduced.

Cooling system 900 shares the benefits of cooling system(s) 100, 200, 500, 600, 700, and/or 800. Thus, performance of a device employing cooling system 900 may be improved. In a manner analogous to cooling system(s) 100, 200, 500, 600, 700 and/or 800, cavities 970 and recessed regions 980 may further reduce the pressure against which actuator 920 works against. Backflow or fluid through orifices 932 may also be controlled. Thus, the power consumed may be reduced. Further, because engineered actuator 920 analogous to actuator 220 is used in place of a uniform actuator, further benefits of system 200 may be achieved for system 900.

Figure 10A:
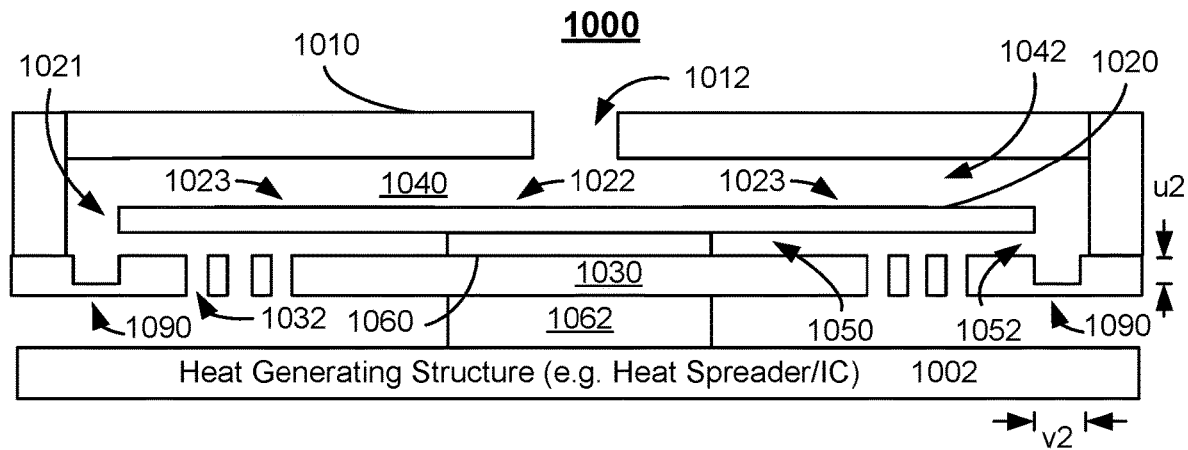
FIGS. 10A-10B depict an embodiment of an active cooling system including an actuator and cavities in the lower chamber.
Figure 10B:
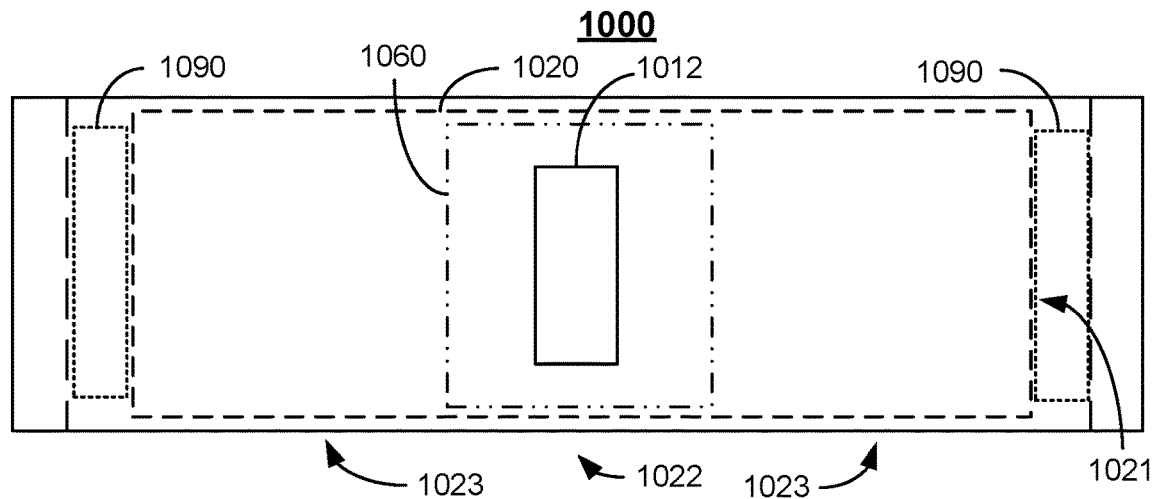

FIGS. 10A-10B depicts an embodiment of active cooling system 1000 including an actuator and cavities in the lower chamber. FIG. 10A is a side view of cooling system 1000, while FIG. 10B is a plan view of cooling system 1000. FIGS. 10A-10B are not to scale. For simplicity, only portions of cooling system 1000 are shown. Cooling system 1000 is analogous to cooling system(s) 100, 200, 500, 600, 700, 800, and/or 900. Consequently, analogous components have similar labels. For example, cooling system 1000 is used in conjunction with heat-generating structure 1002, which is analogous to heat-generating structure 102.

Cooling system 1000 includes top plate 1010 having vent 1012, actuator 1020, orifice plate 1030 including orifices 1032, top chamber 1040 having gap 1042, bottom chamber 1050 having gap 1052, flow chamber 1040/1050, anchor (i.e. support structure) 1060 that are analogous to top plate 110 having vent 112, actuator 120, orifice plate 130 including orifices 132, top chamber 140 having gap 142, bottom chamber 150 having gap 152, flow chamber 140/150, and anchor (i.e. support structure) 160, respectively. Also shown is pedestal 1062 that may be used to physically and/or thermally couple cooling system 1000 to heat-generating structure 1002.

Actuator 1020 is centrally supported by anchor 1060 such that at least a portion of the perimeter of actuator 1020 is free to vibrate. Anchor 1060 extends along the axis of actuator 1020 such that actuator 1020 includes cantilevered arms 1023 and a central, anchored region 1022 analogous to actuator 1020. In other embodiments, anchor 1060 is only near the center portion of actuator 1020. In some embodiments, actuator 1020 may have another configuration. For example, actuator 1020 may be engineered in a manner analogous to actuator 220. In some embodiments, cantilevered arms 1023 of actuator 1020 are driven in-phase. In some embodiments, cantilevered arms of actuator 1020 are driven out-of-phase. Cooling system 1000 operates in a manner analogous to cooling systems 100, 200, 500, 600, 700, 800, and/or 900.

Flow chamber 1040/1050 includes cavities 1090 in bottom plate 1030. Thus, cavities 1090 do not extend through bottom plate 1030. This is in contrast to orifices 1032. In other embodiments, cavities 1090 may extend through bottom plate 1030 (e.g. analogous to orifices 1032). However, in such a case, cavities may alter the resonant characteristics of flow chamber 1040/1050. Consequently, in some embodiments, the depth, u2, of cavities 1090 is less than the thickness of bottom plate 1030. Stated differently, cavities 1090 do not extend through bottom plate 1030. For example, u2 may be at least one hundred micrometers and not more than two hundred and fifty micrometers in some embodiments. The width, v2, of cavities 1090 may also vary. For example, in some embodiments, v2 is at least one hundred micrometers and not more than three hundred micrometers. Other depths and/or widths may be possible. In some embodiments, cavities 1090 extend across some if not all of the portion of bottom plate 1030. In the embodiment shown, cavities 1090 extend from at or near the outer edge of flow chamber 1040/1050 to the tip of actuator 1020. However, in some embodiments, cavities 1090 may extend further. For example, the overlap with actuator 1020 may be from zero (no overlap) to one hundred micrometers.

Cavities 1090 may be used to mitigate the effects of dust entering system 1000. Dust may enter cooling system 1000 along with fluid via vent 1012. Fluid and the dust are driven through flow chamber 1040/1050 by vibrational motion of actuator 1020. Fluid continues to lower chamber 1050 and is driven out of orifices 1032. In contrast, dust may settle in cavities 1090. As a result, dust entering flow chamber 1040/1050 may be less likely to clog orifices 1032 and other portions of system 1000. Consequently, performance and reliability may be improved. A dust guard may also be used in connection with vent 1012 and/or entrances into the device with which cooling system 1000 is used. Thus, issues due to dust may be further mitigated and performance and reliability further improved.

Cooling system 1000 operates in an analogous manner to cooling systems 100, 200, 500, 600, 700, 800, and 900. Thus, cooling system 1000 shares the benefits of cooling system(s) 100, 200, 500, 600, 700, and/or 800. Thus, performance of a device employing cooling system 1000 may be improved. Further, because of the presence of cavities 1090, issues with dust may be mitigated. Consequently, reliability and/or performance of system 1000 may be improved.

Figure 11A:
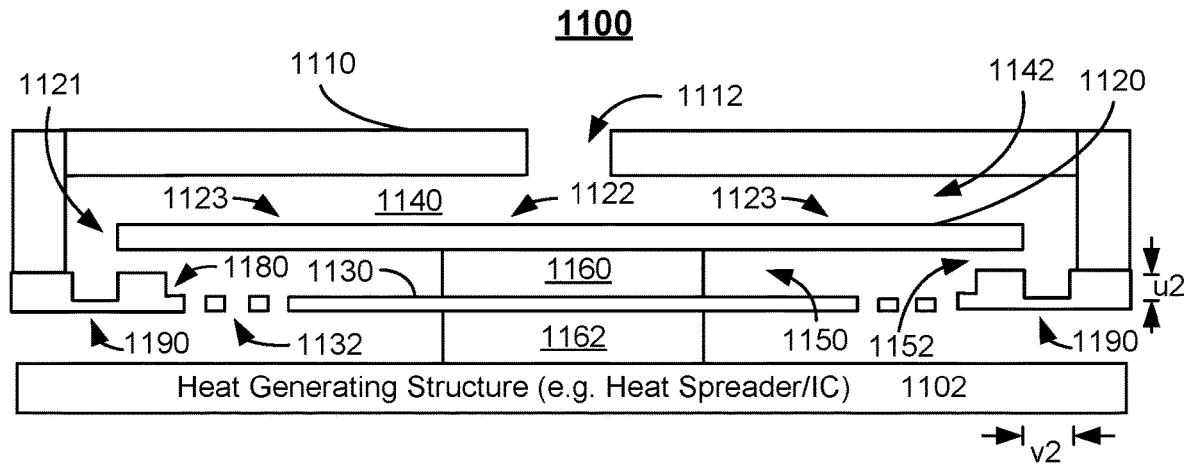
FIGS. 11A-11B depict an embodiment of an active cooling system including an actuator and cavities in the lower chamber.
Figure 11B:
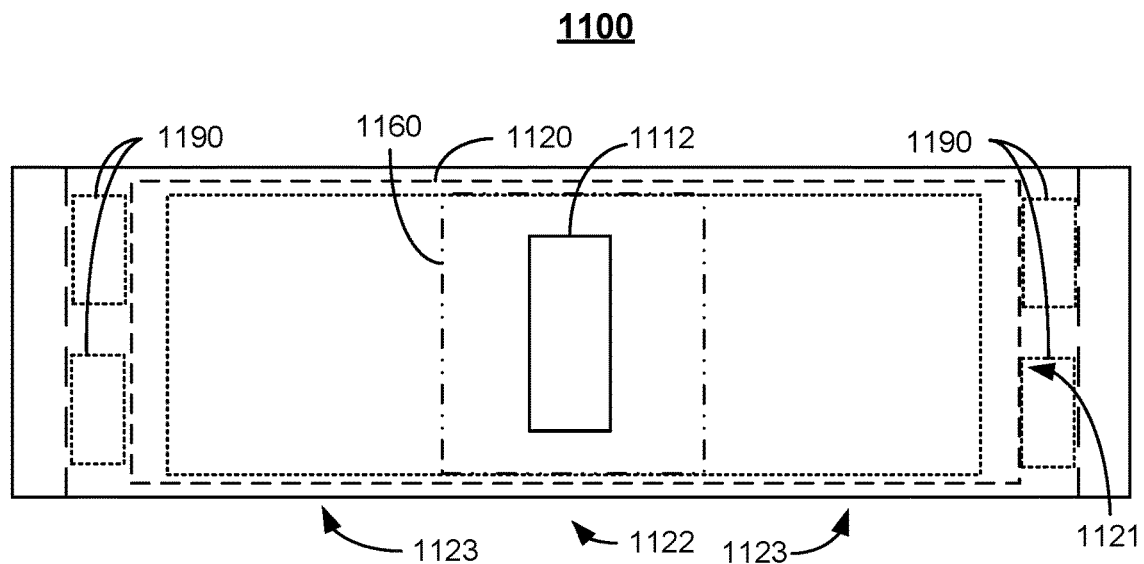

FIGS. 11A-11B depict an embodiment of active cooling system 1100 including an actuator and cavities in the lower chamber. FIG. 11A is a side view of cooling system 1100, while FIG. 11B is a plan view of cooling system 1100. FIGS. 11A-11B are not to scale. For simplicity, only portions of cooling system 1100 are shown. Cooling system 1100 is analogous to cooling system(s) 100, 200, 500, 600, 700, 800, 900, and/or 1000. Cooling system 1100 may be considered most analogous to cooling system 1000. Consequently, analogous components have similar labels. For example, cooling system 1100 is used in conjunction with heat-generating structure 1102, which is analogous to heat-generating structure 102.

Cooling system 1100 includes top plate 1110 having vent 1112, actuator 1120, orifice plate 1130 including orifices 1132, top chamber 1140 having gap 1142, bottom chamber 1150 having gap 1152, flow chamber 1140/1150, anchor (i.e. support structure) 1160, and pedestal 1162 that are analogous to top plate 1010 having vent 1012, actuator 1020, orifice plate 1030 including orifices 1032, top chamber 1040 having gap 1042, bottom chamber 1050 having gap 1052, flow chamber 1040/1050, anchor (i.e. support structure) 1060, and pedestal 1062, respectively.

Actuator 1120 is centrally supported by anchor 1160 such that at least a portion of the perimeter of actuator 1120 is free to vibrate. Anchor 1160 extends along the axis of actuator 1120 such that actuator 1120 includes cantilevered arms 1123 and a central, anchored region 1122 analogous to actuator 1020. In some embodiments, actuator 1120 may have another configuration. For example, actuator 1120 may be engineered in a manner analogous to actuator 220. In other embodiments, anchor 1160 is only near the center portion of actuator 1120. In some embodiments, cantilevered arms 1123 of actuator 1120 are driven in-phase. In some embodiments, cantilevered arms of actuator 1120 are driven out-of-phase. Cooling system 1100 operates in a manner analogous to cooling systems 100, 200, 500, 600, 700, 800, 900, and/or 1000.

Cooling system 1100 includes cavities 1190 and 1180. In some embodiments, cavities 1190 may be omitted. Cavities 1190 are analogous to cavities 1090. Thus, cavities 1190 may be used to mitigate issues related to dust. In the embodiment shown, multiple cavities 1190 exist on each side of anchor 1160. In another embodiment, another number of cavities 1190 may be present. Dust guards for vent 1112 and/or the device with which cooling system 1100 is used may further mitigate dust-related issues. Performance and reliability may be further improved.

Orifice plate 1130 includes recessed regions, or cavities, 1180. Cavities 1180 are analogous to cavities 980 of system 980. System 1100 is described as having multiple cavities 1180. In some embodiments, a single cavity 1180 may be present. In some such embodiments, cavity 1180 extends around anchor 1160. Although shown as having vertical sidewalls and extending to anchor 1160, cavities 1180 in orifice plate 1130 (and thus in bottom chamber 1150) may have another configuration. In some embodiments, cavities 1180 have a depth of at least twenty-five micrometers and not more than two hundred fifty micrometers. Other depths are possible. In some embodiments, cavities 1180 have the same depth (u2) as cavities 1190. In some embodiments, cavities 1180 have a different depth than cavities 1190. Cavities 1180 may be used to control the pressure in flow chamber 1140/1150. Cavities 1180 may reduce the pressure against which actuator 1120 has to work when driving fluid through flow chamber 1140/1150. Stated differently, cavities 1180 may function as a pressure relief valve. For example, as cantilevered arms 1123 of actuator 1120 vibrate toward bottom plate 1130, cavities 1180 reduce the pressure in lower chamber 1150. Vibrational motion of actuator 1120 may be able to drive fluid through orifices 1132 while working against a lower pressure. Thus, power consumption may be reduced. Further, cavities 1180 may be used to control the gap between orifice plate 1130 and actuator 1120. Consequently, the backflow of fluid through orifices 1132 into bottom chamber 1150 may be further reduced.

Cooling system 1100 shares the benefits of cooling system(s) 100, 200, 500, 600, 700, 800, 900, and/or 1000. Thus, performance of a device employing cooling system 1100 may be improved in a manner analogous to cooling system(s) 100, 200, 500, 600, 700, 800, 900, and/or 1000, cavities 1180 may further reduce the pressure against which actuator 1120 works against. Backflow or fluid through orifices 1132 may also be controlled. Thus, the power consumed may be reduced. If another actuator is used in place of simple, uniform actuator 1120, further benefits of system may be achieved for system 1100.

Figure 12:
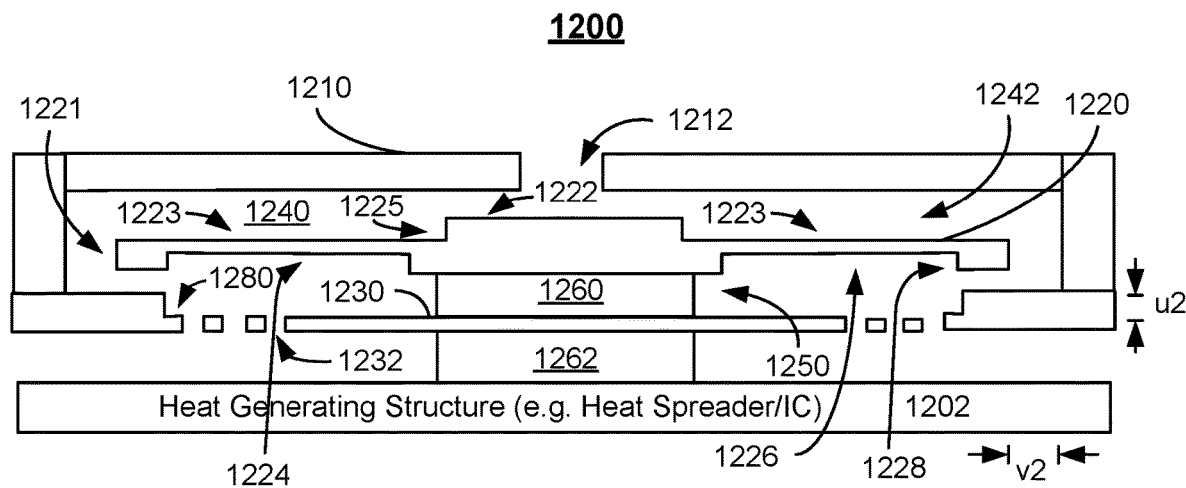
FIG. 12 depicts an embodiment of an active cooling system including an actuator and cavities in the lower chamber.

FIG. 12 depicts an embodiment of active cooling system 1200 including an actuator and cavities in the lower chamber. FIG. 12 is not to scale. For simplicity, only portions of cooling system 1200 are shown. Cooling system 1200 is analogous to cooling system(s) 100, 200, 500, 600, 700, 800, 900, 1000, and/or 1100. Cooling system 1200 may be considered most analogous to cooling system(s) 1000 and/or 1100. Consequently, analogous components have similar labels. For example, cooling system 1200 is used in conjunction with heat-generating structure 1202, which is analogous to heat-generating structure 102.

Cooling system 1200 includes top plate 1210 having vent 1212, actuator 1220, orifice plate 1230 including orifices 1232, top chamber 1240 having gap 1242, bottom chamber 1250 having a gap (not labeled), flow chamber 1240/1250, anchor (i.e. support structure) 1260, and pedestal 1262 that are analogous to top plate 1010 having vent 1012, actuator 1020, orifice plate 1030 including orifices 1032, top chamber 1040 having gap 1042, bottom chamber 1050 having gap 1052, flow chamber 1040/1050, anchor (i.e. support structure) 1060, and pedestal 1062, respectively.

Cooling system 1200 includes cavities 1280. In some embodiments, cavities (not shown) analogous to cavities 1190 and/or 1090 may be present. Such cavities may be used to mitigate issues related to dust. Performance and reliability may be further improved. Cavities 1280 are analogous to cavities 1180. Although system 1200 is described as having multiple cavities 1280, a single cavity 1280 may be present. In some such embodiments, cavity 1280 extends around anchor 1260. Although shown as having vertical sidewalls and extending to anchor 1260, cavities 1280 in orifice plate 1230 (and thus in bottom chamber 1250) may have another configuration. Cavities 1280 function in an analogous manner to cavities 1180. Thus, cavities 1280 may be used to control the pressure in flow chamber 1240/1250. Further, cavities 1280 may be used to control the gap between orifice plate 1230 and actuator 1220. Consequently, power consumed and the backflow of fluid through orifices 1232 into bottom chamber 1250 may be reduced.

Actuator 1220 is centrally supported by anchor 1260 such that at least a portion of the perimeter of actuator 1220 is free to vibrate. Anchor 1260 extends along the axis of actuator 1220 such that actuator 1220 includes cantilevered arms 1223 and a central, anchored region 1222 analogous to actuator 1120. Actuator 1220 is an engineered actuator analogous to actuator 220. Thus, each cantilevered arm 1223 includes step region 1224 (of which only one is labeled), extension region 1226 (of which only one is labeled), and outer region 1228 (of which only one is labeled) that are analogous to step region 224, extension region 226, and outer region 228. Actuator 1220 also includes an additional step region 1225. In some embodiments, additional step has a height to at least one hundred fifty micrometers and not more than two hundred fifty micrometers. Extension region 1226 also forms a bottom recessed region that may have a height of up to two hundred and fifty micrometers. Thus, extension region 1226 is thinner than step region 1224 and outer region 1228. Extension region 1226 aids in reducing the pressure in lower chamber 1250 due to vibrational motion of cantilevered arms 1223. Extension region 1226 functions in an analogous manner to cavities 1280 and cavities 170. Thus, the pressure increases in upper chamber 140 and lower chamber 1250 may be mitigated. Outer region 1228 may increase the deflection of cantilevered arms 1223 if actuator 1220 is driven.

In some embodiments, cantilevered arms 1223 of actuator 1220 are driven in-phase. In some embodiments, cantilevered arms of actuator 1220 are driven out-of-phase. Cooling system 1200 operates in a manner analogous to cooling systems 100, 200, 500, 600, 700, 800, 900, 1000, and/or 1100.

Cooling system 1200 shares the benefits of cooling system(s) 100, 200, 500, 600, 700, 800, 900, 1000, and/or 1100. Thus, performance of a device employing cooling system 1200 may be improved in a manner analogous to cooling system(s) 100, 200, 500, 600, 700, 800, 900, 1000, and/or 1100. Cavities 1280 may further reduce the pressure against which actuator 1220 works against. Backflow or fluid through orifices 1232 may also be controlled. Thus, the power consumed may be reduced. Actuator 1220 may further reduce pressure in lower chamber 1250. Thus, efficiency may be further improved.

Figure 13:
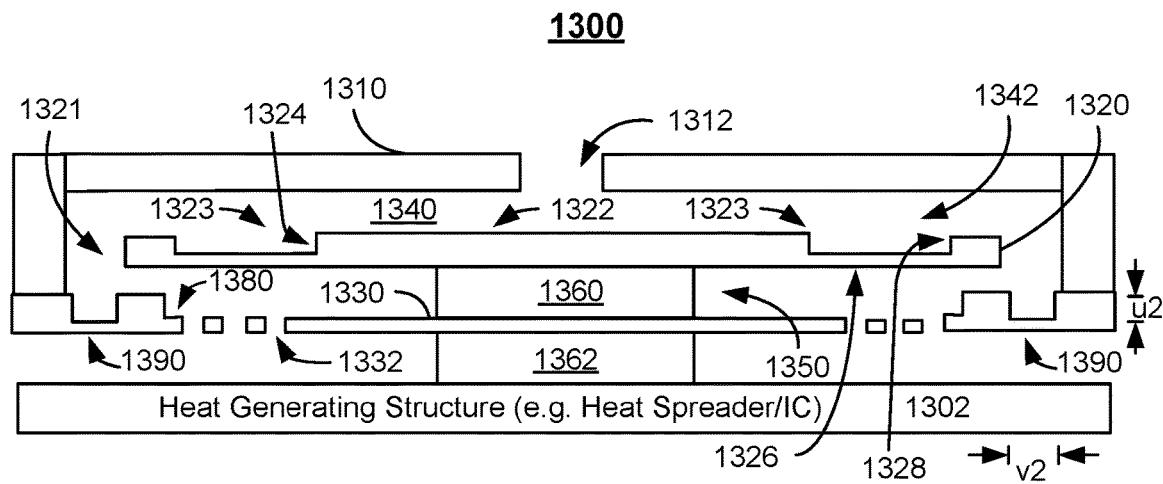
FIG. 13 depicts an embodiment of an active cooling system including an actuator and cavities in the lower chamber.

FIG. 13 depicts an embodiment of active cooling system 1300 including an actuator and cavities in the lower chamber. FIG. 13 is not to scale. For simplicity, only portions of cooling system 1300 are shown. Cooling system 1300 is analogous to cooling system(s) 100, 200, 500, 600, 700, 800, 900, 1000, 1100, and/or 1200. Cooling system 1300 may be considered most analogous to cooling system(s) 1000, 1100, and/or 1200. Consequently, analogous components have similar labels. For example, cooling system 1300 is used in conjunction with heat-generating structure 1302, which is analogous to heat-generating structure 102.

Cooling system 1300 includes top plate 1310 having vent 1312, actuator 1320, orifice plate 1330 including orifices 1332, top chamber 1340 having gap 1342, bottom chamber 1350 having a gap (not labeled), flow chamber 1340/1350, anchor (i.e. support structure) 1360, and pedestal 1362 that are analogous to top plate 1010 having vent 1012, actuator 1020, orifice plate 1030 including orifices 1032, top chamber 1040 having gap 1042, bottom chamber 1050 having gap 1052, flow chamber 1040/1050, anchor (i.e. support structure) 1060, and pedestal 1062, respectively.

Cooling system 1300 includes cavities 1380 and 1390. In some embodiments, cavities 1390 may be omitted. Cavities 1390 are analogous to cavities 1090. Thus, cavities 1390 may be used to mitigate issues related to dust. Dust guards for vent 1312 and/or the device with which cooling system 1300 is used may further mitigate dust-related issues. Performance and reliability may be further improved. Cavities 1380 are analogous to cavities 1180. Although system 1300 is described as having multiple cavities 1380, a single cavity 1380 may be present. In some such embodiments, cavity 1380 extends around anchor 1360. Although shown as having vertical sidewalls and extending to anchor 1360, cavities 1380 in orifice plate 1330 (and thus in bottom chamber 1350) may have another configuration. Cavities 1380 function in an analogous manner to cavities 1180. Thus, cavities 1380 may be used to control the pressure in flow chamber 1340/1350. Further, cavities 1380 may be used to control the gap between orifice plate 1330 and actuator 1320. Consequently, power consumed and the backflow of fluid through orifices 1332 into bottom chamber 1350 may be reduced.

Actuator 1320 is centrally supported by anchor 1360 such that at least a portion of the perimeter of actuator 1320 is free to vibrate. Anchor 1360 extends along the axis of actuator 1320 such that actuator 1320 includes cantilevered arms 1323 and a central, anchored region 1322 analogous to actuator 1120. Actuator 1320 is an engineered actuator analogous to actuator 220, but with a recessed region facing top plate 1310. Each cantilevered arm 1323 includes step region 1324 (of which only one is labeled), extension region 1326 (of which only one is labeled), and outer region 1328 (of which only one is labeled) that are analogous to step region 1224, extension region 1226, and outer region 1328. Thus, extension region 1326 is thinner than step region 1324 and outer region 1328. However, the recessed portion of actuator 1320 due to extension region 1326 faces top plate 1210 instead of facing bottom plate 1230 (as for actuator 1220). Extension region 1326 aids in reducing the pressure in upper chamber 1340 due to vibrational motion of cantilevered arms 1323. Extension region 1326 may thus mitigate the pressure increase in upper chamber 1340, while cavities 1380 reduce the pressure in lower chamber 1350. Outer region 1328 may increase the deflection of cantilevered arms 1323 if actuator 1320 is driven.

In some embodiments, cantilevered arms 1323 of actuator 1320 are driven in-phase. In some embodiments, cantilevered arms of actuator 1320 are driven out-of-phase. Cooling system 1300 operates in a manner analogous to cooling systems 100, 200, 500, 600, 700, 800, 900, 1000, 1100, and/or 1200.

Cooling system 1300 shares the benefits of cooling system(s) 100, 200, 500, 600, 700, 800, 900, 1000, 1100, and/or 1200. Thus, performance of a device employing cooling system 1300 may be improved in a manner analogous to cooling system(s) 100, 200, 500, 600, 700, 800, 900, 1000, 1100, and/or 1200. Cavities 1380 may further reduce the pressure against which actuator 1320 works against. Backflow or fluid through orifices 1332 may also be controlled. Thus, the power consumed may be reduced. Actuator 1320 may further reduce pressure in upper chamber 1350. Thus, efficiency may be further improved.

Figure 14:
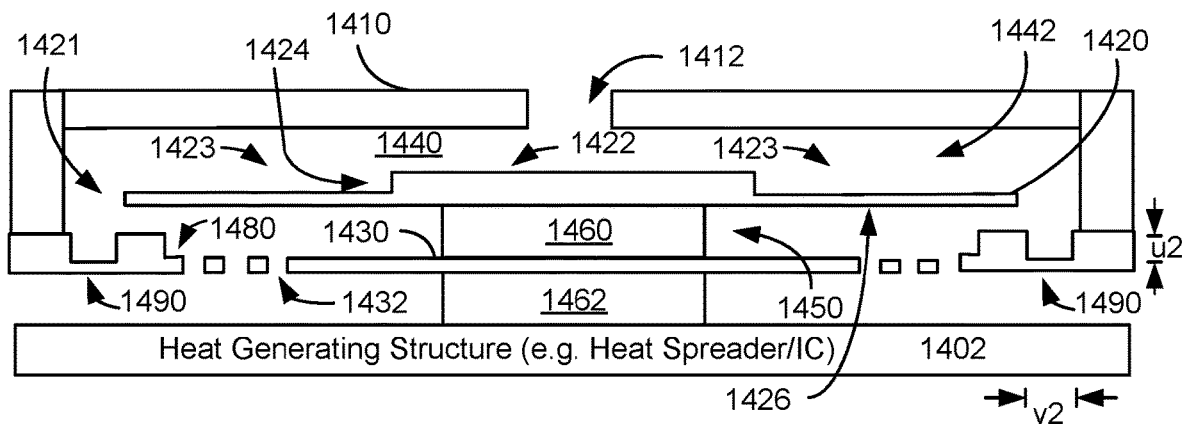
FIG. 14 depicts an embodiment of an active cooling system including an actuator and cavities in the lower chamber.

FIG. 14 depicts an embodiment of active cooling system 1400 including an actuator and cavities in the lower chamber. FIG. 14 is not to scale. For simplicity, only portions of cooling system 1400 are shown. Cooling system 1400 is analogous to cooling system(s) 100, 200, 500, 600, 700, 800, 900, 1000, 1100, 1200, and/or 1300. Cooling system 1400 may be considered most analogous to cooling system(s) 1000, 1100, 1200, and/or 1300. Consequently, analogous components have similar labels. For example, cooling system 1400 is used in conjunction with heat-generating structure 1402, which is analogous to heat-generating structure 102.

Cooling system 1400 includes top plate 1410 having vent 1412, actuator 1420, orifice plate 1430 including orifices 1432, top chamber 1440 having gap 1442, bottom chamber 1450 having a gap (not labeled), flow chamber 1440/1450, anchor (i.e. support structure) 1460, and pedestal 1462 that are analogous to top plate 1010 having vent 1012, actuator 1020, orifice plate 1030 including orifices 1032, top chamber 1040 having gap 1042, bottom chamber 1050 having gap 1052, flow chamber 1040/1050, anchor (i.e. support structure) 1060, and pedestal 1062, respectively.

Cooling system 1400 includes cavities 1480 and 1490. In some embodiments, cavities 1490 may be omitted. Cavities 1490 are analogous to cavities 1090. Thus, cavities 1490 may be used to mitigate issues related to dust. Dust guards for vent 1412 and/or the device with which cooling system 1400 is used may further mitigate dust-related issues. Performance and reliability may be further improved. Cavities 1480 are analogous to cavities 1180. Although system 1400 is described as having multiple cavities 1480, a single cavity 1480 may be present. In some such embodiments, cavity 1480 extends around anchor 1460. Although shown as having vertical sidewalls and extending to anchor 1460, cavities 1480 in orifice plate 1430 (and thus in bottom chamber 1450) may have another configuration. Cavities 1480 function in an analogous manner to cavities 1180. Thus, cavities 1480 may be used to control the pressure in flow chamber 1440/1450. Further, cavities 1480 may be used to control the gap between orifice plate 1430 and actuator 1420. Consequently, power consumed and the backflow of fluid through orifices 1432 to bottom chamber 1450 may be reduced.

Actuator 1420 is centrally supported by anchor 1460 such that at least a portion of the perimeter of actuator 1420 is free to vibrate. Anchor 1460 extends along the axis of actuator 1420 such that actuator 1420 includes cantilevered arms 1423 and a central, anchored region 1422 analogous to actuator 1120. Actuator 1420 is an engineered actuator analogous to actuator 1320 but does not include the outer region. Each cantilevered arm 1423 includes step region 1424 (of which only one is labeled) and extension region 1426 (of which only one is labeled) that are analogous to step region 1224 and extension region 1226. Thus, extension region 1426 is thinner than step region 1424 and extends to tip 1421. The recessed portion of actuator 1420 due to extension region 1426 also extends to tip 1421 of actuator 1420. Extension region 1426 aids in reducing the pressure in flow chamber 1440/1450 due to vibrational motion of cantilevered arms 1423. Extension region 1426 may thus combine with cavities 1480 reduce the pressure in flow chamber 1440/1450. Moreover, because extension region 1426 is thinner than step region 1424, cantilevered arms 1423 may be driven to have the desired deflection at a lower power. Further, cantilevered arms 1423 may be driven at higher frequency. For example, it may be desirable to drive actuator 1420 at a higher frequency, for example thirty-five to forty kHz. Extension region 1426 being thinner may allow for cantilevered arms 1423 to be driven at such frequencies.

In some embodiments, cantilevered arms 1423 of actuator 1420 are driven in-phase. In some embodiments, cantilevered arms of actuator 1420 are driven out-of-phase. Cooling system 1400 operates in a manner analogous to cooling systems 100, 200, 500, 600, 700, 800, 900, 1000, 1100, 1200, and/or 1300.

Cooling system 1400 shares the benefits of cooling system(s) 100, 200, 500, 600, 700, 800, 900, 1000, 1100, 1200, and/or 1300. Thus, performance of a device employing cooling system 1400 may be improved in a manner analogous to cooling system(s) 100, 200, 500, 600, 700, 800, 900, 1000, 1100, 1200, and/or 1300. Cavities 1480 may further reduce the pressure against which actuator 1420 works against. Backflow or fluid through orifices 1432 may also be controlled. Thus, the power consumed may be reduced. Actuator 1420 may further reduce pressure in flow chamber 1440/1450 and allow for deflection of cantilevered arms 1423 at a lower power. Thus, efficiency may be further improved.

Figure 15:
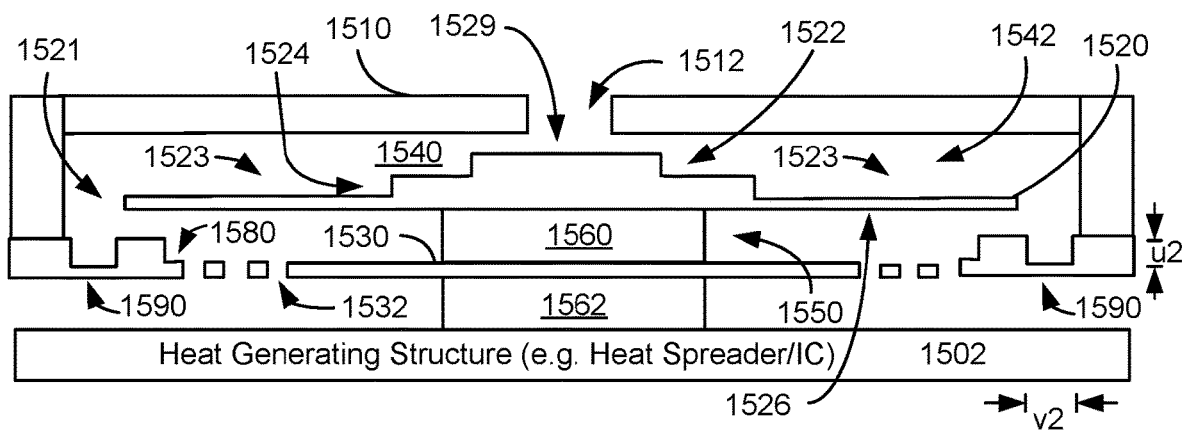
FIG. 15 depicts an embodiment of an active cooling system including an actuator and a in the lower chamber.

FIG. 15 depicts an embodiment of active cooling system 1500 including an actuator and cavities in the lower chamber. FIG. 15 is not to scale. For simplicity, only portions of cooling system 1500 are shown. Cooling system 1500 is analogous to cooling system(s) 100, 200, 500, 600, 700, 800, 900, 1000, 1100, 1200, and/or 1300. Cooling system 1500 may be considered most analogous to cooling system(s) 1000, 1100, 1200, and/or 1300. Consequently, analogous components have similar labels. For example, cooling system 1500 is used in conjunction with heat-generating structure 1502, which is analogous to heat-generating structure 102.

Cooling system 1500 includes top plate 1510 having vent 1512, actuator 1520, orifice plate 1530 including orifices 1532, top chamber 1540 having gap 1542, bottom chamber 1550 having a gap (not labeled), flow chamber 1540/1550, anchor (i.e. support structure) 1560, and pedestal 1562 that are analogous to top plate 1010 having vent 1012, actuator 1020, orifice plate 1030 including orifices 1032, top chamber 1040 having gap 1042, bottom chamber 1050 having gap 1052, flow chamber 1040/1050, anchor (i.e. support structure) 1060, and pedestal 1062, respectively.

Cooling system 1500 includes cavities 1580 and 1590. In some embodiments, cavities 1590 may be omitted. Cavities 1590 are analogous to cavities 1090. Thus, cavities 1590 may be used to mitigate issues related to dust. Dust guards for vent 1512 and/or the device with which cooling system 1500 is used may further mitigate dust-related issues. Performance and reliability may be further improved. Cavities 1580 are analogous to cavities 1180. Although system 1500 is described as having multiple cavities 1580, a single cavity 1580 may be present. In some such embodiments, cavity 1580 extends around anchor 1560. Although shown as having vertical sidewalls and extending to anchor 1560, cavities 1580 in orifice plate 1530 (and thus in bottom chamber 1550) may have another configuration. Cavities 1580 function in an analogous manner to cavities 1180.

Thus, cavities 1580 may be used to control the pressure in flow chamber 1540/1550. Further, cavities 1580 may be used to control the gap between orifice plate 1530 and actuator 1520. Consequently, power consumed and the backflow of fluid through orifices 1532 to bottom chamber 1550 may be reduced.

Actuator 1520 is centrally supported by anchor 1560 such that at least a portion of the perimeter of actuator 1520 is free to vibrate. Anchor 1560 extends along the axis of actuator 1520 such that actuator 1520 includes cantilevered arms 1523 and a central, anchored region 1522 analogous to actuator 1120. Actuator 1520 is an engineered actuator analogous to actuator 1420. Each cantilevered arm 1523 includes step region 1524 (of which only one is labeled) and extension region 1526 (of which only one is labeled) that are analogous to step region 1424 and extension region 1426. Thus, extension region 1526 is thinner than step region 1524 and extends to tip 1521. Extension region 1526 may not only combine with cavities 1580 reduce the pressure in flow chamber 1540/1550, but also allow cantilevered arms 1523 to be driven at a lower power.

Actuator 1520 also includes shim 1529. In some embodiments, shim 1529 has a nominal height of up to one hundred and fifty micrometers. Shim 1529 may be used in mounting actuator 1420. More specifically, shim 1529 may be used to improve diffusion bonding. More specifically, shim 1529 provides a large, flat surface, as well as increasing the stiffness of the central portion 1522 of actuator 1520. As a result, actuator 1520 may be more easily diffusion bonded to anchor 1460. Thus, fabrication of cooling system 1400 may be improved. Although shim 1529 is depicted in final cooling system 1500, shim 1529 may be removed during fabrication. The presence of shim 1529 may affect the resonant frequency of actuator 1520. Removal of shim 1529 may restore the resonant frequency of actuator 1520, for example to be the same as that of actuator 1420.

In some embodiments, cantilevered arms 1523 of actuator 1520 are driven in-phase. In some embodiments, cantilevered arms of actuator 1520 are driven out-of-phase. Cooling system 1500 operates in a manner analogous to cooling systems 100, 200, 500, 600, 700, 800, 900, 1000, 1100, 1200, and/or 1300.

Cooling system 1500 shares the benefits of cooling system(s) 100, 200, 500, 600, 700, 800, 900, 1000, 1100, 1200, 1300, and/or 1400. Thus, performance of a device employing cooling system 1500 may be improved in a manner analogous to cooling system(s) 100, 200, 500, 600, 700, 800, 900, 1000, 1100, 1200, 1300, and/or 1400. Cavities 1580 may further reduce the pressure against which actuator 1520 works against. Backflow or fluid through orifices 1532 may also be controlled. Thus, the power consumed may be reduced. Actuator 1520 may further reduce pressure in flow chamber 1540/1550 and allow for deflection of cantilevered arms 1523 at a lower power. Thus, efficiency may be further improved. Fabrication of cooling system 1500 may also be improved.

Figure 16:
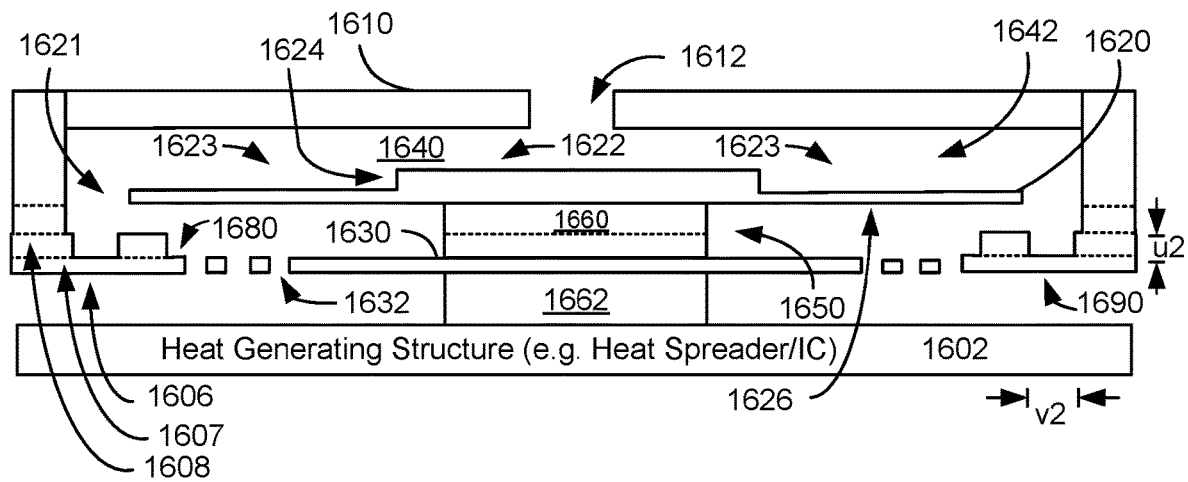
FIG. 16 depicts an embodiment of an active cooling system including an actuator and cavities in the lower chamber.

FIG. 16 depicts an embodiment of active cooling system 1600 including an actuator and cavities in the lower chamber. FIG. 16 is not to scale. For simplicity, only portions of cooling system 1600 are shown. Cooling system 1600 is analogous to cooling system(s) 100, 200, 500, 600, 700, 800, 900, 1000, 1100, 1200, 1400, and/or 1500. Cooling system 1600 may be considered most analogous to cooling system(s) 1400. Consequently, analogous components have similar labels. For example, cooling system 1600 is used in conjunction with heat-generating structure 1602, which is analogous to heat-generating structure 102.

Cooling system 1600 includes top plate 1610 having vent 1612, actuator 1620, orifice plate 1630 including orifices 1632, top chamber 1640 having gap 1642, bottom chamber 1650 having a gap (not labeled), flow chamber 1640/1650, anchor (i.e. support structure) 1660, and pedestal 1662 that are analogous to top plate 1410 having vent 1412, actuator 1420, orifice plate 1430 including orifices 1432, top chamber 1440 having gap 1442, bottom chamber 1450 having gap 1452, flow chamber 1440/1450, anchor (i.e. support structure) 1460, and pedestal 1462, respectively. Cooling system 1600 includes cavities 1680 and 1690, which are analogous to cavities 980/1180/1580 and 1090/1190/1590, respectively.

In cooling system 1600, three layers of material 1606, 1607, and 1608 are used in forming orifice plate 1630, cavities 1680 and 1690, and anchor 1660. These layers are indicated by dashed lines. In some embodiments, for example some embodiments of cooling system 1400, cavities 1480 and 1490 might be formed using two etches for orifice plate 1430. However, such a process may result in the top surface of the region of orifice plate 1430 between cavities 1480 and 1490 being rough. As a result, dust may be more likely to adhere to this region. This dust may adversely affect performance of such an embodiment of cooling system 1400. In cooling system 1600, the portion of orifice plate 1630 having orifices 1632 is formed from layer 1606. A single etch may be used to form orifices 1632. Cavities 1680 and 1690 may be formed by a single etch of layer 1607. The remaining portion of anchor 1660 and the edges of the sidewalls of cooling system 1600 are formed using layer 1608. As a result, a single etch may be used to form cavities 1680 and 1690. The top surface of the region between cavities 1680 and 1690 may be smoother. Consequently, dust is less likely to adhere to this region. Performance and reliability may be improved.

Cooling system 1600 shares the benefits of cooling system(s) 100, 200, 500, 600, 700, 800, 900, 1000, 1100, 1200, 1300, 1400, and/or 1500. Thus, performance of a device employing cooling system 1600 may be improved in a manner analogous to cooling system(s) 100, 200, 500, 600, 700, 800, 900, 1000, 1100, 1200, 1300, 1400, and/or 1500. Moreover, performance and reliability may be improved through fabrication of cooling system 1600.

Figure 17:
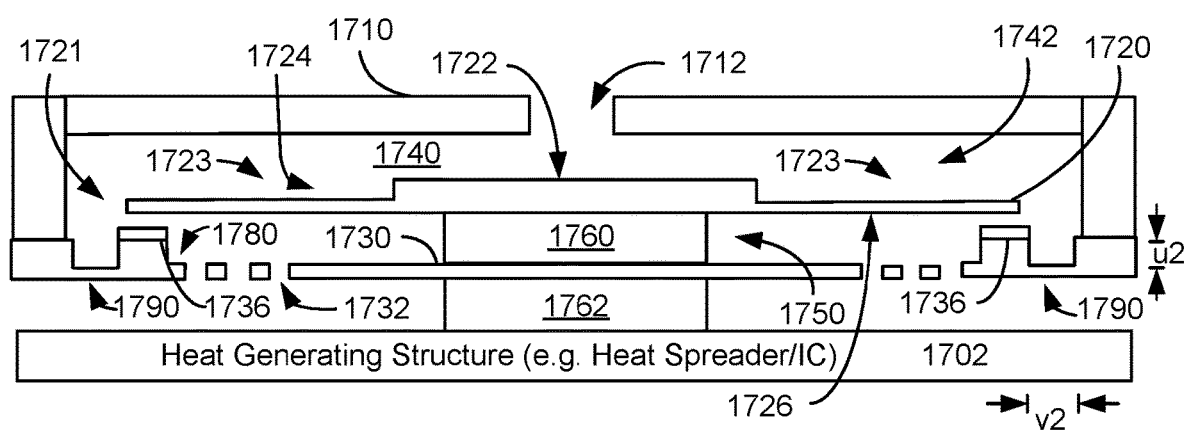
FIG. 17 depicts an embodiment of an active cooling system including an actuator and cavities in the lower chamber.

FIG. 17 depicts an embodiment of active cooling system 1700 including an actuator and cavities in the lower chamber. FIG. 17 is not to scale. For simplicity, only portions of cooling system 1700 are shown. Cooling system 1700 is analogous to cooling system(s) 100, 200, 500, 600, 700, 800, 900, 1000, 1100, 1200, 1400, 1500, and/or 1600. Cooling system 1700 may be considered most analogous to cooling system(s) 1400. Consequently, analogous components have similar labels. For example, cooling system 1700 is used in conjunction with heat-generating structure 1702, which is analogous to heat-generating structure 102.

Cooling system 1700 includes top plate 1710 having vent 1712, actuator 1720, orifice plate 1730 including orifices 1732, top chamber 1740 having gap 1742, bottom chamber 1750 having a gap (not labeled), flow chamber 1740/1750, anchor (i.e. support structure) 1760, and pedestal 1762 that are analogous to top plate 1410 having vent 1412, actuator 1420, orifice plate 1430 including orifices 1432, top chamber 1440 having gap 1442, bottom chamber 1450 having gap 1452, flow chamber 1440/1450, anchor (i.e. support structure) 1460, and pedestal 1462, respectively. Cooling system 1700 includes cavities 1780 and 1790 that are analogous to cavities 980/1180/1580/1680 and 1090/1190/1590/1690, respectively.

Cooling system 1700 also includes coating 1736. Coating 1736 reduces the ability of dust to adhere to this region. For example, coating 1736 may provide a smoother top surface and/or reduce the coefficient of friction for this surface. For example, coating 1736 may include a ceramic coating. Consequently, dust may not adhere to this region. Performance and reliability may be improved.

Cooling system 1700 shares the benefits of cooling system(s) 100, 200, 500, 600, 700, 800, 900, 1000, 1100, 1200, 1300, 1400, 1500, and/or 1600. Thus, performance of a device employing cooling system 1700 may be improved in a manner analogous to cooling system(s) 100, 200, 500, 600, 700, 800, 900, 1000, 1100, 1200, 1300, 1400, 1500, and/or 1600. Moreover, performance and reliability may be improved through fabrication of cooling system 1700.

FIGS. 18A-18D depict an embodiment of active cooling system 1800 including an actuator and cavities in the lower chamber and portions thereof. FIGS. 18A-18D are not to scale. For simplicity, only portions of cooling system 1800 are shown. Cooling system 1800 is analogous to cooling system(s) 100, 200, 500, 600, 700, 800, 900, 1000, 1100, 1200, 1400, 1500, 1600, and/or 1700. Cooling system 1800 may be considered most analogous to cooling system(s) 1400. Consequently, analogous components have similar labels. For example, cooling system 1800 is used in conjunction with heat-generating structure 1802, which is analogous to heat-generating structure 102.

Figure 18A:
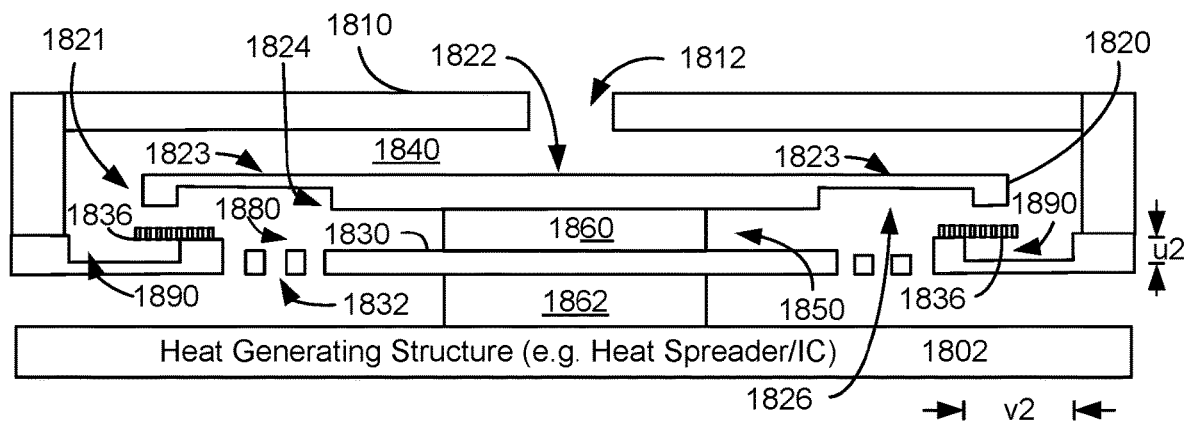
FIGS. 18A-18D depicts an embodiment of an active cooling system including an actuator and cavities in the lower chamber and a portion thereof.
Figure 18B:
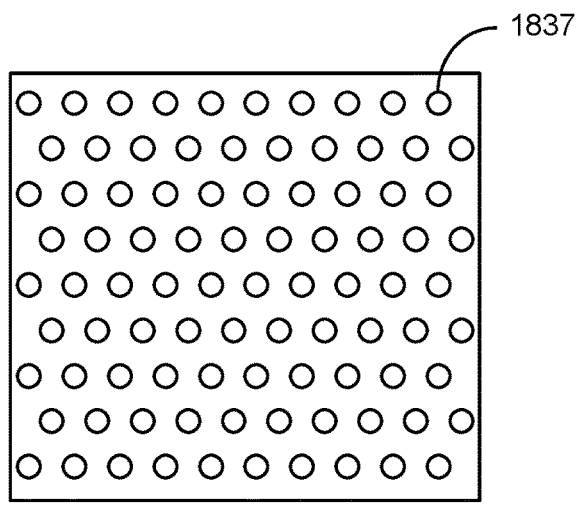

Referring to FIGS. 18A-18B, cooling system 1800 includes top plate 1810 having vent 1812, actuator 1820, orifice plate 1830 including orifices 1832, top chamber 1840 having gap (not labeled), bottom chamber 1850 having a gap (not labeled), flow chamber 1840/1850, anchor (i.e. support structure) 1860, and pedestal 1862 that are analogous to top plate 1410 having vent 1412, actuator 1420, orifice plate 1430 including orifices 1432, top chamber 1440 having gap 1442, bottom chamber 1450 having gap 1452, flow chamber 1440/1450, anchor (i.e. support structure) 1460, and pedestal 1462, respectively. Actuator 1820 includes an anchored region 1822 and cantilevered arms 1823 having tips 1821 that are analogous to anchored region 122 and cantilevered arms 123 having tips 221. Actuator 1820 may also be considered an engineered actuator because each cantilevered arm 1823 includes step region 1824, extension region 1826, and outer region 1828 analogous to step region 224, extension region 226, and outer region 228, respectively. In some embodiments, an actuator having a different configuration may be used.

Cooling system 1800 includes cavities 1880 and 1890, which are analogous to cavities 980/1180/1580/1680/1780 and 1090/1190/1590/1690/1790, respectively. In some embodiments, cavities 1880 may be omitted. Cavities 1890 extend under a portion of actuator 1820. Although shown as extending to the outer edge of flow chamber 1840/1850, in some embodiments, cavities 1890 may be smaller, terminating closer to orifices 1832. Cavities 1890 still do not extend through orifice plate 1830 (i.e. u2 is less than the thickness of orifice plate 1830). These cavities are designed to maximize fluidic flow by appropriate pressure differentials between the top chamber and bottom chamber, reduce the overall acoustics of the flow along with structural benefits of frequency tuning.

Cooling system 1800 includes fluidized surfaces 1836. In the embodiment shown, fluidized surfaces 1836 include perforated plates (also termed 1836) that are affixed to orifice plate 1830. Plate 1836 may extend over cavity 1890 by 0.3 millimeter through 0.4 millimeter. In some embodiments, plate 1836 extends over cavity 1890 by 0.6 millimeter. Other sizes are possible. For example, FIG. 18B depicts plate 1836 including apertures (i.e. perforations) 1837. Apertures 1837 extend through plate 1836. In the embodiment shown, apertures 1837 extend across plate 1836. In some embodiments, apertures only partially cover plate 1836. However, the portion of plate 1836 including apertures 1837 is aligned with at least a portion of cavities 1890. Thus, cavities 1890 are fluidically connected with bottom chamber 1850 through apertures 1837. In some embodiments, apertures 1837 are at least ten micrometers and not more than fifty micrometers in diameter. Further, the fraction of the surface of plate 1836 occupied by apertures 1837 may be configured to provide the desired flow of fluid through apertures 1837. In some embodiments, apertures 1837 are configured such that not more than five percent of the fluid flow travels through apertures 1837. In some embodiments, apertures 1837 are configured such that not more than three percent of the fluid flow travels through apertures 1837. In some embodiments, apertures 1837 are configured such that not more than one percent of the fluid flow travels through apertures 1837. Not less than 0.1 percent of the fluid flow travels through apertures 1837 in some embodiments.

In some embodiments, plate 1836 is not more than one hundred and fifty micrometers thick. In some embodiments, plate 1836 is not more than approximately one hundred micrometers thick (e.g. at least ninety micrometers thick and not more than one hundred, one hundred and five, or one hundred and ten micrometers thick). Plate 1836 may be at least twenty micrometers and not more than eighty micrometers thick. In some embodiments, the thickness of plate 1836 is at least twenty-five and not more than seventy-five micrometers. For example, plate 1836 may be nominally fifty micrometers thick. Plate 1836 may include or consist of silicon, sapphire, a metal and/or some other material. In some embodiments, fluidized surfaces 1836 through which bottom chamber 1850 is fluidically connected with cavities 1890 may be configured in another manner.

Apertures 1837 may be formed in plate 1836 via nanopatterning, photolithography and etching, anodization, embossing, and/or other analogous techniques. For example, a mask having holes therein may be provided on plate 1836 and plate 1836 etched to form apertures 1837. In other embodiments, apertures 1837 may be formed in another manner. Fluidized surface 1836 may then be affixed to orifice plate 1830. In other embodiments, fluidized surface may be incorporated into or formed from orifice plate 1830 in another manner.

Cooling system 1800 operates in an analogous manner to cooling system(s) 100, 200, 500, 600, 700, 800, 900, 1000, 1100, 1200, 1300, 1400, 1500, 1600, and/or 1700. Thus, vibrational motion of cantilevered arms draws fluid (e.g. air) through vent 1812 into top chamber 1840, directs fluid from top chamber 1840 to bottom chamber 1850, and drives fluid out of orifices 1832.

The vibrational motion of actuator 1820 in combination with fluidized surfaces 1836 aids in preventing particles (e.g. dust) from sticking to orifice plate 1832 and/or other surfaces at the bottom of flow chamber 1840/1850. Small particles traveling along with the fluid may settle on surfaces within flow chamber 1840/1850. In some embodiments, these particles stick to the surfaces. For example, van der Waals forces or another mechanism may cause the small particles to stick to the top of fluidized surfaces 1836. The dust may adversely affect performance and reliability of cooling system 1800. The vibrational motion of actuator 1820 directs fluid into cavities 1890. The fluid may stagnate under fluidized surfaces 1836. However, the motion of cantilevered arms 1823 (e.g. as a cantilevered arm 1823 vibrates toward top plate 1810) also generates a low pressure above fluidized surface 1836. The pressure difference can draw fluid from cavities 1890 through apertures 1837, creating a cushion of fluid above fluidized surface 1836. Particles (not shown) may be lifted from contact with fluidized surfaces 1836 and/or the attractive forces between the particles and fluidized surfaces 1836 reduced. The particles may then be driven out of flow chamber 1840/1850. Thus, issues caused by such particles may be reduced or eliminated. Reliability of cooling system 1800 may be improved.

Figure 18C:
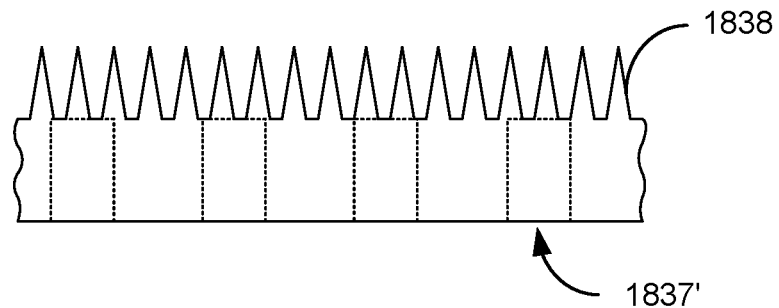
Figure 18D:
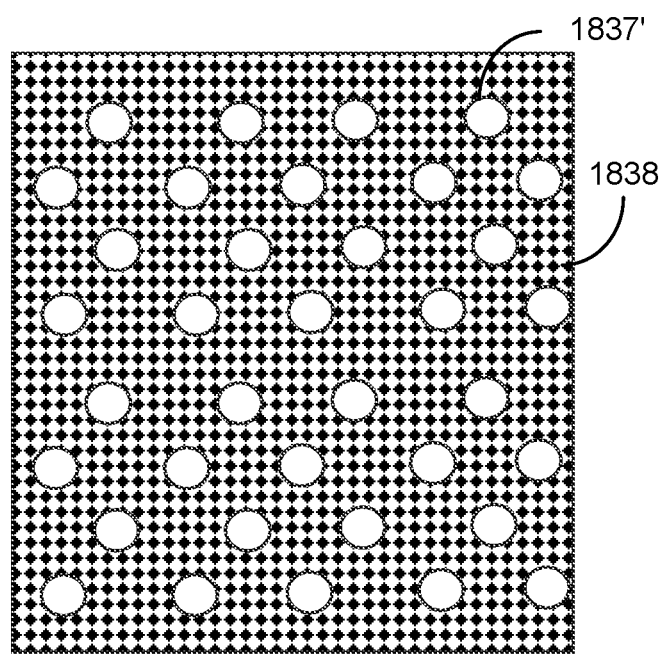

FIGS. 18C and 18D depict another embodiment of fluidized surface 1836' that may be used in cooling system 1800. FIG. 18C depicts a cross-sectional view of a portion of fluidized surface 1836', while FIG. 18D depicts a top view (as seen from chamber 1840/1850) of fluidized surface 1836'. In some embodiments, fluidized surface 1836' may take the place of one or both of fluidized surfaces 1836 in cooling system 1800.

Fluidized surface 1836' includes perforated plate (also termed 1836') that may be affixed to orifice plate 1830. Plate 1836' including apertures (i.e. perforations) 1837' that are analogous to apertures 1837. Apertures 1837' extend through plate 1836'. In the embodiment shown, apertures 1837' extend across plate 1836'. In some embodiments, apertures only partially cover plate 1836'. However, the portion of plate 1836' including apertures 1837' is aligned with at least a portion of cavities 1890. Thus, cavities 1890 are fluidically connected with bottom chamber 1850 through apertures 1837'. In some embodiments, apertures 1837' have a size and/or distribution analogous apertures 1837. Similarly, plate 1836' may have a thickness, may be formed of materials, and/or be otherwise analogous to plate 1836.

In addition to apertures 1837', fluidized surface 1836' includes patterned structures 1838 (hereinafter "spikes"), of which only one is labeled. In an alternate embodiment, plate 1836' may include spikes 1838, but omit apertures 1837'. Although shown as having a pointed geometry, spikes 1838 may have another configuration. Spikes 1838 may have a pitch of at least 0.5 micrometer and not more than 2 micrometers. Spikes 1838 may have a pitch of at least 0.7 micrometer and not more than 1.5 micrometer. For example, the pitch may be nominally one micrometer. In some embodiments, spikes 1838 have a diameter of at least 0.1 micrometer and not more than 0.3 micrometers. For example, spikes 1838 may have a diameter of nominally 0.2 micrometers. Spikes 1838 may have a height of at least 0.3 micrometers and not more than 0.7 micrometers. For example, spikes 1838 may have a height of nominally 0.5 micrometers. Other widths, heights, and pitches are possible.

In some embodiments, spikes 1838 are formed by nanopatterning. For example, a silicon, sapphire, metal, or other substrate for plate 1836' may be covered in a mask having apertures corresponding to the pitch, size, and shape of spikes 1838. The substrate is then etched (e.g. to a depth of 0.5 micrometers). Apertures 1837' may also be formed in a manner analogous to that described for apertures 1837. The substrate may also be thinned to the desired thickness. Thus, plate 1836' including spikes 1838 and apertures 1837' may be formed.

Fluidized surface 1836' operates in an analogous manner to fluidized surface 1836. More specifically, small particles traveling along with the fluid may settle on and adhere to surfaces within flow chamber 1840/1850. The vibrational motion of actuator 1820 directs fluid into cavities 1890. The motion of cantilevered arms 1823 (e.g. as a cantilevered arm 1823 vibrates toward top plate 1810) generates a low pressure above fluidized surface 1836'. The pressure difference can draw fluid from cavities 1890 through apertures 1837', creating a cushion of fluid above fluidized surface 1836'. Particles (not shown) may be lifted from contact with fluidized surfaces 1836' and/or the attractive forces between the particles and fluidized surfaces 1836' reduced. Spikes 1838 may improve the ability of fluidized surface 1836' to remove small particles. Spikes 1838 reduce the surface area of plate 1836' which a small particle may physically contact. Thus, Van der Waals forces between the particle and plate 1836' (i.e. spikes 1838) may be reduced. Consequently, the low pressure generated by the motion of cantilevered arms 1823 may more readily remove particles adhered to fluidized surface 1836'. Consequently, small particles, such as dust, may be more easily removed from the surface of plate 1836' by the flow of fluid through apertures 1837'. The particles may then be driven out of flow chamber 1840/1850. Thus, issues caused by small particles may be reduced or eliminated. Reliability of cooling system 1800 may be improved.

Cooling system 1800 shares the benefits of cooling system(s) 100, 200, 500, 600, 700, 800, 900, 1000, 1100, 1200, 1300, 1400, 1500, 1600, and/or 1700. Thus, performance of a device employing cooling system 1800 may be improved in a manner analogous to cooling system(s) 100, 200, 500, 600, 700, 800, 900, 1000, 1100, 1200, 1300, 1400, 1500, and/or 100. Moreover, issues due to particles may be mitigated and reliability may be improved through the use of fluidized surfaces 1836.

Figure 19A:
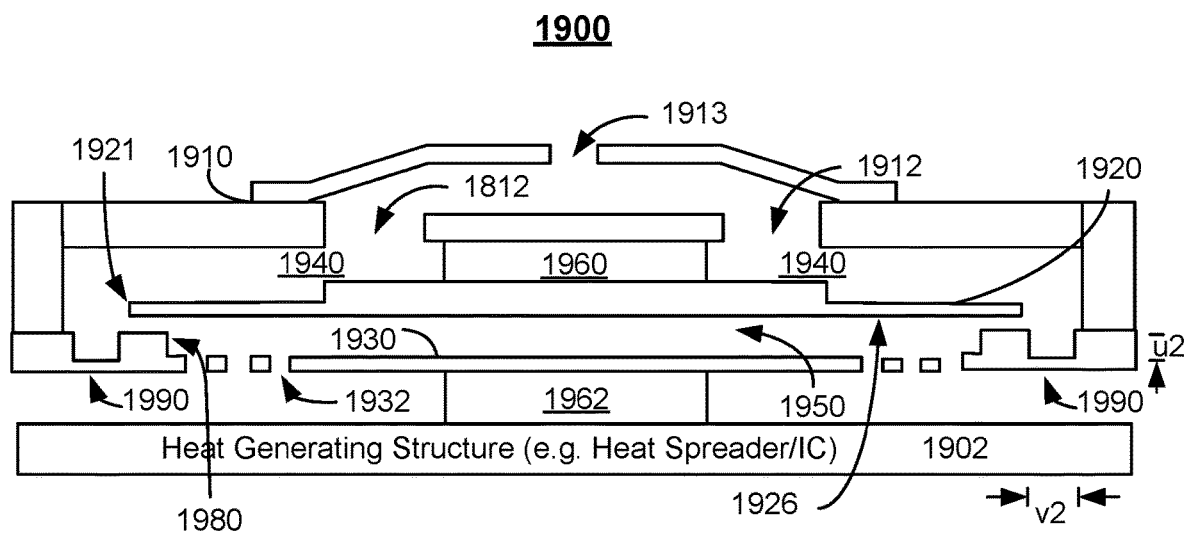
FIGS. 19A-19B depict an embodiment of an active cooling system including an actuator and cavities in the upper chamber.
Figure 19B:
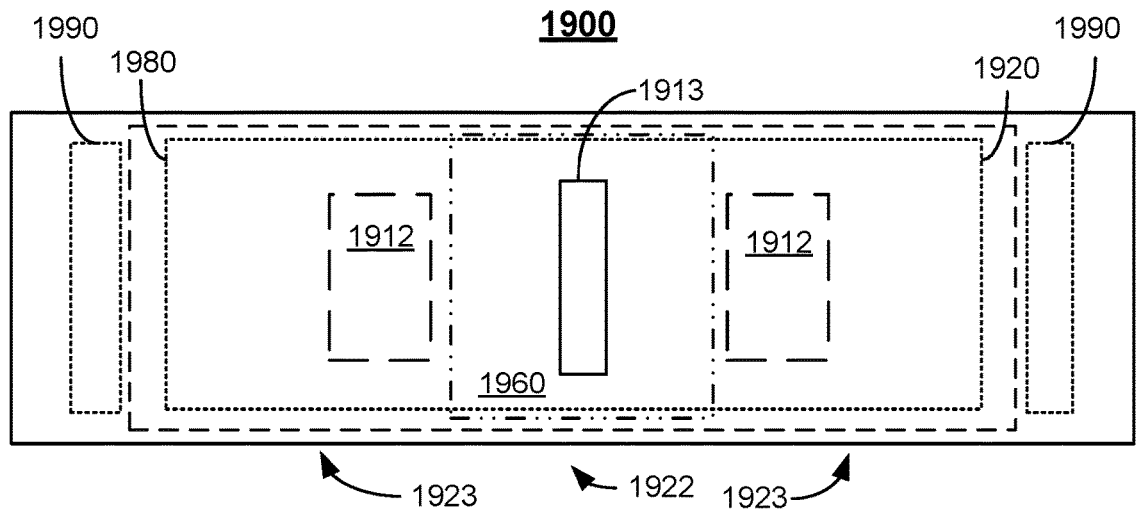

FIGS. 19A-19B depict an embodiment of active cooling system 1900 including a top centrally anchored actuator. FIG. 19A depicts a side view of cooling system 1900 in a neutral position. FIG. 19B depicts a top view of cooling system 1900. FIGS. 19A-19B are not to scale. For simplicity, only portions of cooling system 1900 are shown. Referring to FIGS. 19A-19B, cooling system 1900 is analogous to cooling system(s) 100, 200, 500, 600, 700, 800, 900, 1000, 1100, 1200, 1300, 1400, 1500, 1600, 1700, and/or 1800. Consequently, analogous components have similar labels. For example, cooling system 1900 is used in conjunction with heat-generating structure 1902, which is analogous to heat-generating structure 102.

Cooling system 1900 includes top plate 1910 having vents 1912, actuator 1920, orifice plate 1930 including orifices 1932, top chamber 1940 having a gap, bottom chamber 1950 having a gap, flow chamber 1940/1950, anchor (i.e. support structure) 1960, and cavities 1970 that are analogous to top plate 110 having vent 112, actuator 220, orifice plate 130 including orifices 132, top chamber 140 having gap 142, bottom chamber 150 having gap 152, flow chamber 140/150, anchor (i.e. support structure) 160, and cavities 170, respectively. Cooling system 1900 also includes cavities 1980 that are analogous to cavities 980, 1180, 1280, 1380, 1480, 1580, 1680, and 1780. Actuator 1920 is also most analogous to actuators 1480 and/or 1680. Thus, actuator 1920 is centrally supported by anchor 1960 such that at least a portion of the perimeter of actuator 1920 is free to vibrate. In some embodiments, anchor 1960 extends along the axis of actuator 1920 (e.g. in a manner analogous to anchor 360C and/or 360D). In other embodiments, anchor 1960 is only near the center portion of actuator 1920 (e.g. analogous to anchor 1960C and/or 1960D). Although not explicitly labeled in FIGS. 19A and 19B, actuator 1920 includes an anchored region and cantilevered arms including step region, extension region and outer regions analogous to anchored region 1922, cantilevered arms 1923, step region 1924, extension region 1926 and outer region 1928, respectively. In some embodiments, cantilevered arms of actuator 1920 are driven in-phase. In some embodiments, cantilevered arms of actuator 1920 are driven out-of-phase. In some embodiments, another actuator, such as actuator 120, 920, 1220, 1320, 1420, 1520, 1620, 1720, and/or 1820 may be used.

Anchor 1960 supports actuator 1920 from above. Thus, actuator 1920 is suspended from anchor 1960. Anchor 1960 is suspended from top plate 1910. Top plate 1910 includes vent 1913. Vents 1912 on the sides of anchor 1960 provide a path for fluid to flow into sides of chamber 1940.

As discussed above with respect to cooling system 100, actuator 1920 may be driven to vibrate at or near the structural resonant frequency of actuator 1920. Further, the structural resonant frequency of actuator 1920 may be configured to align with the acoustic resonance of the chamber 1940/1950. The structural and acoustic resonant frequencies are generally chosen to be in the ultrasonic range. For example, the vibrational motion of actuator 1920 may be at the frequencies described with respect to cooling system 100. Consequently, efficiency and flow rate may be enhanced. However, other frequencies may be used.

Cooling system 1900 operates in an analogous manner to cooling system(s) 100, 200, 500, 600, 700, 800, 900, 1000, 1100, 1200, 1300, 1400, 1500, 1600, 1700, and/or 1800. Cooling system 1900 thus shares the benefits of cooling system(s) 100, 200, 500, 600, 700, 800, 900, 1000, 1100, 1200, 1300, 1400, 1500, 1600, 1700, and/or 1800. Thus, performance of a device employing cooling system 1900 may be improved. In addition, suspending actuator 1920 from anchor 1960 may further enhance performance. In particular, vibrations in cooling system 1900 that may affect other cooling cells (not shown), may be reduced. For example, less vibration may be induced in top plate 1910 due to the motion of actuator 1920. Consequently, cross talk between cooling system 1900 and other cooling systems (e.g. other cells) or other portions of the device incorporating cooling system 1900 may be reduced. Thus, performance may be further enhanced.

Various cooling systems 100, 200, 500, 600, 700, 800, 900, 1000, 1100, 1200, 1300, 1400, 1500, 1600, 1700, 1800, and 1900 have been described and particular features highlighted. Various characteristics of cells 100, 200, 500, 600, 700, 800, 900, 1000, 1100, 1200, 1300, 1400, 1500, 1600, 1700, 1800, and/or 1900 may be combined in manners not explicitly depicted herein.

Figure 20A:
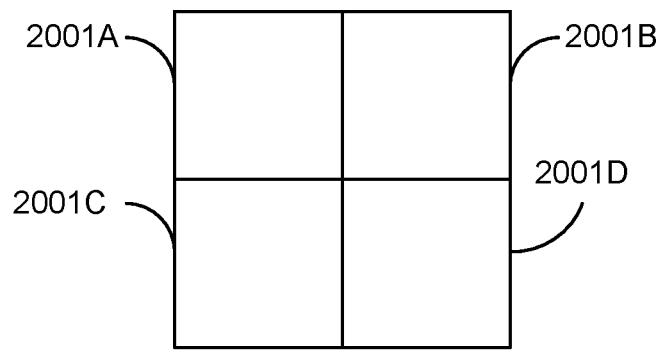
FIGS. 20A-20C depict an embodiment of an active cooling system formed in a tile.
Figure 20B:
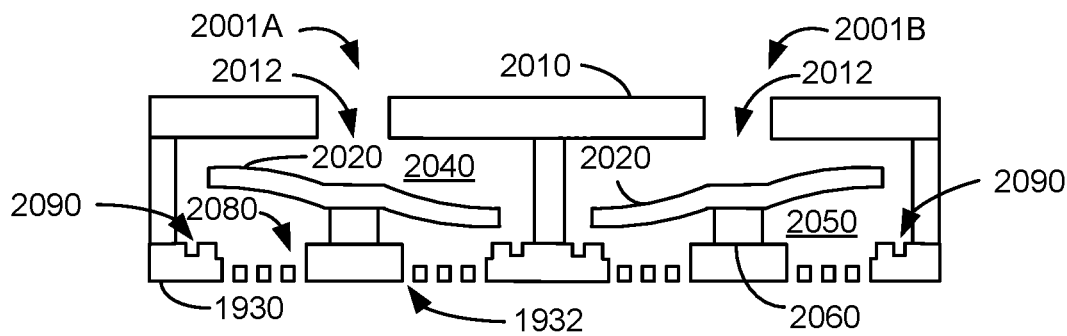
Figure 20C:
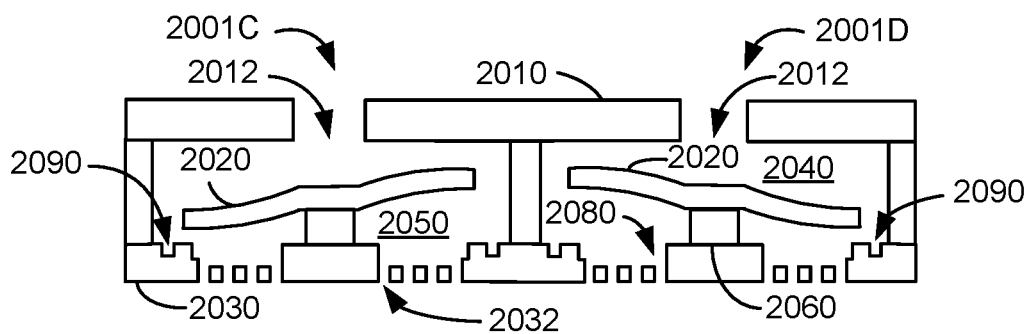

FIGS. 20A-20C depict an embodiment of active cooling system 2000 including multiple cooling cells configured as a tile, or array. FIG. 20A depicts a top view, while FIGS. 20B-20C depict side views. FIGS. 20A-20C are not to scale. Cooling system 2000 includes four cooling cells 2001A, 2001B, 2001C and 2001D (collectively or generically 2001), which are analogous to one or more of cooling systems described herein. More specifically, cooling cells 2001 are analogous to cooling system 100, 200, 500, 600, 700, 800, 900, 1000, 1100, 1200, 1300, 1400, 1500, 1600, 1700, 1800, and/or some combination thereof. Although four cooling cells 2001 in a 2×2 configuration are shown, in some embodiments another number and/or another configuration of cooling cells 2001 might be employed. Multiple arrays of cooling cells may also be utilized. In the embodiment shown, cooling cells 2001 include shared top plate 2010 having apertures 2012, actuators 2020, shared orifice plate 2030 including orifices 2032, top chambers 2040, bottom chambers 2050, flow chamber 2040/2050, anchors (support structures) 2060, and cavities 2070 that are analogous to top plate 110 having apertures 112, actuator 120, orifice plate 130 having orifices 132, top chamber 140, bottom chamber 150, flow chamber 140/150, anchor 160, and cavities 170, respectively. In some embodiments, cooling cells 2001 may be analogous to cooling system(s) 200, 500, 600, 700, 800, 900, 1000 and/or some combination thereof. In some embodiments, cooling cells 2001 may be fabricated together and separated, for example by cutting through top plate 2010 and orifice plate 2030. Actuators 2020 are driven out-of-phase (i.e. in a manner analogous to a seesaw). Further, as can be seen in FIGS. 20B-20C actuator 2020 in one cell is driven out-of-phase with actuator(s) 2020 in adjacent cell(s). In FIGS. 20B-20C, actuators 2020 in columns and rows are driven out-of-phase. Thus, actuator 2020 in cell 2001A is out-of-phase with actuator 2020 in cell 2001B. Similarly, actuator 2020 in cell 2001C is out-of-phase with actuator 2020 in cell 2001D. Thus, actuators 2020 in cells 2001A and 2001D are in-phase. Actuators 2020 in cells 2001B and 2001C are in-phase. Other configurations, particularly for a larger array, are possible. For example, actuators 2020 in cells 2001A and 2001C may be in phase, actuators 2020 in cells 2001B and 2001D may be in-phase, actuators in cells 2001A and 2001B may be out-of-phase, and actuators 2020 in cells 2001C and 2001D may be out-of-phase. By driving actuators 2020 out-of-phase, vibrations in cooling system 2000 may be reduced.

Cooling cells 2001 of cooling system 2000 function in an analogous manner to cooling system(s) 100, 200, 500, 600, 700, 800, 900, 1000, 1100, 1200, 1300, 1400, 1500, 1600, 1700, 1800, 1900, and/or an analogous cooling system. Consequently, the benefits described herein may be shared by cooling system 2000. Because actuators in nearby cells are driven out-of-phase, vibrations in cooling system 2000 may be reduced. Because multiple cooling cells 2001 are used, cooling system 2000 may enjoy enhanced cooling capabilities. Further, multiples of individual cooling cells 2001 and/or cooling system 2000 may be combined in various fashions to obtain the desired footprint of cooling cells.

Figure 21:
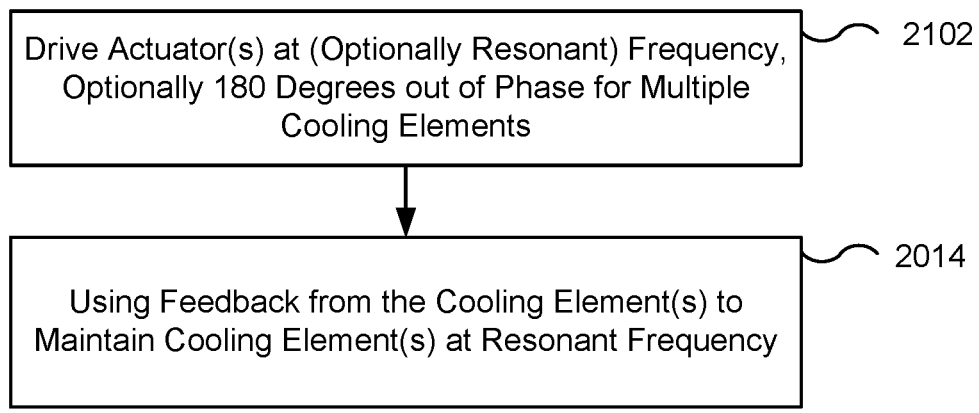
FIG. 21 is a flow chart depicting an embodiment of a method for driving flow through a flow chamber.

FIG. 21 is a flow chart depicting an exemplary embodiment of method 2100 for operating a cooling system. Method 2100 may include steps that are not depicted for simplicity. Method 2100 is described in the context of piezoelectric cooling system 1000 and 1100. However, method 2100 may be used with other cooling systems including but not limited to systems and cells described herein.

One or more of the actuator(s) in a cooling system is actuated to vibrate, at 2102. At 2102, an electrical signal having the desired frequency is used to drive the actuator(s). In some embodiments, the actuators are driven at or near structural and/or acoustic resonant frequencies at 2102. The driving frequency may be 15 kHz or higher. If multiple actuators are driven at 2102, the cooling actuators may be driven out-of-phase. In some embodiments, the actuators are driven substantially at one hundred and eighty degrees out of phase. Further, in some embodiments, individual actuators are driven out-of-phase. For example, different portions of an actuator may be driven to vibrate in opposite directions (i.e. analogous to a seesaw). In some embodiments, individual actuators may be driven in-phase (i.e. analogous to a butterfly). In addition, the drive signal may be provided to the anchor(s), the actuator(s), or both the anchor(s) and the actuator(s). Further, the anchor may be driven to bend and/or translate.

Feedback from the piezoelectric actuator(s) is used to adjust the driving current, at 2104. In some embodiments, the adjustment is used to maintain the frequency at or near the acoustic and/or structural resonant frequency/frequencies of the actuator(s) and/or cooling system. Resonant frequency of a particular actuator may drift, for example due to changes in temperature. Adjustments made at 2104 allow the drift in resonant frequency to be accounted for.

For example, piezoelectric actuator 1020 and/or 1120 may be driven at its structural resonant frequency/frequencies, at 2102. This resonant frequency may also be at or near the acoustic resonant frequency for top chamber 1040 and/or 1140. This may be achieved by driving piezoelectric layer(s) in anchor 1060 and/or 1160 and/or piezoelectric layer(s) in actuator 1020 and/or 1120. At 2104, feedback is used to maintain actuator 1020 and/or 1120 at resonance and, in some embodiments in which multiple actuators are driven, one hundred and eighty degrees out of phase. Thus, the efficiency of actuator 1020 and/or 1120 in driving fluid flow through cooling system 1000 and/or 1100 and onto heat-generating structure 1002 and/or 1102 may be maintained. In some embodiments, 2104 includes sampling the current through actuator 1020 and/or 1120 and/or the current through anchor 160 and adjusting the current to maintain resonance and low input power.

Consequently, actuators, such as actuator(s) 120, 220, 520, 620, 720, 820, 920, 1020, 1120, 1220, 1320, 1420, 1520, 1620, 17020, 1820, 1920, and/or 2020 may operate as described herein. Method 2100 thus provides for use of piezoelectric cooling systems described herein. Further, because of the presence of cavities 170, 270, 570, 670, 770, 870, 880, 970, 980, 1070, 1170, 1180, 1270, 1280, 1370, 1380, 1470, 1480, 1570, 1580, 1670, 1680, 1770, 1780, 1870, 1770, 1870, 1970, and/or 2070, power consumed by cooling system 100, 200, 500, 600, 700, 800, 900, 1000, 1100, 1200, 1300, 1400, 1500, 1600, 1700, 1800, 1900, and/or 2000 may be further reduced. Thus, piezoelectric cooling systems may more efficiently and quietly cool semiconductor devices at lower power.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A flow chamber, comprising:
   an upper chamber including a top wall;
   an actuator located distally from the top wall; and
   a lower chamber including a bottom wall and a sidewall, the lower chamber receiving a fluid from the upper chamber when the actuator is activated, the bottom wall having a plurality of orifices therein, the plurality of orifices being vertically aligned with a portion of the actuator and allowing the fluid to exit the lower chamber;
   wherein the bottom wall includes at least one cavity therein, the at least one cavity being proximate to the sidewall and distally located from the plurality of orifices;
   wherein the actuator includes an anchored region coupled to a support structure and a cantilevered arm, the cantilevered arm including a step region and an extension region, the step region having a step thickness, the extension region extending outward from the step region and having an extension thickness less than the step thickness.

2. The flow chamber of claim 1, further comprising:
at least one fluidized surface coupled with the bottom wall, at least a portion of the at least one fluidized surface fluidically coupling the at least one cavity with the lower chamber.

3. The flow chamber of claim 1, wherein the bottom wall further includes at least one additional cavity therein, at least a portion of the plurality of orifices residing in the at least one additional cavity.

4. The flow chamber of claim 1, wherein the extension region extends to a tip of the cantilevered arm.

5. The flow chamber of claim 1, wherein the cantilevered arm includes an outer region extending outward from the extension region and having an outer thickness greater than the extension thickness such that the cantilevered arm includes at least one of a bottom recessed region facing the bottom wall and a top recessed region facing the top wall.

6. The flow chamber of claim 1, wherein the actuator includes a shim region on the anchored region, the shim region having a shim thickness greater than the extension region.

7. A cooling system, comprising:
a plurality of cooling cells, each of the plurality of cooling cells including a flow chamber having an upper chamber, an actuator, and a lower chamber, the upper chamber including a top wall, the actuator located distally from the top wall, the lower chamber including a bottom wall and a sidewall, the lower chamber receiving a fluid from the upper chamber when the actuator is activated, the bottom wall having a plurality of orifices therein, the plurality of orifices being vertically aligned with a portion of the actuator and allowing the fluid to exit the lower chamber, wherein the bottom wall includes at least one cavity therein, the at least one cavity being proximate to the sidewall and distally located from the plurality of orifices;
wherein the actuator includes an anchored region coupled to a support structure and a cantilevered arm, the cantilevered arm including a step region and an extension region, the step region having a step thickness, the extension region extending outward from the step region and having an extension thickness less than the step thickness.

8. The cooling system of claim 7, wherein the flow chamber further includes:
at least one fluidized surface coupled with the bottom wall, at least a portion of the at least one fluidized surface fluidically coupling the at least one cavity with the lower chamber.

9. The cooling system of claim 7, wherein the bottom wall further includes at least one additional cavity therein, at least a portion of the plurality of orifices residing in the at least one additional cavity.

10. The cooling system of claim 7, wherein the extension region extends to a tip of the cantilevered arm.

11. The cooling system of claim 7, wherein the cantilevered arm includes an outer region extending outward from the extension region and having an outer thickness greater than the extension thickness such that the cantilevered arm includes at least one of a bottom recessed region facing the bottom wall and a top recessed region facing the top wall.

12. The cooling system of claim 7, wherein the actuator includes a shim region on the anchored region, the shim region having a shim thickness greater than the extension region.

13. A method, comprising:
driving an actuator to induce a vibrational motion at a frequency, the actuator being configured to undergo the vibrational motion when driven to direct a fluid toward through a chamber including an upper chamber, a lower chamber and the actuator, the upper chamber including a top wall, the actuator located distally from the top wall, the lower chamber including a bottom wall and a sidewall, the lower chamber receiving the fluid from the upper chamber when the actuator is activated, the bottom wall having a plurality of orifices therein, the plurality of orifices being vertically aligned with a portion of the actuator and allowing the fluid to exit the lower chamber;
wherein the bottom wall includes at least one cavity therein, the at least one cavity being proximate to the sidewall and distally located from the plurality of orifices;
wherein the actuator includes an anchored region coupled to a support structure and a cantilevered arm, the cantilevered arm including a step region and an extension region, the step region having a step thickness, the extension region extending outward from the step region and having an extension thickness less than the step thickness.

14. The method of claim 13, wherein the chamber further includes at least one fluidized surface, at least a portion of the at least one fluidized surface fluidically coupling the at least one cavity with the lower chamber.

15. The method of claim 13, wherein the bottom wall further includes at least one additional cavity therein, at least a portion of the plurality of orifices residing in the at least one additional cavity.

16. The method of claim 13, wherein the cantilevered arm includes an outer region extending outward from the extension region and having an outer thickness greater than the extension thickness such that the cantilevered arm includes at least one of a bottom recessed region facing the bottom wall and a top recessed region facing the top wall.

17. The method of claim 13, wherein the actuator includes a shim region on the anchored region, the shim region having a shim thickness greater than the extension region.

* * * * *